United States Patent
Ono et al.

(10) Patent No.: US 8,956,907 B2
(45) Date of Patent: Feb. 17, 2015

(54) METHOD FOR PRODUCING FIELD EFFECT TRANSISTOR, FIELD EFFECT TRANSISTOR, DISPLAY DEVICE, IMAGE SENSOR, AND X-RAY SENSOR

(71) Applicant: FUJIFILM Corporation, Minato-ku, Tokyo (JP)

(72) Inventors: Masashi Ono, Kanagawa (JP);
Masahiro Takata, Kanagawa (JP);
Fumihiko Mochizuki, Kanagawa (JP);
Atsushi Tanaka, Kanagawa (JP);
Masayuki Suzuki, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/160,730

(22) Filed: Jan. 22, 2014

(65) Prior Publication Data
US 2014/0131696 A1   May 15, 2014

Related U.S. Application Data

(63) Continuation of application No. PCT/JP2012/065616, filed on Jun. 19, 2012.

(30) Foreign Application Priority Data

Jul. 29, 2011   (JP) .................................. 2011-167093

(51) Int. Cl.
*H01L 21/339*   (2006.01)
*H01L 21/00*   (2006.01)
(Continued)

(52) U.S. Cl.
CPC ...... *H01L 29/66969* (2013.01); *H01L 29/7869* (2013.01); *H01L 27/1225* (2013.01);
(Continued)

(58) Field of Classification Search
CPC .................. H01L 27/1225; H01L 29/7869
USPC ............ 438/59, 144, 199, 530; 257/222, 225, 257/E29.296
See application file for complete search history.

(56) References Cited

U.S. PATENT DOCUMENTS 8,188,474 B2 *   5/2012   Hatano et al. .................. 257/59
8,212,201 B2 *   7/2012   Murata ...................... 250/214.1
(Continued)

FOREIGN PATENT DOCUMENTS

JP   2010-067710 A   3/2010
JP   2010-258431 A   11/2010

OTHER PUBLICATIONS

International Search Report of PCT/JP2012/065616 dated Sep. 25, 2012, 5 pages in Japanese and English.
(Continued)

*Primary Examiner* — Nicholas Tobergte
(74) *Attorney, Agent, or Firm* — Sughrue Mion, PLLC

(57) ABSTRACT

There is provided a method of fabricating a field effect transistor including: forming a first oxide semiconductor film on a gate insulation layer disposed on a gate electrode; forming a second oxide semiconductor film on the first oxide semiconductor film, the second oxide semiconductor film differing in cation composition from the first oxide semiconductor film and being lower in electrical conductivity than the first oxide semiconductor film; applying a heat treatment at over 300° C. in an oxidizing atmosphere; forming a third oxide semiconductor film on the second oxide semiconductor film, the third oxide semiconductor film differing in cation composition from the first oxide semiconductor film and being lower in electrical conductivity than the first oxide semiconductor film; applying a heat treatment in an oxidizing atmosphere; and, forming a source electrode and a drain electrode on the third oxide semiconductor film.

30 Claims, 31 Drawing Sheets

(51) Int. Cl.

| | | |
|---|---|---|
| *H01L 27/148* | (2006.01) | |
| *H01L 29/66* | (2006.01) | |
| *H01L 29/786* | (2006.01) | |
| *H01L 27/12* | (2006.01) | |
| *H01L 27/146* | (2006.01) | |
| *H01L 21/02* | (2006.01) | |
| *H01L 27/15* | (2006.01) | |
| *H01L 27/32* | (2006.01) | |

(52) U.S. Cl.
 CPC .... *H01L27/14632* (2013.01); *H01L 27/14659* (2013.01); *H01L 27/14687* (2013.01); *H01L 27/148* (2013.01); *H01L 21/02565* (2013.01); *H01L 27/14612* (2013.01); *H01L 27/156* (2013.01); *H01L 27/3244* (2013.01); *H01L 27/322* (2013.01); *H01L 27/3248* (2013.01); *H01L 27/3262* (2013.01); *H01L 27/14614* (2013.01); *H01L 29/66742* (2013.01); *H01L 29/78696* (2013.01)
 USPC ............ 438/59; 438/144; 438/199; 438/530; 257/222; 257/225; 257/E29.296

(56) References Cited

U.S. PATENT DOCUMENTS 8,253,135 B2 * 8/2012 Uochi et al. .................. 257/43
8,502,225 B2 * 8/2013 Yamazaki et al. ............. 257/59

OTHER PUBLICATIONS

Written Opinion of the ISA of PCT/JP2012/065616 dated Sep. 25, 2012, 6 pages in Japanese and English.

* cited by examiner

METHOD FOR PRODUCING FIELD EFFECT TRANSISTOR, FIELD EFFECT TRANSISTOR, DISPLAY DEVICE, IMAGE SENSOR, AND X-RAY SENSOR

CROSS-REFERENCE TO RELATED APPLICATIONS

This application is a continuation application of International Application No. PCT/JP2012/065616, filed Jun. 19, 2012, the disclosure of which is incorporated herein by reference in its entirety. Further, this application claims priority from Japanese Patent Application No. 2011-167093, filed Jul. 29, 2011, the disclosure of which is incorporated herein by reference in its entirety.

TECHNICAL FIELD

The present invention relates to a method for producing a field effect transistor, and to the field effect transistor, a display device, an image sensor and an X-ray sensor.

RELATED ART

In recent years, field effect transistors have been used as unit components of semiconductor memory integrated circuits, high-frequency signal amplification components, liquid crystal driving components and so forth. In particular, small-thickness field effect transistors are used as thin film transistors (TFT) in a wide range of fields.

Conventionally, silicon semiconductors and compounds thereof are often used for semiconductor channel layers (active layers) that structure field effect transistors. Monocrystalline silicon is satisfactory for high-frequency amplification components, integrated circuits and the like requiring high-speed operations, and for low-speed operations. Meanwhile, amorphous silicon is used for liquid crystal driving devices that must be able to handle increases in area in display applications and the like. However, the capabilities of amorphous silicon are being outstripped by increases in size and definition, and TFT characteristics are being called for. Attention has also been focused in recent years on flexible displays, which are light in weight and can be curved. Resin substrates with high flexibility are principally used for flexible devices, and processes with lower temperatures than liquid crystal display processes (400° C.) are required. In this context, In—Ga—Zn—O compounds (denoted by "IGZO" hereinafter) have been discovered by Hosono et al. of Tokyo Institute of Technology to be oxide semiconductors that have better electronic characteristics than amorphous silicon and that can be manufactured by liquid crystal processes or low-temperature processes. IGZO is considered to have promise as a material for semiconductor elements for next-generation displays, and research and development toward the practical application of IGZO is being vigorously pursued by universities and manufacturers around the world.

A field effect transistor that uses a semiconductor film of IGZO or the like as an active layer may be incorporated in an organic EL display device, a liquid crystal display device or the like that includes a blue light emission layer. The blue light emission layer exhibits broad light emission with a peak at around $\lambda=450$ nm. Considering cases in which the fringe of the light emission spectrum of this light extends to 420 nm, a blue color filter passes around 70% of light at 400 nm, and the like, it is required that a field effect transistor that can sense blue light has little characteristic deterioration in response to light illumination in a region of wavelengths smaller than 450 nm. In a case in which the optical bandgap of an IGZO is relatively small and the IGZO features optical absorption in this region, there may be a shift in the threshold value of the transistor.

Patent Reference 1 (Japanese Patent Application Laid-Open (JP-A) No. 2010-67710) discloses a method of fabricating a field effect transistor that is provided with an oxide semiconductor layer formed in a three-layer structure of an active layer, an interlayer and a resistance layer. The active layer is formed of an oxide semiconductor. The interlayer contains an oxide including an element that has a stronger bonding strength with oxygen than in the oxide semiconductor of the active layer, and the interlayer has a thickness of 1 nm to 200 nm. The resistance layer has a lower electrical conductivity than the active layer. It is disclosed that, after the resistance layer of the oxide semiconductor layer has been formed in this fabrication method, a heat treatment is applied in atmospheric air as post-processing. Patent Reference 2 (JP-A No. 2010-258431) discloses, after a second oxide semiconductor film has been formed to a thickness of 10 nm to 300 nm on a first oxide semiconductor film, the application of a heat treatment of at least 250° C. and at most 500° C. in an atmosphere of atmospheric air.

However, in the fabrication method according to Patent Reference 1, when the interlayer is being formed on the active layer with high electrical conductivity in the three-layer structure of the oxide semiconductor layer, an exposed surface of the active layer may be damaged by this film formation, as a result of which surface defects may be produced that affect the value of a threshold shift during light illumination and the like. In the film formation, if a technique such as sputtering or CVD that produces plasma is used with a view to productivity and/or barrier properties, the exposed surface of the active layer is particularly susceptible to damage from the plasma, as a result of which the surface defects that cause the threshold shift during light illumination to deteriorate are more numerous. Applying a heat treatment after the resistance layer of the oxide semiconductor layer is formed in the fabrication method as recited in Patent Reference 1 is thought to be effective for repairing these surface defects. However, in the heat treatment after the resistance layer is formed, an amount of oxygen corresponding to the thickness of the resistance layer does not reach the active layer, and the surface defects in the surface of the active layer that has suffered plasma damage may not be rectified. When the heat treatment is applied without managing to rectify these surface defects, it is thought that the actual threshold shift is improved. However, the actual threshold shift during light illumination is understood not to be improved by this heat treatment after the resistance layer is formed.

In the fabrication method according to Patent Reference 2, the heat treatment is applied after the second oxide semiconductor film has been formed. However, this oxide semiconductor layer does not have a three-layer structure, and the first oxide semiconductor film is a buffer region that connects a source electrode and drain electrode with the second oxide semiconductor film. Thus, a region that is to be an active layer is in the second oxide semiconductor film. Therefore, if a protective layer or the like is formed after the heat treatment on the second oxide semiconductor film in the region that is to be the active layer, the exposed surface of the second oxide semiconductor film is damaged by this film formation, as a result of which surface defects are produced that cause a deterioration in the threshold shift during light illumination. No measures are applied after the protective layer or the like has been formed on the second oxide semiconductor film to rectify these surface defects or to improve the actual threshold shift during light illumination.

SUMMARY

The present invention has been made in consideration of the circumstances described above, and an object of the invention is to provide a field effect transistor fabrication method that stabilizes TFT characteristics during light illumination, and the field effect transistor, a display device, an image sensor and an X-ray sensor.

The technical problem of the present invention is solved by the following means.

<1> A field effect transistor fabrication method including: a first step of forming a first oxide semiconductor film on a gate insulation layer disposed on a gate electrode; after the first step, a second step of forming a second oxide semiconductor film on the first oxide semiconductor film, the second oxide semiconductor film differing in cation composition from the first oxide semiconductor film and being lower in electrical conductivity than the first oxide semiconductor film; after the second step, a third step of applying a heat treatment at over 300° C. in an oxidizing atmosphere; after the third step, a fourth step of forming a third oxide semiconductor film on the second oxide semiconductor film, the third oxide semiconductor film differing in cation composition from the first oxide semiconductor film and being lower in electrical conductivity than the first oxide semiconductor film; after the fourth step, a fifth step of applying a heat treatment in an oxidizing atmosphere; and, between the fourth step and the fifth step or after the fifth step, an electrode formation step of forming a source electrode and a drain electrode on the third oxide semiconductor film.

This encompasses a method in which the heat treatment of the third step is applied a plural number of times.

<2> The field effect transistor fabrication method recited in <1>, in which, during the second step and the third step, a thickness of the second oxide semiconductor film and the temperature of the heat treatment in the third step are adjusted such that, if the thickness of the second oxide semiconductor film is represented by Z (nm), the heat treatment temperature is represented by T (° C.) and a diffusion distance of oxygen into the second oxide semiconductor film and the first oxide semiconductor film is represented by L (nm), the relational expression $0<Z<L=8\times10^{-6}\times T^3-0.0092\times T^2+3.6\times T-468\pm0.1$ is satisfied.

<3> The field effect transistor fabrication method recited in <2>, in which, during the second step and the third step, the thickness of the second oxide semiconductor film and the heat treatment temperature are adjusted such that the relational expression $Z\leq L-3.0$ is satisfied.

<4> The field effect transistor fabrication method recited in <2> or <3>, in which, during the second step and the third step, the thickness of the second oxide semiconductor film and the heat treatment temperature are adjusted such that the relational expression $L-15.0\leq Z$ is satisfied.

<5> The field effect transistor fabrication method recited in any one of <2> to <4>, in which, during the second step and the third step, the thickness of the second oxide semiconductor film and the heat treatment temperature are adjusted such that the relational expression $L-11.0\leq Z\leq L-8.0$ is satisfied.

<6> The field effect transistor fabrication method recited in any one of <1> to <5>, in which, in the fourth step, the third oxide semiconductor film is formed such that a cation composition ratio thereof is the same as a cation composition ratio of the second oxide semiconductor film.

<7> The field effect transistor fabrication method recited in any one of <1> to <6>, in which, during the second step and the fourth step, a total thickness of the second oxide semiconductor film and the third oxide semiconductor film is adjusted to be more than 10 nm and less than 70 nm.

<8> The field effect transistor fabrication method recited in any one of <1> to <7>, in which the first oxide semiconductor film, the second oxide semiconductor film and the third oxide semiconductor film each includes at least one of indium, gallium and zinc.

<9> The field effect transistor fabrication method recited in <8>, in which the first oxide semiconductor film includes indium, and an indium composition proportion of the first oxide semiconductor film is higher than an indium composition proportion of the second oxide semiconductor film.

<10> The field effect transistor fabrication method recited in <8> or <9>, in which the second oxide semiconductor film includes gallium, and a gallium composition proportion of the second oxide semiconductor film is higher than a gallium composition proportion of the first oxide semiconductor film.

<11> The field effect transistor fabrication method recited in any one of <8> to <10>, in which the first oxide semiconductor film, the second oxide semiconductor film and the third oxide semiconductor film are each non-crystalline.

<12> The field effect transistor fabrication method recited in any one of <8> to <11>, in which the heat treatment temperatures in the third step and the fifth step are adjusted to be less than 600° C.

<13> The field effect transistor fabrication method recited in any one of <1> to <12>, in which, in the first step, the first oxide semiconductor film is formed such that a thickness thereof is less than 10 nm.

<14> The field effect transistor fabrication method recited in any one of <1> to <13>, in which a composition of the first oxide semiconductor film is represented with indium as a, gallium as b, zinc as c and oxygen as d, and (a, b, c, d>0).

<15> The field effect transistor fabrication method recited in <14>, in which the composition of the first oxide semiconductor film is a composition in the range represented by $\{c\leq 3/5, b>0, b\geq 3a/7-3/14, b>9a/5-53/50, b\leq -8a/5+33/25, b\leq 91a/74-17/40\}$, in which $a+b+c=1$.

<16> The field effect transistor fabrication method recited in <15>, in which the composition of the first oxide semiconductor film is a composition in the range represented by $\{b\leq 17a/23-28/115, b>3a/37, b>9a/5-53/50, b\leq 1/5\}$, in which $a+b+c=1$.

<17> The field effect transistor fabrication method recited in <16>, in which the composition of the first oxide semiconductor film is a composition in the range represented by $\{b\leq 7a/13-11/65, b>3a/37, b\leq -2a+11/10\}$, in which $a+b+c=1$.

<18> The field effect transistor fabrication method recited in any one of <1> to <13>, in which a composition of the first oxide semiconductor film is represented with indium as x, zinc as 1-x and oxygen as y, and (y>0, 0<x<1).

<19> The field effect transistor fabrication method recited in <18>, in which the composition of the first oxide semiconductor film is a composition in the range represented by $0.4\leq x\leq 0.75$.

<20> The field effect transistor fabrication method recited in <19>, in which the composition of the first oxide semiconductor film is a composition in the range represented by $0.4\leq x\leq 0.5$.

<21> The field effect transistor fabrication method recited in any one of <1> to <20>, in which a composition of the second oxide semiconductor film is represented with indium as e, gallium as f, zinc as g and oxygen as h, and (e, f, g, h>0).

<22> The field effect transistor fabrication method recited in <21>, in which the composition of the second oxide semiconductor film is a composition in the range represented by 0.250<f/(e+f)≤0.875.

<23> The field effect transistor fabrication method recited in any one of <1> to <22>, in which, in each of the first step, the second step and the fourth step, the film is formed using a film formation technique that produces plasma.

<24> The field effect transistor fabrication method recited in any one of <1> to <23>, in which the fifth step is carried out after the electrode formation step.

<25> A bottom gate, top contact-type field effect transistor including: a gate electrode; a gate insulation layer over the gate electrode; a channel layered film in which electrons travel, structured over the gate insulation layer; and a source electrode and drain electrode formed over the channel layered film, wherein the channel layered film is structured by first, second and third oxide semiconductor films in this order from the side at which the gate insulation layer is provided, each oxide semiconductor film including indium, gallium and zinc, an indium content proportion of the first oxide semiconductor film is higher than in the second and third oxide semiconductor films, and a lattice defect density of the second oxide semiconductor film is smaller than a lattice defect density of the third oxide semiconductor film.

<26> A field effect transistor bottom gate, top contact-type field effect transistor including: a gate electrode; a gate insulation layer over the gate electrode; a channel layered film in which electrons travel, structured over the gate insulation layer; and a source electrode and drain electrode formed over the channel layered film, wherein the channel layered film is structured by first, second and third oxide semiconductor films in this order from the side at which the gate insulation layer is provided, each oxide semiconductor film including indium, gallium and zinc, an indium content proportion of the first oxide semiconductor film is higher than in the second and third oxide semiconductor films, and an oxygen inclusion density in the second oxide semiconductor film is greater than an oxygen inclusion density of the third oxide semiconductor film.

<27> A display device provided with field effect transistors fabricated by the field effect transistor fabrication method recited in any one of <1> to <24>.

<28> A bottom emission-type display device including: a substrate; field effect transistors fabricated by the field effect transistor fabrication method recited in any one of <1> to <24>, which are disposed on the substrate; and organic electroluminescent elements over the field effect transistors, the organic electroluminescent elements being electrically connected to the field effect transistors, wherein light emitted from the organic electroluminescent elements is emitted from the side of the display device at which the substrate is disposed.

<29> An image sensor provided with field effect transistors fabricated by the field effect transistor fabrication method recited in any one of <1> to <24>.

<30> An X-ray sensor provided with field effect transistors fabricated by the field effect transistor fabrication method recited in any one of <1> to <24>.

According to the present invention, a field effect transistor fabrication method that stabilizes TFT characteristics during light illumination, and the field effect transistor, a display device, an image sensor and an X-ray sensor, may be provided.

DETAILED DESCRIPTION

Figure 1:
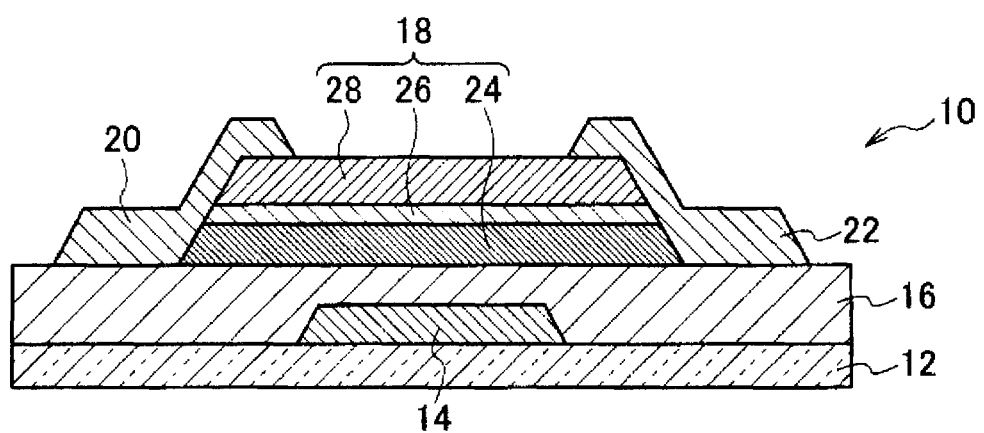
FIG. 1 is a schematic diagram showing an example of a top contact-type TFT with a bottom gate structure, which is a TFT in accordance with an exemplary embodiment of the present invention.

Herebelow, a field effect transistor fabrication method in accordance with an exemplary embodiment of the present invention, and a display device, an image sensor and an X-ray sensor, are described in concrete terms while referring to the attached drawings. Members (structural elements) that have the same or corresponding functions are assigned the same reference numerals in the drawings, and descriptions thereof are omitted as appropriate. Terms referring to "upper" and "lower" that are used in the following descriptions are used for convenience and are not intended to be restrictive in terms of direction.

1. Structure of Field Effect Transistor

Before the field effect transistor manufacturing process is described, schematics of the structure of the field effect transistor manufactured by this manufacturing process are described.

The field effect transistor according to the present exemplary embodiment of the invention is a thin film transistor (TFT), and includes at least a gate electrode, a gate insulation layer, an oxide semiconductor layer, and a source electrode and a drain electrode. The field effect transistor is an active component with a function in which voltages are applied to the gate electrode, current flowing in the oxide semiconductor layer is regulated, and a current flowing between the source electrode and the drain electrode is switched on and off.

A mode is adopted in which the element structure of the TFT according to the exemplary embodiment of the present invention has, according to the position of the gate electrode, an "inverse staggered structure" (also referred to as a "bottom gate type"). The element structure of the TFT is also in a "top contact-type" mode, according to contact portions between the active layer and the source electrode and drain electrode (referred to where appropriate as "the source and drain electrodes"). The bottom gate type is a mode in which the gate electrode is disposed at a lower side of the gate insulation layer and the active layer is formed at the upper side of the gate insulation layer. The top contact type is a mode in which the active layer is formed before the source and drain electrodes are formed, and the upper face of the active layer is in contact with the source and drain electrodes.

FIG. 1 is a schematic diagram showing an example of a top contact-type TFT 10 with a bottom gate structure, which is a TFT in accordance with the exemplary embodiment of the present invention.

In the TFT 10 shown in FIG. 1, a gate electrode 14, a gate insulation layer 16 and an oxide semiconductor layer 18 are layered in this order on one principal surface of a substrate 12. A source electrode 20 and a drain electrode 22 are disposed apart from one another on a surface of the oxide semiconductor layer 18. In the present exemplary embodiment, the oxide semiconductor layer 18 is divided into three layers—a first oxide semiconductor film 24, a second oxide semiconductor film 26 and a third oxide semiconductor film 28—in this order from the side at which the gate insulation layer 16 is disposed.

The first oxide semiconductor film 24, the second oxide semiconductor film 26 and the third oxide semiconductor film 28 may be distinguished by differences in contrast in a sectional transmission electron microscope (TEM) analysis of the oxide semiconductor layer 18, or the like.

2. Field Effect Transistor Fabrication Process

The field effect transistor fabrication method described above includes: a first step of forming the first oxide semiconductor film 24 on the gate insulation layer 16 disposed on the gate electrode 14; a second step of forming the second oxide semiconductor film 26 on the first oxide semiconductor film 24, the second oxide semiconductor film 26 differing in cation composition from the first oxide semiconductor film 24 and being lower in electrical conductivity than the first oxide semiconductor film 24; after the second step, a third step of applying a heat treatment at over 300° C. in an oxidizing atmosphere; after the third step, a fourth step of forming the third oxide semiconductor film 28 on the second oxide semiconductor film 26, the third oxide semiconductor film 28 differing in cation composition from the first oxide semiconductor film 24 and being lower in electrical conductivity than the first oxide semiconductor film 24; after the fourth step, a fifth step of applying a heat treatment in an oxidizing atmosphere; and, between the fourth step and the fifth step or after the fifth step, an electrode formation step of forming the source electrode 20 and the drain electrode 22 on the third oxide semiconductor film 28.

According to this fabrication method, because the heat treatment is applied in the third step after the second oxide semiconductor film 26 has been formed in the second step, defects at the boundary face between the first oxide semiconductor film 24 and the second oxide semiconductor film 26 are repaired by oxygen diffusion. Thus, ΔVth during light illumination may be improved. Even in a case in which the oxide diffusion in the third step does not reach from the oxidizing atmosphere to the boundary face, defects within the bulk of the second oxide semiconductor film 26 may be reduced compared to a case in which the third step is not carried out. Consequently, TFT characteristics may be stabilized.

Herein, the term "electrical conductivity" is intended to include a physical value representing the ease of electrical conduction in a material. If a carrier density of the material is represented by n, the elementary electric charge is represented by e and carrier mobility is represented by μ, and the Drude model is assumed, the electrical conductivity σ of the material is given by the following equation.

$$\sigma = ne\mu$$

If the first oxide semiconductor film 24, the second oxide semiconductor film 26 and the third oxide semiconductor film 28 are n-type semiconductors, the carriers are electrons, the carrier density refers to the electron carrier density, and the carrier mobility refers to the electron mobility. Similarly, if the first oxide semiconductor film 24, the second oxide semiconductor film 26 and the third oxide semiconductor film 28 are p-type semiconductors, the carriers are holes, the carrier density refers to the hole carrier density, and the carrier mobility refers to the hole mobility. The carrier density and carrier mobility of a material may be found by Hall measurements.

As a method for finding electrical conductivity, the electrical conductivity of a film whose thickness is known may be found by measuring the sheet resistance of the film. The electrical conductivity of a semiconductor changes with temperature. However, the electrical conductivity recited herein refers to the electrical conductivity at room temperature (20° C.).

The field effect transistor fabrication method described above is described more specifically herebelow using FIG. 2A to FIG. 2H.

FIG. 2A to FIG. 2H are step diagrams of the process of fabrication of the bottom gate structure, top contact-type TFT 10.

—Formation of the Gate Electrode 14—

Figure 2A:
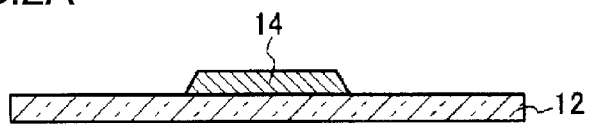
FIG. 2A is a step diagram of a process of manufacturing of the top contact-type TFT with a bottom gate structure shown in FIG. 1.

First, as shown in FIG. 2A, the substrate 12 is prepared for the formation of the TFT 10, and the gate electrode 14 is formed on one principal surface of the substrate 12.

The shape, structure, size and so forth of the substrate 12 are not particularly limited and may be suitably selected in accordance with objectives. The structure of the substrate may be a single-layer structure, and may be a layered structure. As the substrate 12, a substrate may be used that is formed of an inorganic material such as glass, YSZ (yttria-stabilized zirconia) or the like, a resin substrate or a composite material therewith, or the like. Of these, a substrate formed of a resin or a resin composite material is preferable in view of being light in weight and flexible. Specifically, the following may be used: a substrate formed of a synthetic resin such as polybutylene terephthalate, polyethylene terephthalate, polyethylene naphthalate, polybutylene naphthalate, a polystyrene, polycarbonate, polysulfone, polyether sulfone, polyarylate, allyldiglycol carbonate, polyamide, polyimide, polyamido-imide, polyether imide, polybenzazole, polyphenylene sulfide, polycycloolefin, norbornene resin, a fluorine-based resin such as polychlorotrifluoroethylene or the like, a liquid-crystal polymer, acrylic resin, epoxy resin, silicone resin, ionomer resin, cyanate resin, cross-linking fumarate diester, cyclic polyolefin, aromatic ether, maleimide olefin, cellulose, episulfide compound or the like; a substrate formed of a composite plastic material of a synthetic resin mentioned above or the like with silicon oxide particles; a substrate formed of a composite plastic material of a synthetic resin mentioned above or the like with metallic nanoparticles, inorganic oxide nanoparticles, inorganic nitride nanoparticles or the like; a substrate formed of a composite plastic material of a synthetic resin mentioned above with carbon fibers or carbon nanotubes; a substrate formed of a composite plastic material of a synthetic resin mentioned above with glass flakes, glass fibers or glass beads; a substrate formed of a composite plastic material of a synthetic resin mentioned above with particles containing clay minerals, mica-derived crystal structures or the like; a layered plastic substrate with at least one joining boundary between a thin glass and one of the organic materials mentioned above; a substrate formed of a composite material with barrier capability including at least one joining boundary, formed by alternately layering inorganic layers and organic layers (of a synthetic resin mentioned above); a stainless steel substrate or a multilayer metallic substrate in which stainless steel and a different metal are layered; an aluminium substrate or an aluminium substrate with an oxide layer, in which an oxidizing treatment (for example, anodic oxidation) is applied to the surface to improve insulative properties of the surface; or the like.

A resin substrate that is excellent in heat resistance, dimensional stability, solvent resistance, electrical insulation, machinability, low permeability and low absorbency, or the like, is preferable. The resin substrate may be provided with layers such as a gas barrier layer for preventing permeation of water, oxygen and the like, an undercoat layer for improving flatness of the resin substrate, surface contact with a lower electrode, and the like.

For the formation of the gate electrode 14, a conductive film may be formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. After the film formation, the conductive film is patterned into a predetermined shape by photolithography and etching, a lift-off process or the like. Thus, the gate electrode 14 is formed from the conductive film. Here, it is preferable if the gate electrode 14 and gate wiring are patterned at the same time.

The conductive film constituting the gate electrode 14 preferably uses a material with high conductivity. A single layer or a multilayer structure with two or more layers of, for example, the following may be used: a metal such as aluminium, molybdenum, chromium, tantalum, titanium, gold or the like; aluminium-neodymium; a silver alloy; a metal oxide conductive film of tin oxide, zinc oxide, indium oxide, indium tin oxide (ITO), indium zinc oxide (IZO) or the like; or the like.

—Formation of the Gate Insulation Layer 16—

Figure 2B:
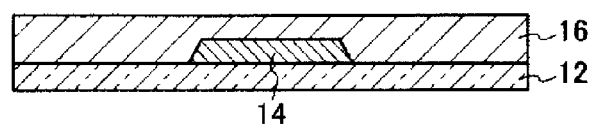
FIG. 2B is a step diagram of the TFT manufacturing process continuing from FIG. 2A.

After the gate electrode 14 has been formed, as shown in FIG. 2B, the gate insulation layer 16 is formed on the gate electrode 14 and exposed surface of the substrate 12.

For the formation of the gate insulation layer 16, an insulation film may be formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. After the film formation, the insulation film is patterned into a predetermined shape as necessary by photolithography and etching, a lift-off process or the like. Thus, the gate insulation layer 16 is formed from the insulation film.

The insulation film constituting the gate insulation layer 16 is preferably a film with high insulativity. For example, the insulation film may be formed of $SiO_2$, $SiN_x$, $SiON$, $Al_2O_3$, $Y_2O_3$, $Ta_2O_5$, $HfO_2$ or the like, or may contain two or more of these compounds.

The gate insulation layer 16 must have some thickness in order to reduce leakage currents and improve voltage endurance. However, if the thickness of the gate insulation layer is excessive, an increase in driving voltages will result. The thickness of the gate insulation layer 16 depends on the material, but is preferably at least 10 nm and at most 10 μm, is more preferably at least 50 nm and at most 1000 nm, and is particularly preferably at least 100 nm and at most 400 nm.

—First Step—

Figure 2C:
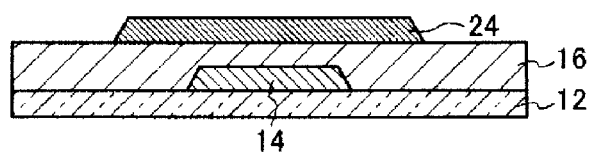
FIG. 2C is a step diagram of the TFT manufacturing process continuing from FIG. 2B.

After the gate insulation layer 16 has been formed, as shown in FIG. 2C, the first step is carried out to form the first oxide semiconductor film 24 on the gate insulation layer 16 to serve as a portion of the oxide semiconductor layer 18.

In this first step, the first oxide semiconductor film 24 is formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. Of these, vapor phase film formation techniques such as vapor deposition, sputtering, ion plating, CVD, plasma CVD and the like are preferably used with regard to ease of controlling film thickness. Of these vapor phase film formation techniques, sputtering and pulse laser deposition (PLD) are more preferable. With regard to productivity, sputtering is even more preferable. For example, the film can be formed by RF magnetron sputtering vapor deposition, with a vacuum level and oxygen flow amounts being controlled. In a case of forming the first oxide semiconductor film 24 of, for example, IGZO, a composite oxide target adjusted to a predetermined cation composition may be used, or three-source co-sputtering of $In_2O_3$, $Ga_2O_3$ and ZnO may be used.

It is sufficient if the principal constituent of the first oxide semiconductor film 24 is an oxide semiconductor; other impurities and the like may be included. The term "principal constituent" as used here is intended to include a component of which the content proportion is largest among components constituting the first oxide semiconductor film 24.

The oxide semiconductor may be non-crystalline or crystalline, but it is preferable if a non-crystalline oxide semiconductor is used. When the semiconductor film is constituted by an oxide semiconductor, mobility of charges is much higher than in a semiconductor film of non-crystalline silicon, and driving at lower voltages is possible. Further, when an oxide semiconductor is used, the semiconductor film may usually be formed with a higher transparency than silicon. Moreover, an oxide semiconductor, particularly a non-crystalline oxide semiconductor, may be formed into a uniform film at a low temperature (for example, room temperature). This is particularly advantageous when using a resin substrate with flexibility, such as a plastic.

Constituent materials of the oxide semiconductor encompass publicly known conventional materials. For example, the following can be mentioned: oxides of transition metals such as indium, titanium, niobium, tin, zinc, gadolinium, cadmium, zirconium, yttrium, lanthanum, tantalum and the like; compounds such as $SrTiO_3$, $CaTiO_3$, $ZnO \cdot Rh_2O_3$, $CuGaO_2$, $SrCu_2O_2$ and the like; and the like.

Thus, the oxide semiconductor used in the first oxide semiconductor film 24 is not particularly limited. However, a metal oxide including at least one of indium, tin, zinc, gallium and cadmium is preferable, a metal oxide containing at least one of indium, tin, zinc and gallium is more preferable, and a metal oxide containing at least one of indium, gallium and zinc (for example, an In—O oxide) is even more preferable.

In particular, it is preferable if the first oxide semiconductor film 24 includes indium, and that an indium composition proportion in the first oxide semiconductor film 24 is higher than an indium composition proportion in the second oxide semiconductor film 26. This is because there is a tendency for electron affinity to be relatively larger when the indium composition proportion is higher, and conductive carriers will tend to collect in the first oxide semiconductor film 24. This is also preferable because a larger indium content proportion makes increasing the conductive carrier density easier, and therefore obtaining a high carrier mobility is easier.

Further, an oxide containing at least two of indium, gallium and zinc (for example, an In—Zn—O oxide, an In—Ga—O oxide or a Ga—Zn—O oxide) is preferable, and an oxide containing all of indium, gallium and zinc is more preferable. That is, it is preferable if the composition of the first oxide semiconductor film 24 is represented with indium as a, gallium as b, zinc as c and oxygen as d, and (a, b, c, d>0). In this case, it is preferable if the composition of the first oxide semiconductor film 24 is a composition in the range represented by {c≤3/5, b>0, b≥3a/7−3/14, b≥9a/5−53/50, b≤−8a/5+33/25, b≤91a/74−17/40} (in which a+b+c=1). Reasons for this are that, if the composition is in this composition range, a field effect mobility greater than 20 $cm^2/Vs$ is obtained after the TFT 10 has been formed, and the threshold voltage Vth is greater than zero, although Vth also depends on the heat treatment temperature in the third step, the film thickness of the second oxide semiconductor film 26 and the like.

Further yet, it is preferable if the composition of the first oxide semiconductor film 24 is a composition in the range represented by {b≤17a/23−28/115, b≥3a/37, b≥9a/5−53/50, b≤1/5} (in which a+b+c=1). If the composition is in this composition range, a field effect mobility greater than 30 $cm^2/Vs$ is obtained after the TFT 10 has been formed.

Further still, it is preferable if the composition of the first oxide semiconductor film 24 is a composition in the range represented by {b≤7a/13−11/65, b>3a/37, b≤−2a+11/10} (in which a+b+c=1). If the composition is in this composition range, both a field effect mobility greater than 30 $cm^2/Vs$ after the TFT 10 has been formed and a normally-off structure (in which the drain current Id is not more than $10^{-9}$ A when the gate voltage Vg=0) may be achieved.

In the case of an oxide that includes only two of indium, gallium and zinc, it is preferable if the composition of the first oxide semiconductor film 24 is represented with indium as x, zinc as (1-x) and oxygen as y, and (y>0, 0<x<1). In this case, it is preferable if the composition of the first oxide semiconductor film 24 is a composition in a range represented by 0.4≤x≤0.75. This is because, if the composition is in this composition range, a field effect mobility of at least 30 $cm^2/Vs$ is obtained after the TFT 10 has been formed. Further, it is preferable if the composition of the first oxide semiconductor film 24 is a composition in the range represented by $0.4 \leq x \leq 0.5$. If the composition is in this composition range, both a field effect mobility of at least 30 cm$^2$/Vs after the TFT 10 has been formed and a normally-off structure (in which the drain current Id is not more than 10$^{-9}$ A when the gate voltage Vg=0) may be achieved.

In the first step, it is also preferable to form the film such that the thickness of the first oxide semiconductor film 24 is less than 10 nm. It is preferable if the first oxide semiconductor film 24 uses IZO, a highly indium-rich IGZO film or the like in which a high mobility is easily realized, as described above. However, because this high mobility film has a high carrier density, pinch-off may be relatively difficult and the threshold value may be greatly shifted toward the negative side. Accordingly, a state in which the total carrier density in the oxide semiconductor layer 18 is excessive and pinch-off is difficult may be avoided by the thickness of the first oxide semiconductor film 24 being set to less than 10 nm.

The electrical conductivity of the first oxide semiconductor film 24 is preferably at least 10$^{-6}$ Scm$^{-1}$ but less than 10$^2$ Scm$^{-1}$. The electrical conductivity is more preferably at least 10$^{-4}$ Scm$^{-1}$ but less than 10$^2$ Scm$^{-1}$, and even more preferably at least 10$^{-1}$ Scm$^{-1}$ but less than 10$^2$ Scm$^{-1}$.

—Second Step—

Figure 2D:
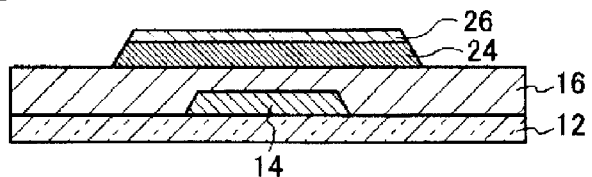
FIG. 2D is a step diagram of the TFT manufacturing process continuing from FIG. 2C.

After the first step, as shown in FIG. 2D, the second step is carried out to form the second oxide semiconductor film 26 on the first oxide semiconductor film 24. The second oxide semiconductor film 26 has a different cation composition from the first oxide semiconductor film 24, and has a lower electrical conductivity than the first oxide semiconductor film 24.

The second oxide semiconductor film 26, which also serves as a portion of the oxide semiconductor layer 18, may use the same material as the first oxide semiconductor film 24, provided that the second oxide semiconductor film 26 has a lower electrical conductivity than the first oxide semiconductor film 24.

It is preferable if the second oxide semiconductor film 26 contains gallium and the composition proportion of gallium in the second oxide semiconductor film 26 is higher than a composition proportion of gallium in the first oxide semiconductor film 24. This is because there is a tendency for electron affinity to be relatively smaller when the gallium composition proportion is increased, and conductive carriers will tend to collect in the first oxide semiconductor film 24. This is also preferable because, with a larger gallium content proportion, the contribution of conductive carriers at the back channel side may be reduced, and hence it is easier to reduce the off current.

In particular, it is preferable if the composition of the second oxide semiconductor film 26 is a composition represented with indium as e, gallium as f, zinc as g and oxygen as h, and (e, f, g, h>0). In this case, it is preferable if the composition of the second oxide semiconductor film 26 is a composition in the range represented by $0.250 < f/(e+f) \leq 0.875$. In a case in which $f/(e+f) \leq 0.250$, the electron affinity in this second region would be relatively large. Consequently, conduction paths would be formed in the second oxide semiconductor film 26, and it would be easy for an excess of conductive carriers to be induced in the second oxide semiconductor film 24. In the second oxide semiconductor film 26, when the composition is in the range $f/(e+f) > 0.250$, the electron affinity is small compared to the first oxide semiconductor film 24, and therefore the carrier density is relatively low. Therefore, when a negative gate voltage is applied, pinch-off at the second oxide semiconductor film 26 is easier, as a result of which the source and drain electrodes 20 and 22 are cut off from the first oxide semiconductor film 24. Consequently, an effect of reducing the off current may be expected. Meanwhile, when $f/(e+f) \leq 0.875$, an increase in contact resistance between the source and drain electrodes 20 and 22 and the second oxide semiconductor film 26 may be suppressed. Thus, it is preferable if the composition range of the second oxide semiconductor film 26 is $0.250 < f/(e+f) \leq 0.875$ as mentioned above.

The electrical conductivity of the second oxide semiconductor film 26 may be in a similar range to the first oxide semiconductor film 24, provided the electrical conductivity is lower than in the first oxide semiconductor film 24, but is preferably at least 10$^{-7}$ Scm$^{-1}$ but less than 10$^1$ Scm$^{-1}$, and is more preferably at least 10$^{-7}$ Scm$^{-1}$ but less than 10$^{-1}$ Scm$^{-1}$.

—Third Step—

Figure 2E:
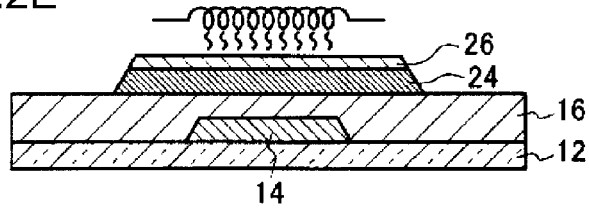
FIG. 2E is a step diagram of the TFT manufacturing process continuing from FIG. 2D.

After the second step, as shown in FIG. 2E, the third step is carried out to apply a heat treatment at over 300° C. in an oxidizing atmosphere. A reason for carrying out the third step is in order to stabilize TFT characteristics during light illumination, as mentioned above. The heat treatment temperature is over 300° C. because diffusion of oxygen in the oxidizing atmosphere or oxygen in the second oxide semiconductor film 26 into the second oxide semiconductor film 26, first oxide semiconductor film 24 and the like occurs from above 300° C., and therefore a heat treatment at a temperature of over 300° C. is required to reduce boundary face defects of the first oxide semiconductor film 24 and bulk defects in the first oxide semiconductor film 24 and second oxide semiconductor film 26 and the like by oxygen diffusion. The heat treatment of the third step may be repeated a plural number of times.

During the second step and the third step, it is preferable to adjust the thickness of the second oxide semiconductor film 26 and the heat treatment temperature such that, if the thickness of the second oxide semiconductor film 26 is represented by Z (nm), the heat treatment temperature in the third step is represented by T (° C.) and a diffusion distance of oxygen is represented by L (nm), the relational expression $0 < Z < L = 8 \times 10^{-6} \times T^3 - 0.0092 \times T^{2+3.6} \times T - 468 \pm 0.1$ is satisfied. Thus, by the heat treatment of the third step being applied subject to the adjustment of the thickness Z of the second oxide semiconductor film 26 and the heat treatment temperature T, oxygen in the oxidizing atmosphere may be assuredly supplied through the second oxide semiconductor film 26 to inside the boundary face of the first oxide semiconductor film 24. Consequently, surface defects of the first oxide semiconductor film 24 that has been damaged by the film formation of the second step may be satisfactorily rectified, and TFT characteristics during light illumination may be improved. These TFT characteristics are more specifically described in the Examples. However, when oxygen in the oxidizing atmosphere is supplied through the second oxide semiconductor film 26 to inside the boundary face of the first oxide semiconductor film 24, it is less likely that holes from electron-hole pairs induced during light illumination will be trapped at the boundary face between the first oxide semiconductor film 24 and the second oxide semiconductor film 26, and consequently a two-stage rise may be prevented from appearing in the Vg-Id characteristic.

During the second step and the third step, it is further preferable to adjust the thickness of the second oxide semiconductor film 26 and the heat treatment temperature so as to satisfy the relational expression $Z \leq (L-3.0)$. This is because initial characteristics after the formation of the TFT 10 (before light illumination) are more excellent. Specifically, the threshold voltage Vth has a positive value.

Meanwhile, during the second step and the third step, it is preferable to adjust the thickness of the second oxide semiconductor film 26 and the heat treatment temperature so as to satisfy the relational expression (L−15.0)≤Z. This is because oxygen defects are rectified to a deeper level in the first oxide semiconductor film 24 by the heat treatment of the third step and a fall in field effect mobility is suppressed.

It is further preferable during the second step and the third step to adjust the thickness of the second oxide semiconductor film 26 and the heat treatment temperature so as to satisfy the relational expression L−11.0≤Z≤L−8.0. When the thickness is in this range, the field effect mobility of the TFT 10 is dramatically increased. This field effect mobility does not particularly change before light illumination or after light illumination.

Thus, the value of the heat treatment temperature T of the third step is adjusted in consideration of the relationship with the thickness Z of the first insulation film 24, but is preferably less than 600° C. When the heat treatment temperature is less than 600° C., mutual interdiffusion of cations between the first oxide semiconductor film 24 and the second oxide semiconductor film 26 and mixing of the two regions may be suppressed. In addition, conductive carriers are more easily collected only in the first oxide semiconductor film 24. A verification may be made as to whether interdiffusion of cations between the first oxide semiconductor film 24 and the second oxide semiconductor film 26 has occurred by, for example, performing a sectional TEM analysis.

The oxygen partial pressure in the oxidizing atmosphere is not particularly restricted, but is preferably substantially 100% with a view to further improving ΔVth during light illumination. Further, it is preferable if the oxygen partial pressure in the oxidizing atmosphere is at least 5% of the total in consideration of the possibility of Vth shifting to the negative side in initial characteristics (i.e., with a view to suppressing the production of surplus carriers by oxygen defects).

—Fourth Step—

Figure 2F:
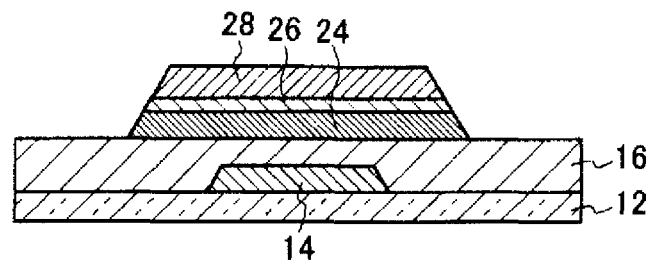
FIG. 2F is a step diagram of the TFT manufacturing process continuing from FIG. 2E.

After the third step, as shown in FIG. 2F, the fourth step is carried out to form the third oxide semiconductor film 28 on the second oxide semiconductor film 26. The third oxide semiconductor film 28 has a different cation composition from the first oxide semiconductor film 24, and has a lower electrical conductivity than the first oxide semiconductor film 24.

In the fourth step, the same film formation technique as in the second step may be used. It is preferable if, in each of the first step, the second step and the fourth step, a film formation technique that produces plasma is used. Because the surface of the first oxide semiconductor film 24 is susceptible to damage in the film formation of the second oxide semiconductor film 26, such a film formation technique is appropriate with the fabrication method according to the present exemplary embodiment. Moreover, there are many cases in which the film formation rate may be made faster and the film may be made more uniform in height, and oxide semiconductor films may be provided with large areas and low costs.

The third oxide semiconductor film 28, which also serves as a portion of the oxide semiconductor layer 18, may use the same material as the first oxide semiconductor film 24, provided that the third oxide semiconductor film 28 has a lower electrical conductivity than the first oxide semiconductor film 24.

In the fourth step, it is preferable if the third oxide semiconductor film 28 is formed such that a cation composition ratio thereof is the same as the cation composition ratio of the second oxide semiconductor film 26. There is no problem with the cation composition ratio of the third oxide semiconductor film 28 having a smaller electron affinity than in the first oxide semiconductor film 24 and the second oxide semiconductor film 26. However, if there is a large mismatch in electron properties between the third oxide semiconductor film 28 and the second oxide semiconductor film 26, the induction of parallel conduction at the boundary face therebetween is suppressed. With regard to manufacturing, a case of using an oxide semiconductor film in which the second oxide semiconductor film 26 and the third oxide semiconductor film 28 are the same is lower in cost than a case in which an oxide semiconductor layered film is layered with three different cation compositions.

Given the above and with a view to raising mobility, it is preferable if the first oxide semiconductor film 24, the second oxide semiconductor film 26 and the third oxide semiconductor film 28 each includes at least one of indium, gallium and zinc.

It is preferable if all of the first oxide semiconductor film 24, the second oxide semiconductor film 26 and the third oxide semiconductor film 28 are non-crystalline. If these films are non-crystalline, film formation may be performed at low temperatures of 400° C. or less, and films with uniform heights may be obtained without the presence of crystal grain boundaries. A verification may be made as to whether the first oxide semiconductor film 24, the second oxide semiconductor film 26 and the third oxide semiconductor film 28 are non-crystalline by X-ray diffraction. That is, it may be determined that a film is non-crystalline if distinct peaks indicating a crystal structure are not detected in X-ray diffraction measurements.

During the second step and the fourth step, it is preferable to perform adjustments such that the total thickness of the second oxide semiconductor film 26 and the third oxide semiconductor film 28 is more than 10 nm and less than 70 nm. When the total thickness of the second oxide semiconductor film 26 and the third oxide semiconductor film 28 is at least 10 nm, a reduction in the off current and suppression of a deterioration in the S-value may be expected. When the total thickness of the second oxide semiconductor film 26 and the third oxide semiconductor film 28 is less than 70 nm, an increase in the resistance between the source and drain electrodes 20 and 22 and the first oxide semiconductor film 24, effectively leading to a reduction in mobility, is suppressed.

With regard to film uniformity and a total carrier density in the active layer, it is preferable if the overall film thickness of the oxide semiconductor layer 18 is at least 10 nm and at most 200 nm.

Carrier densities (and electrical conductivities) in the respective films of the oxide semiconductor layer 18 may be controlled by modulation of the compositions and also by controlling oxygen partial pressures during film formation.

Specifically, oxygen densities may be controlled by controlling the respective oxygen partial pressures during the film formation of the first oxide semiconductor film 24 and the second oxide semiconductor film 26. When the oxygen partial pressure during formation of a film is raised, the carrier density may be reduced and accordingly a reduction in the off current may be expected. On the other hand, when the oxygen partial pressure during formation of a film is lowered, the carrier density may be increased and accordingly an increase in field effect mobility may be expected. As a further example, oxidation of the first oxide semiconductor film 24 may be promoted and the quantity of oxygen defects in the first oxide semiconductor film 24 reduced by, after the first oxide semiconductor film 24 has been formed, the application of a treatment that exposes the film to oxygen radicals, ozone or the like.

Further still, light illumination stability may be enhanced, in accordance with an increase in the optical band gap, by a zinc portion in the oxide semiconductor layer 18 being doped with ions of an element with a wider band gap. In specific terms, the band gap of a film may be increased by doping with magnesium. For example, if the respective regions of the first oxide semiconductor film 24, the second oxide semiconductor film 26 and the third oxide semiconductor film 28 are doped with magnesium, the band profile of each film may be maintained while the band gap is made larger than in a system in which only the composition ratios of indium, gallium and zinc are controlled.

A blue light emission layer used in organic EL exhibits broad light emission with a peak at around $\lambda=450$ nm. Therefore, in a case in which the optical band gap of an IGZO film is relatively narrow and optical absorption occurs in this region, there may be a problem with the threshold value of the transistor shifting. Therefore, particularly for a TFT that is to be used for driving organic EL, it is preferable if the band gap of the material used in the oxide semiconductor layer 18 is larger.

A carrier density of the first oxide semiconductor film 24 or the like may be arbitrarily controlled by cation doping. When the carrier density is to be increased, the film may be doped with a material with a relatively large valency that easily produces cations (for example, titanium, zirconium, hafnium, tantalum or the like). However, in a case of doping with cations with a large valency, the number of constituent elements in the oxide semiconductor film increases, which is disadvantageous in regard to simplifying film formation processes and reducing costs. Therefore it is preferable to control the carrier density with the oxygen density (the quantity of oxygen defects).

—Fifth Step—

Figure 2G:
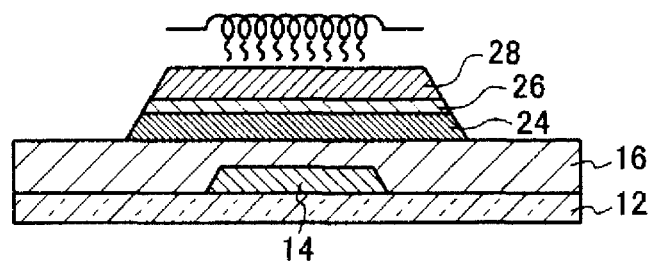
FIG. 2G is a step diagram of the TFT manufacturing process continuing from FIG. 2F.

After the fourth step, as shown in FIG. 2G, the fifth step is carried out to apply a heat treatment in an oxidizing atmosphere.

Similarly to the third step, the heat treatment temperature of the fifth step is preferably adjusted to be less than 600° C. in consideration of interdiffusion of cations. Also similarly to the third step, the heat treatment temperature is preferably more than 300° C. with a view to causing oxygen diffusion, and is more preferably at least 415° C. with a view to enhancing light illumination stability (for example, $|\Delta Vth| \leq 0.1$ V).

Directly after the formation of the oxide semiconductor layer 18 (directly after the fourth step) or directly after the fifth step, the oxide semiconductor layer 18 is patterned into a predetermined shape as necessary by photolithography and etching, a lift-off process or the like. In specific terms, a resist pattern is formed by photolithography at a portion that is to be retained and the pattern is formed by etching with an acidic solution, such as hydrochloric acid, nitric acid, dilute sulfuric acid, a combined solution of phosphoric acid, nitric acid and acetic acid, or the like. This patterning may be carried out directly after each of the first step, the second step and the fourth step. However, with a view to avoiding damage to the first oxide semiconductor film 24 in which carriers are to flow, it is preferable to carry out the patterning directly after the formation of the oxide semiconductor layer 18 (directly after the fourth step) or directly after the fifth step.

—Electrode Formation Step—

Figure 2H:
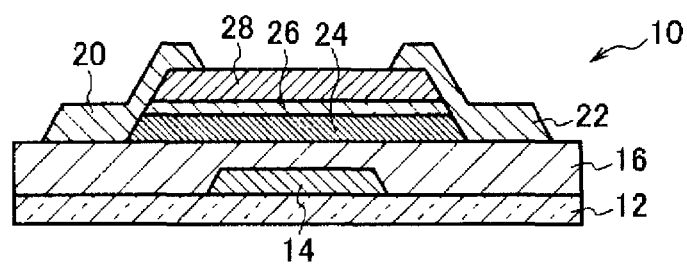
FIG. 2H is a step diagram of the TFT manufacturing process continuing from FIG. 2G.

An electrode formation step that forms the source electrode 20 and the drain electrode 22 on the third oxide semiconductor film 28, as shown in FIG. 2H, may be carried out between the fourth step and the fifth step or after the fifth step. With a view to forming ohmic contacts, it is preferable to apply the heat treatment of the fifth step after the fourth step. In the electrode formation step, a conductive film may be formed in accordance with a method suitably selected, in consideration of the materials being used and suitability, from among, for example, wet processes such as a printing process, a coating process and the like, physical processes such as vacuum deposition, sputtering, ion plating and the like, chemical processes such as CVD, plasma CVD and the like, and the like. Of these, vapor phase film formation techniques such as vapor deposition, sputtering, ion plating, CVD, plasma CVD and the like are preferably used with regard to ease of controlling film thickness. Of these vapor phase film formation techniques, sputtering and pulse laser deposition (PLD) are more preferable. With regard to productivity, sputtering is even more preferable. After the film formation, the conductive film is patterned into a predetermined shape as necessary by photolithography and etching, a lift-off process or the like. Thus, the source and drain electrodes 20 and 22 are formed from the conductive film. Here, it is preferable if wiring connecting to the source and drain electrodes 20 and 22 is patterned at the same time.

The conductive film constituting the source and drain electrodes 20 and 22 uses a material with high conductivity. For example, the conductive film may be formed using the following: a metal such as aluminium, molybdenum, chromium, tantalum, titanium, gold or the like; aluminium-neodymium; a silver alloy; a metal oxide conductive film of tin oxide, zinc oxide, indium oxide, indium tin oxide (ITO) indium zinc oxide (IZO) or the like; or the like. The conductive film that is used as the source and drain electrodes 20 and 22 may have a single-layer structure or a multilayer structure of two or more layers.

In consideration of film formation characteristics, characteristics of patterning by etching, lift-off or the like, conduction characteristics and so forth, the film thickness of the conductive film that is formed is preferably at least 10 nm and at most 1000 nm, and is more preferably at least 50 nm and at most 100 nm.

By the procedure described above, the TFT 10 shown in FIG. 1 may be fabricated.

A verification may be made as to whether a transistor is the TFT 10 fabricated using the field effect transistor fabrication method according to the exemplary embodiment of the present invention by performing a secondary ion-microprobe mass spectrometry (SIMS) analysis. In a case in which an oxide semiconductor film of IGZO, IZO or the like has been heat-treated with a temperature of 250° C. or above in accordance with the present exemplary embodiment, a decrease in zinc atoms may be observed by thermal desorption spectroscopy (TDS). Thus, in a TFT in which, for example, a heat treatment at 450° C. has been applied twice as in an Example described below, portions at which zinc atoms have decreased would be expected to be apparent at layered film surfaces and inside the layered films. In concrete terms, a case is considered in which an IGZO film with an active layer structure the same as in the below-described Example 7 (in which the first oxide semiconductor film 24 has an In:Ga:Zn ratio of 0.617: 0.050:0.333, the second oxide semiconductor film 26 and third oxide semiconductor film 28 have indium, gallium and zinc, and annealing is applied at 450° C. as the third step after the formation of the second oxide semiconductor film 26) is observed using a quadropole-based SIMS analyzer (PHI ADEPT 1010 from ULVAC-PHI, INC.) under the following conditions and secondary ion intensities (negative ions) are detected: primary ions, $Cs^+$; primary acceleration voltage, 1.0 kV; detection area 100 μm×100 μm. When depth direction analysis measurements of secondary ion intensities are conducted under conditions of sensitivity such that observed intensities of ions of In+O (compound ions of indium and oxygen atoms) and molecules of Zn+O (compound ions of zinc and oxygen atoms) are over $10^3$, a phenomenon in which the intensity of ions of zinc and oxygen decreases in the region of the second oxide semiconductor film 26 can be observed. Alternatively, in the case of an oxide semiconductor that does not contain indium and zinc ions, if the heat treatment temperature of the third step is higher than the heat treatment temperature of the fifth step, a decrease in hydrogen and hydroxide ions can be observed in the region of the second oxide semiconductor film 26 whose surface is exposed during the heat treatment of the third step. Thus, a determination may be made, by a SIMS analysis evaluation of the composition distribution of the oxide semiconductor layer 18, as to whether a transistor is the TFT 10 fabricated using the field effect transistor fabrication method according to the exemplary embodiment of the present invention.

The TFT 10 fabricated using the field effect transistor fabrication method according to the exemplary embodiment of the present invention is a bottom gate, top contact-type field effect transistor in which the gate insulation layer is provided over the gate electrode, the channel layered film in which electrons travel is structured over the gate insulation film, and the source electrode and drain electrode are formed over the channel layered film. The channel layered film is an oxide semiconductor layer including each of indium, gallium and zinc, and is structured by first, second and third oxide semiconductor films in this order from the side at which the gate insulation film is disposed. The indium content proportion of the first oxide semiconductor film is higher than in the second and third oxide semiconductor films, and the lattice defect density in the second oxide semiconductor layer is smaller than the lattice defect density in the third oxide semiconductor film. Thus, the TFT 10 can be considered to be a field effect transistor.

Furthermore, in the TFT 10 fabricated using the field effect transistor fabrication method according to the exemplary embodiment of the present invention that is a bottom gate, top contact-type field effect transistor—in which the gate insulation layer is provided over the gate electrode, the channel layered film in which electrons travel is structured over the gate insulation film, and the source electrode and drain electrode are formed over the channel layered film—the channel layered film is an oxide semiconductor layer including each of indium, gallium and zinc and is structured by first, second and third oxide semiconductor films in this order from the side at which the gate insulation film is disposed, the indium content proportion of the first oxide semiconductor film is higher than in the second and third oxide semiconductor films, and the oxygen inclusion density in the second oxide semiconductor layer is greater than the oxygen inclusion density in the third oxide semiconductor film. Thus, the TFT 10 can be considered to be a field effect (thin film) transistor.

The meaning of the term "lattice defects" is intended to include the extent of shifts from thermally stable electron positions, and the extent of oxygen vacancies or a shift from a relationship of metal element composition that satisfies the expression: the number of indium atoms+the number of gallium atoms≈2×the number of zinc atoms. The meaning of the term "oxygen inclusion density" is intended to include the oxygen content per unit volume in each of the oxide semiconductor layers.

Now, attention is focused on the third step in FIG. 2E. In the TFT 10 fabricated using the field effect transistor fabrication method according to the exemplary embodiment of the present invention, it is clear (see the Examples) that oxygen diffusion in the second oxide semiconductor film 26 occurs as a result of oxygen penetration caused by annealing of O18 in the third step. Results are obtained in which all light illumination characteristics are improved in the TFT to which the heat treatment (the third step) has been applied at over 300° C. to cause oxygen diffusion in accordance with the present invention. This is because defects in the second oxide semiconductor film 26 (and desirably boundary faces of both the first and second oxide semiconductor films) are repaired by oxygen diffusion from the external oxidizing atmosphere. Because the oxygen diffusion happens in heat treatment conditions, in the amorphous structure, this oxygen diffusion heat treatment promotes the rearrangement of lattice atoms to thermally stable positions. Therefore, in the TFT 10 provided by the present exemplary embodiment, it is likely that the lattice defect density in the second oxide semiconductor film 26 is lower than that in the third oxide semiconductor film 28. Naturally, the second oxide semiconductor film 26 is subjected to oxygen diffusion from the external oxidizing atmosphere in the third step, and it is likely that the second oxide semiconductor film 26 has a larger oxygen inclusion density than the third oxide semiconductor film 28. Therefore, the TFT 10 with improved light illumination characteristics that is provided by the fabrication method of the present exemplary embodiment has the advantages mentioned above.

Regarding the lattice defect density, the lattice defect densities of the first, second and third oxide semiconductor films may be evaluated by DLCP (a depth direction analysis of defect densities), which is used in defect analyses of solar battery cells and the like, or the like. SIMS may be mentioned as a method for detecting differences in oxygen inclusion densities.

3. Variant Examples

A particular exemplary embodiment of the present invention has been described in detail, but the present invention is not restricted to this exemplary embodiment. It will be clear to the ordinary practitioner that numerous alternative embodiments are possible within the technical scope of the invention. For example, the plural embodiments described above may be combined as appropriate, and the variant examples described below may be combined with one another as appropriate.

For example, the TFT according to the present exemplary embodiment may have various structures other than that described above. For example, an insulation layer may be provided on the substrate 12 and/or a protective layer may be provided on a surface of the oxide semiconductor layer 18 that is exposed between the source electrode 20 and the drain electrode 22.

The disclosures of Japanese Patent Application No. 2011-167093 are incorporated into the present specification by reference in their entirety.

All references, patent applications and technical specifications cited in the present specification are incorporated by reference into the present specification to the same extent as if the individual references, patent applications and technical specifications were specifically and individually recited as being incorporated by reference.

4. Applications

Application is not particularly limited to the field effect transistor fabricated in the present exemplary embodiment described hereabove. The present invention may be applied to, for example, driving elements of electro-optic devices (display devices such as liquid crystal display devices, organic electroluminescent (EL) display devices, inorganic EL display devices and the like) and so forth, and particularly excellently to cases of use in large-area devices.

Further, the field effect transistor of the exemplary embodiment is particularly excellent for devices using resin substrates that can be manufactured by low-temperature processes (for example, flexible displays and the like), and can also be excellently used as driving elements (driving circuits) in various sensors such as X-ray sensors and the like, and various electronic devices such as microelectromechanical systems (MEMS) and so forth.

5. Electro-optic Devices and Sensors

An electro-optic device or sensor according to the present exemplary embodiment is equipped with the field effect transistor described above (the TFT 10).

Examples of the electro-optic device include display devices (for example, liquid crystal display devices, organic EL display devices, inorganic EL display devices and so forth).

Excellent examples of the sensor include image sensors such as charge coupled devices (CCD), complementary metal oxide semiconductor (CMOS) devices and the like, and X-ray sensors and so forth.

Any electro-optic device or sensor using the TFTs according to the present exemplary embodiment has high uniformity of all characteristics within a screen. The term "characteristics" as used here is intended to include display characteristics in the case of an electro-optic device (a display device) and sensitivity characteristics in the case of a sensor.

Herebelow, a liquid crystal display device, an organic EL display device and an X-ray sensor are described as representative examples of electro-optic devices and sensors that are equipped with field effect transistors fabricated in accordance with the present exemplary embodiment.

6. Liquid Crystal Display Device

Figure 3:
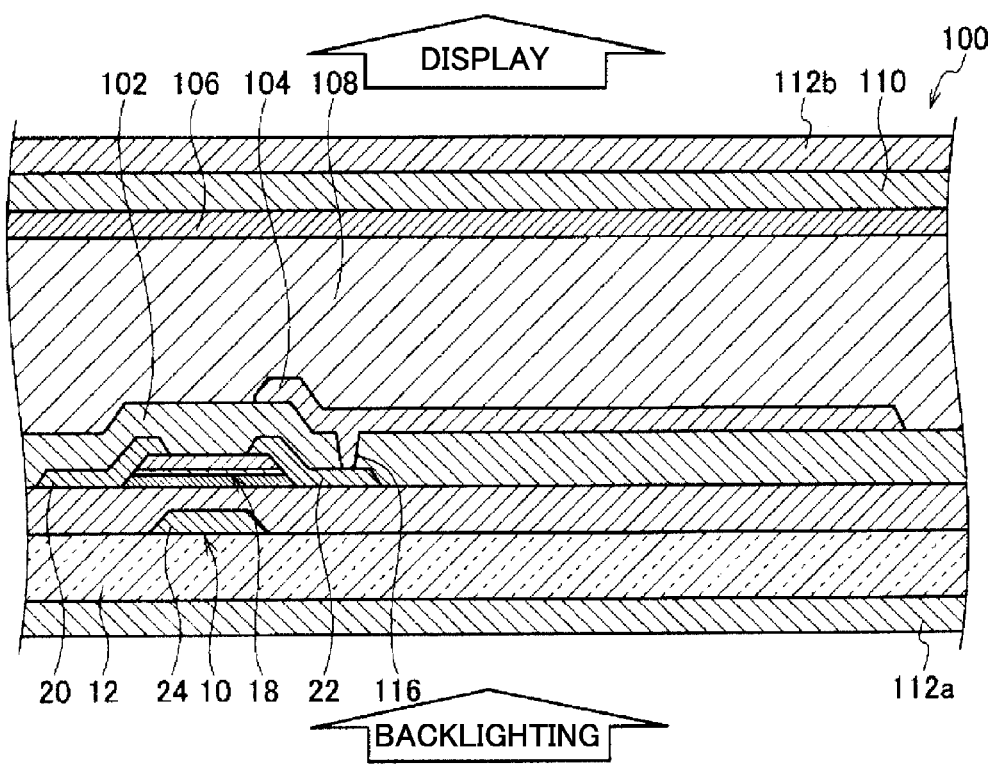
FIG. 3 is a diagram showing a schematic sectional diagram of a portion of a liquid crystal display device in accordance with an exemplary embodiment of an electro-optic device according to the present invention.
Figure 4:
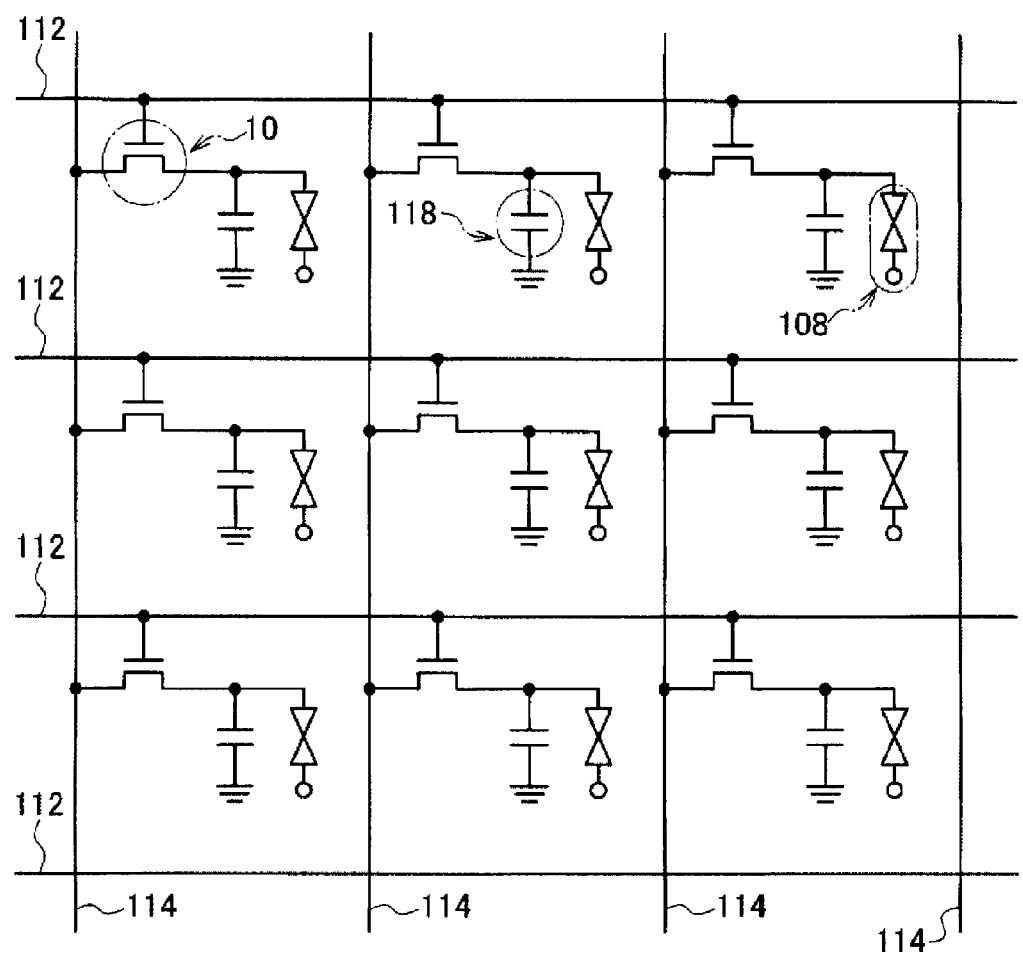
FIG. 4 is a schematic structural diagram of electronic wiring of the liquid crystal display device shown in FIG. 3.

FIG. 3 shows a schematic sectional diagram of a portion of a liquid crystal display device in accordance with an exemplary embodiment of an electro-optic device according to the present invention, and FIG. 4 shows a schematic structural diagram of electronic wiring of the liquid crystal display device.

As shown in FIG. 3, a liquid crystal display device 100 according to the present exemplary embodiment is equipped with the bottom gate structure, top contact-type TFT 10 shown in FIG. 1, a liquid crystal layer 108 and an RGB color filter 110. The liquid crystal layer 108 is sandwiched between a pixel lower electrode 104 over the oxide semiconductor layer 18, which is protected by a passivation layer 102 of the TFT 10, and an opposing upper electrode 106. The RGB color filter 110 is provided in correspondence with respective pixels and colors the pixels with different colors. The liquid crystal display device 100 is also equipped with polarizing plates 112a and 112b, at the substrate 12 side of the TFT 10 and over the RGB color filter 110, respectively.

As shown in FIG. 4, the liquid crystal display device 100 according to the present exemplary embodiment is equipped with a plural number of gate lines 112 in parallel with one another, and data lines 114 that are parallel with one another and cross the gate lines 112. The gate lines 112 and data lines 114 are electrically insulated from one another. The TFTs 10 are provided at vicinities of intersection portions of the gate lines 112 and data lines 114.

The gate electrode 14 of each TFT 10 is connected to one of the gate lines 112, and the source electrode 20 of the TFT 10 is connected to one of the data lines 114. The drain electrode 22 of the TFT 10 is connected to the pixel lower electrode 104 via a contact hole 116 formed in the gate insulation layer 16 (the contact hole 116a being filled with a conductor). The pixel lower electrode 104 structures a capacitor 118 together with the opposing upper electrode 106, which is connected to earth.

Because the TFT of the present exemplary embodiment has unusually high stability at times of light illumination, reliability of the liquid crystal display device is improved.

7. Organic EL Display Device

Figure 5:
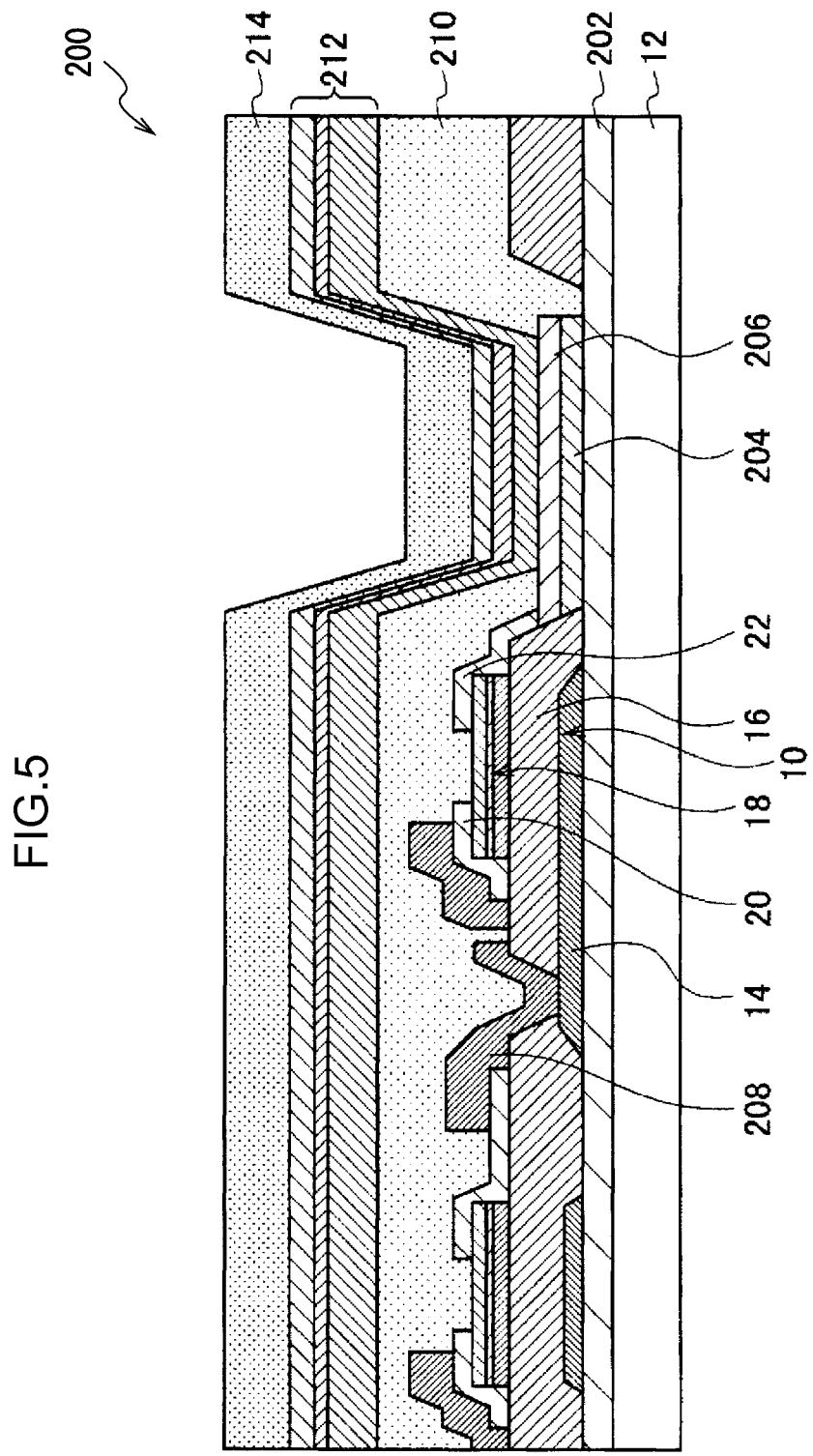
FIG. 5 is a diagram showing a schematic sectional diagram of a portion of an active matrix system organic electroluminescent display device in accordance with an exemplary embodiment of an electro-optic device according to the present invention.
Figure 6:
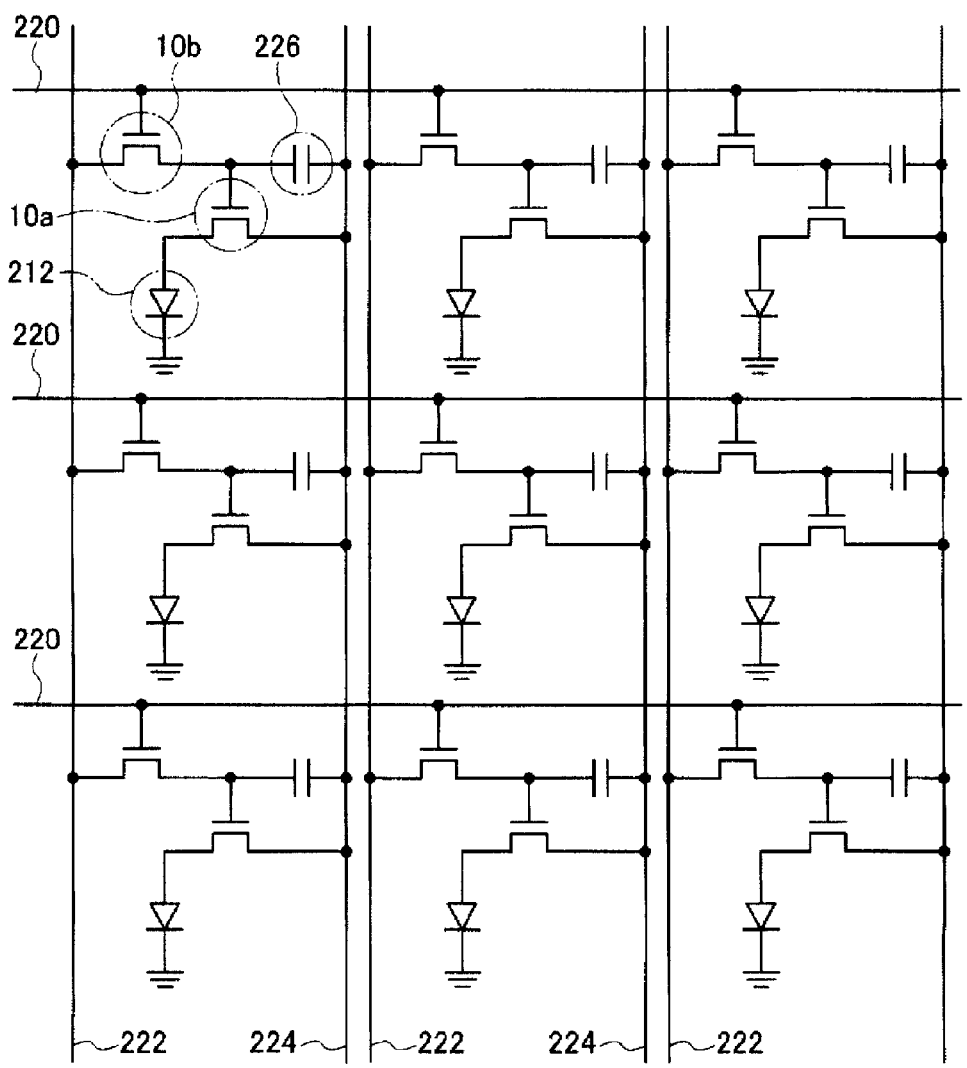
FIG. 6 is a schematic structural diagram of electronic wiring of the organic electroluminescent display device shown in FIG. 5.

FIG. 5 shows a schematic sectional diagram of a portion of an active matrix-type organic EL display device in accordance with an exemplary embodiment of an electro-optic device according to the present invention, and FIG. 6 shows a schematic structural diagram of electronic wiring of the organic EL display device.

There are two kinds of driving system for organic EL display devices, passive matrix systems and active matrix systems. A passive matrix system has the advantage that it may be manufactured at low cost. However, scanning lines are selected one at a time and the pixels of each line caused to emit light. Therefore, the number of scanning lines and the light emission duration per scanning line are inversely proportional. This makes it difficult to increase resolution and increase area. In an active matrix system, a transistor and capacitor and suchlike are formed at each pixel. Therefore, manufacturing costs are higher. However, the problems of increasing numbers of scanning lines as in the passive matrix type are absent, which is excellent for increasing resolution and increasing area.

In an active matrix system organic EL display device 200 according to the present exemplary embodiment, the bottom gate structure TFTs 10 as shown in FIG. 1 are disposed on the substrate 12. The substrate 12 is, for example, a flexible support body, being a plastic film of PEN or the like, and includes a substrate insulation layer 202 at the surface for insulation. A patterned color filter 204 is provided on the substrate insulation layer 202. In each of driving TFT regions, the gate electrode 14 is included, and a gate insulation layer 110 is formed on the gate electrode 14. A connection hole for electrical connection is formed in a portion of the gate insulation layer 16. The oxide semiconductor layer 18 is provided in the driving TFT region, and the source electrode 20 and drain electrode 22 are provided on the oxide semiconductor layer 18. The drain electrode 22 and a pixel electrode (anode) 206 of an organic EL element are a single continuous body, and are formed of the same material in the same step. The drain electrode 22 of a switching TFT is electrically connected with the driving TFT through the connection hole by a connection electrode 208. The whole region is covered with an insulation film 210 apart from a region at which the organic EL electrode of the pixel electrode portion is formed. An organic layer 212, including a light emission layer, and a cathode 214 are provided over the pixel electrode portion. Thus, an organic EL element portion is formed.

As shown in FIG. 6, the organic EL display device 200 according to the present exemplary embodiment is equipped with a plural number of gate lines 220 in parallel with one another, and data lines 222 and driving lines 224 that are parallel with one another and cross the gate lines 220. The gate lines 220, data lines 222 and driving lines 224 are electrically insulated from one another. The gate electrode 14 of each switching TFT 10b is connected to one of the gate lines 220, and the source electrode 20 of the switching TFT 10b is connected to one of the data lines 222. The drain electrode 22 of the switching TFT 10b is connected to the gate electrode 14 of the driving TFT 10 and, using a capacitor 226, holds the driving TFT 10a in the "on" state. The source electrode 20 of the driving TFT 10a is connected to one of the driving lines 224, and the drain electrode 22 is connected to the organic layer 212.

Because TFTs manufactured in accordance with the present invention have unusually high stability at times of light illumination, these TFTs are suitable for the manufacture of EL display devices with high reliability.

The organic EL display device shown in FIG. 5 may be a top emission-type display device with the upper electrode of the organic layer 212 being a transparent electrode, or may be made to be a bottom emission-type display device by making the lower electrode of the organic layer 212 and the respective electrodes of the TFTs transparent electrodes.

8. X-Ray Sensor

Figure 7:
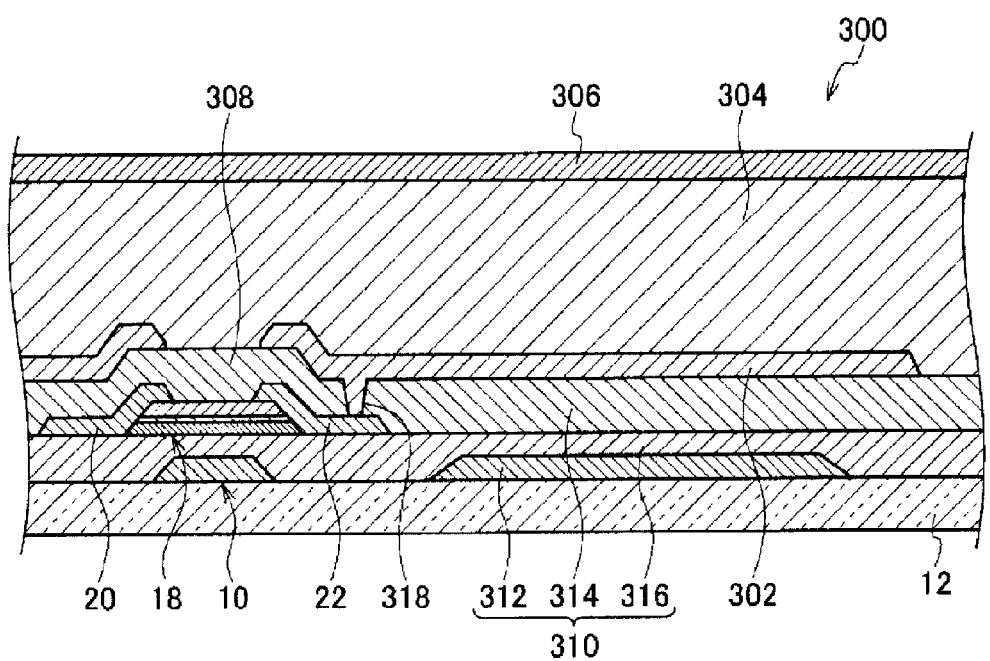
FIG. 7 is a diagram showing a schematic sectional view of a portion of an X-ray sensor in accordance with an exemplary embodiment of a sensor according to the present invention.
Figure 8:
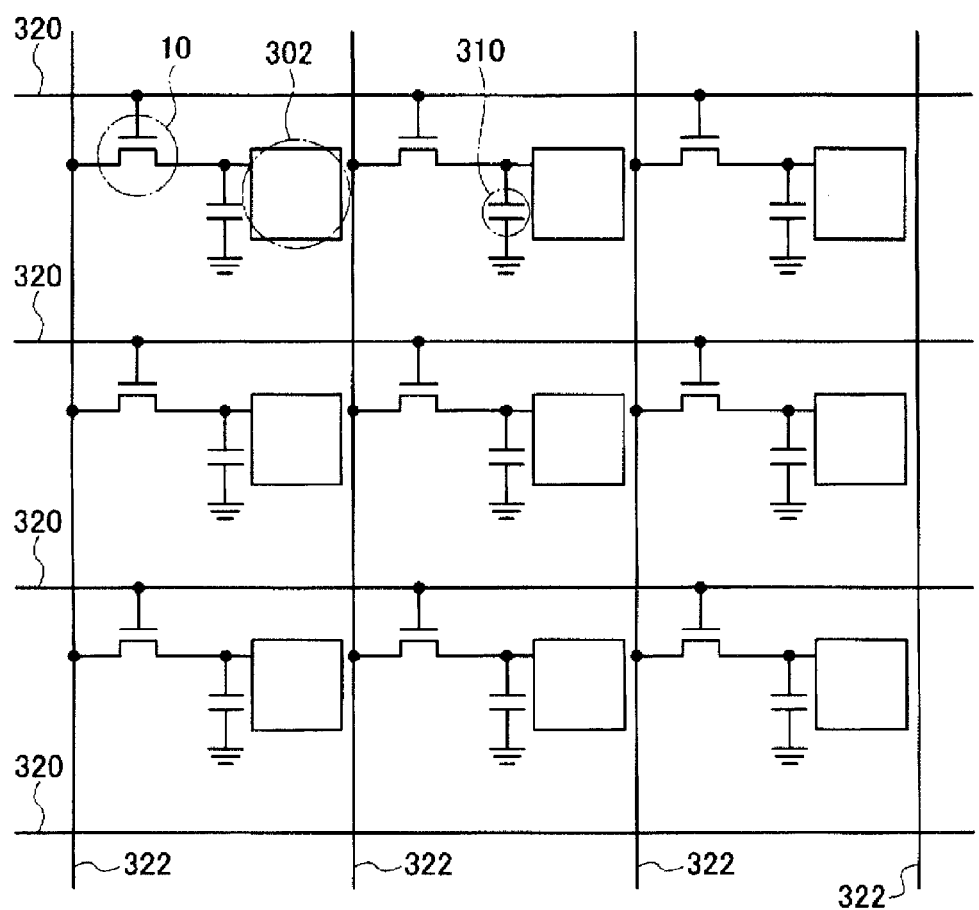
FIG. 8 is a schematic structural diagram of electronic wiring of the X-ray sensor shown in FIG. 7.

FIG. 7 shows a schematic sectional diagram of a portion of an X-ray sensor in accordance with an exemplary embodiment of a sensor according to the present invention, and FIG. 8 shows a schematic structural diagram of electronic wiring of the X-ray sensor.

FIG. 7 is, more specifically, a schematic sectional diagram in which a portion of an X-ray sensor array is magnified. An X-ray sensor 300 according to the present exemplary embodiment is equipped with the TFT 10 and a capacitor 310 formed on the substrate 12, a charge collection electrode 302 formed over the capacitor 310, an X-ray conversion layer 304 and an upper electrode 306. A passivation film 308 is provided over the TFT 10.

The capacitor 310 has a structure in which an insulation film 316 is sandwiched between a capacitor lower electrode 312 and a capacitor upper electrode 314. The capacitor upper electrode 314 is connected, via a contact hole 318 formed in the insulation film 316, with one or other of the source electrode 20 and drain electrode 22 of the TFT 10 (in FIG. 7, the drain electrode 22).

The charge collection electrode 302 is disposed on the capacitor upper electrode 314 of the capacitor 310, and is in contact with the capacitor upper electrode 314.

The X-ray conversion layer 304 is a layer formed of amorphous selenium, and is provided so as to cover the TFT 10 and the capacitor 310.

The upper electrode 306 is disposed on the X-ray conversion layer 304, and is in contact with the X-ray conversion layer 304.

As shown in FIG. 8, the X-ray sensor 300 according to the present exemplary embodiment is equipped with a plural number of gate lines 320 in parallel with one another, and a plural number of data lines 322 that are parallel with one another and cross the gate lines 320. The gate lines 320 and data lines 322 are electrically insulated from one another. The TFTs 10 are provided at vicinities of intersection portions of the gate lines 320 and data lines 322.

The gate electrode 14 of each TFT 10 is connected to one of the gate lines 320, and the source electrode 20 of the TFT 10 is connected to one of the data lines 322. The drain electrode 22 of the TFT 10 is connected to the charge collection electrode 302, and the charge collection electrode 302 is connected to the capacitor 310.

At the X-ray sensor 300 according to the present exemplary embodiment, X-rays are irradiated from above in FIG. 7 (the side at which the upper electrode 306 is disposed), and electron-hole pairs are produced in the X-ray conversion layer 304. The generated charges are accumulated at the capacitor 310 by a strong electric field being applied to the X-ray conversion layer 304 by the upper electrode 306. The generated charges are read out by sequential scanning of the TFTs 10.

Because the X-ray sensor 300 according to the present exemplary embodiment is equipped with the TFTs 10 that have high stability at times of light illumination, images that are excellent in uniformity may be obtained.

EXAMPLES

Herebelow, Examples are described. The present invention is not restricted in any way by these Examples.

<Investigation of Light Illumination Characteristics in Accordance with the Heat Treatment of the Third Step>

How the light illumination characteristics are changed by the inclusion of the heat treatment step (the third step) between the formation of the second oxide semiconductor film and the formation of the third oxide semiconductor film was investigated by fabricating bottom gate, top contact-type TFTs as described below to serve as TFTs of Examples 1 to 3 and a TFT of Comparative Example 1, and evaluating TFT characteristics during light illumination thereof.

Example 1

First, the TFT relating to Example 1 was fabricated using the following fabrication method.

Figure 9A:
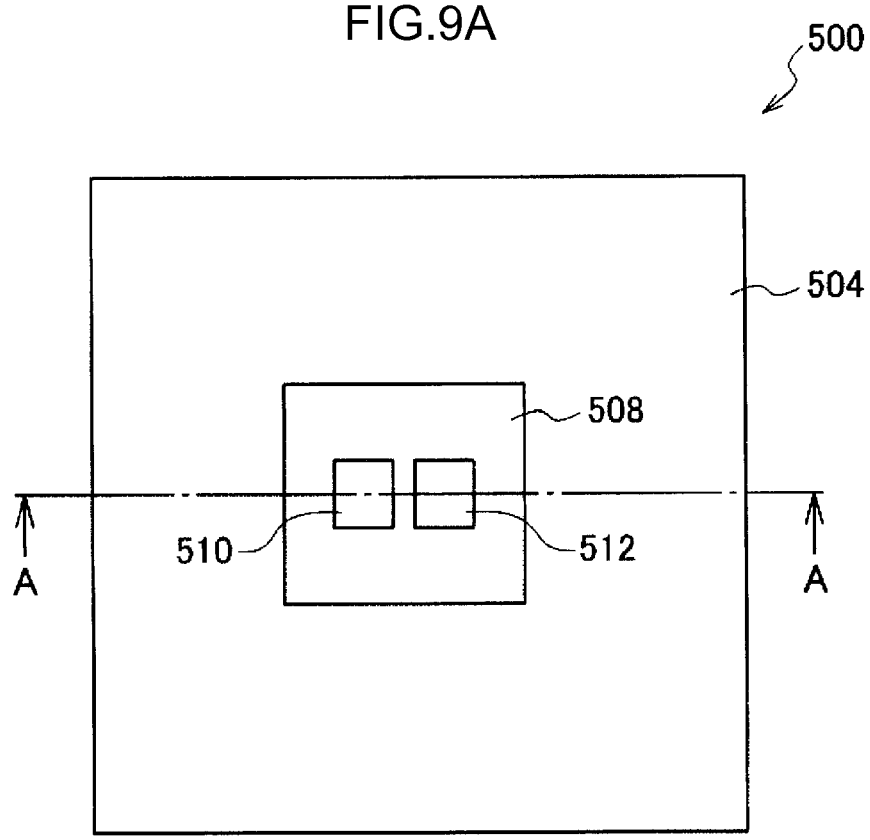
FIG. 9A is a plan diagram of a TFT of an Example and a Comparative Example.
Figure 9B:
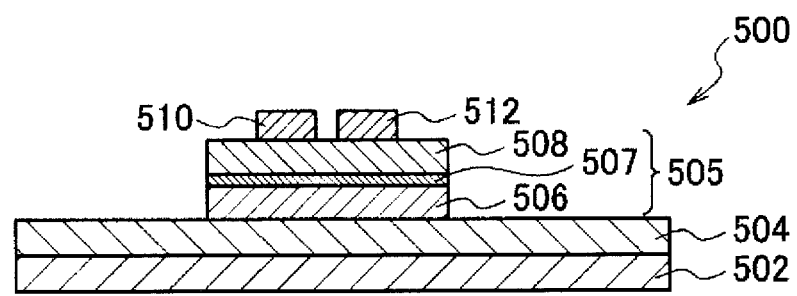
FIG. 9B is a sectional view, viewed along arrows A-A, of the TFT shown in FIG. 9A.

FIG. 9A is a plan diagram of a TFT of the Examples and Comparative Example, and FIG. 9B is a sectional view, viewed along arrows A-A, of the TFT shown in FIG. 9A.

As shown in FIG. 9A and FIG. 9B, a p-type silicon substrate 502 with a thermal oxide film 504, manufactured by MITSUBISHI MATERIALS CORPORATION, was used as the substrate (1-inch square; thickness, 525 µm; thermal oxide film (silicon dioxide) thickness, 100 nm), and a TFT 500 was fabricated with a simple architecture using the thermal oxide film 504 as the gate insulation film.

An oxide semiconductor layer 505, formed on the p-type silicon substrate 502, was divided as described above into a first oxide semiconductor film 506, a second oxide semiconductor film 507 and a third oxide semiconductor film 508. The oxide semiconductor layer 505 was formed continuously without being exposed to the atmosphere between these films. Each film was sputtered using three-source co-sputtering, using an $In_2O_3$ target, a $Ga_2O_3$ target and a ZnO target for the first to third oxide semiconductor films films 506 to 508. Film thicknesses of the respective regions were adjusted by adjustment of the film formation durations.

In concrete terms, the first oxide semiconductor film 506 was formed by sputtering to 5 nm (the first step) on the thermal oxide film 504 of the p-type silicon substrate 502. The first oxide semiconductor film 506 was a film of IGZO in which, if indium is represented by a, gallium is represented by b, zinc is represented by c and oxygen is represented by d, and (a>0, b>0, c>0, d>0, a+b+c=1), the composition ratio was a:b:c=0.617:0.050:0.333). During the formation of this film, input electric powers of the targets (W) were 47.3 for the $In_2O_3$ target, 23.1 for the $Ga_2O_3$ target and 14.0 for the ZnO target.

Other sputtering conditions were as follows.

Attained vacuum: $6 \times 10^{-6}$ Pa

Film formation pressure: $4.4 \times 10^{-1}$ Pa

Film formation temperature: room temperature

Oxygen partial pressure/argon partial pressure: 0.067

Next, the second oxide semiconductor film 507 was formed by sputtering to 5 nm (the second step) on the first oxide semiconductor film 506. The second oxide semiconductor film 507 was a film of IGZO in which, if indium is represented by a, gallium is represented by b, zinc is represented by c and oxygen is represented by d, with (a>0, b>0, c>0, d>0), b/(a+b)=0.750 and the composition ratio was a:b:c=0.167:0.500:0.333).

Thereafter, as the third step, a heat treatment was applied at 450° C. in an oxidizing atmosphere with an oxygen partial pressure of 100%. An oxidizing atmosphere with an oxygen partial pressure of 100% flowed from a gas cylinder, and the total moisture content in the atmosphere had a dewpoint temperature equivalent of −36° C. or less (an absolute humidity of 0.21 g/m$^3$ or less).

After the heat treatment, an IGZO film with the same composition as the second oxide semiconductor film 507 was formed to 45 nm to serve as the third oxide semiconductor film 508 (the fourth step). Sputtering conditions of the second oxide semiconductor film 507 and the third oxide semiconductor film 508 were as follows.

Attained vacuum: $6 \times 10^{-6}$ Pa
Film formation pressure: $4.4 \times 10^{-1}$ Pa
Film formation temperature: room temperature
Oxygen partial pressure/argon partial pressure: 0.067

The input electric powers of the targets were in the ratio $In_2O_3:Ga_2O_3:ZnO=19.3:70.0:14.5$.

In each sputtering formation, the film was patterned using a metal mask. It was verified by X-ray diffraction measurements that each film of the oxide semiconductor layer 505 was a non-crystalline film. The same result applies in the following Examples, Comparative Examples and Experimental Examples. For single films formed with the same compositions, it was verified by Hall measurements that the resistivity of the first oxide semiconductor film 506 is lower than the resistivity of the second oxide semiconductor film 507.

After the formation of the third oxide semiconductor film 508, an electrode layer (a source electrode 510 and a drain electrode 512) formed of titanium (10 nm) and gold (40 nm) was formed on the third oxide semiconductor film 508 by vacuum vapor deposition through a metal mask (the electrode formation step). The source and drain electrodes 510 and 512 were each 1 mm squares, and the electrode separation distance was 0.15 mm.

After the formation of the electrode layer, a heat treatment was applied (the fifth step) at 450° C. in an oxidizing atmosphere (an atmosphere of atmospheric air). This air atmosphere had an oxygen partial pressure of 21%, and the total moisture content in the atmosphere had a dewpoint temperature equivalent of 16° C. (an absolute humidity of 13.6 g/m$^3$ or less).

Thus, the bottom gate-type TFT relating to Example 1 was obtained with a channel length of 180 μm and a channel width of 1 mm.

Example 2

The TFT relating to Example 2 used the same fabrication method as TFT 500 apart from the heat treatment atmospheres in the heat treatment steps, meaning the third step and the fifth step. Specifically, in the third step, atmospheric air was used as the heat treatment atmosphere, and in the fifth step, an oxidizing atmosphere with an oxygen partial pressure of 100% was used as the heat treatment atmosphere. Thus, the TFT relating to Example 2 was obtained.

Example 3

The TFT relating to Example 3 used the same fabrication method as TFT 500 apart from the heat treatment atmospheres in the heat treatment steps, the third step and the fifth step. Specifically, in the third step, an oxidizing atmosphere with an oxygen partial pressure of 100% was used as the heat treatment atmosphere, and in the fifth step, an oxidizing atmosphere with an oxygen partial pressure of 100% was used as the heat treatment atmosphere. Thus, the TFT relating to Example 3 was obtained.

Comparative Example 1

The TFT relating to Comparative Example 1 used the same fabrication method as TFT 500 apart from the heat treatment steps, the third step and the fifth step. Specifically, the third step was not carried out and, in the fifth step, the heat treatment temperature was 450° C. and an oxidizing atmosphere with an oxygen partial pressure of 100% was used as the heat treatment atmosphere. Thus, the TFT relating to Comparative Example 1 was obtained.

—Evaluation—

The Vg-Id characteristics of the fabricated TFTs relating to Examples 1 to 3 and Comparative Example 1 were evaluated, and then the stability of TFT characteristics in response to light illumination was evaluated by illuminating monochrome light with a variable wavelength.

A semiconductor parameter analyzer 4156C (AGILENT TECHNOLOGIES) was used for the evaluation of the TFT characteristics. With this equipment, the measurement of each Vg-Id characteristic was conducted by fixing the drain voltage (Vd) at 10 V, sweeping the gate voltage (Vg) through the range from −30 V to +30 V, and measuring the drain current (Id) for respective gate voltages (Vg). For the field effect mobility, the gate voltage (Vg) was swept through the range from −30 V to +30 V in a state in which the drain voltage (Vd) was fixed at 1 V, and linear mobility was calculated from the linear region of the obtained Vg-Id characteristic.

Figure 10:
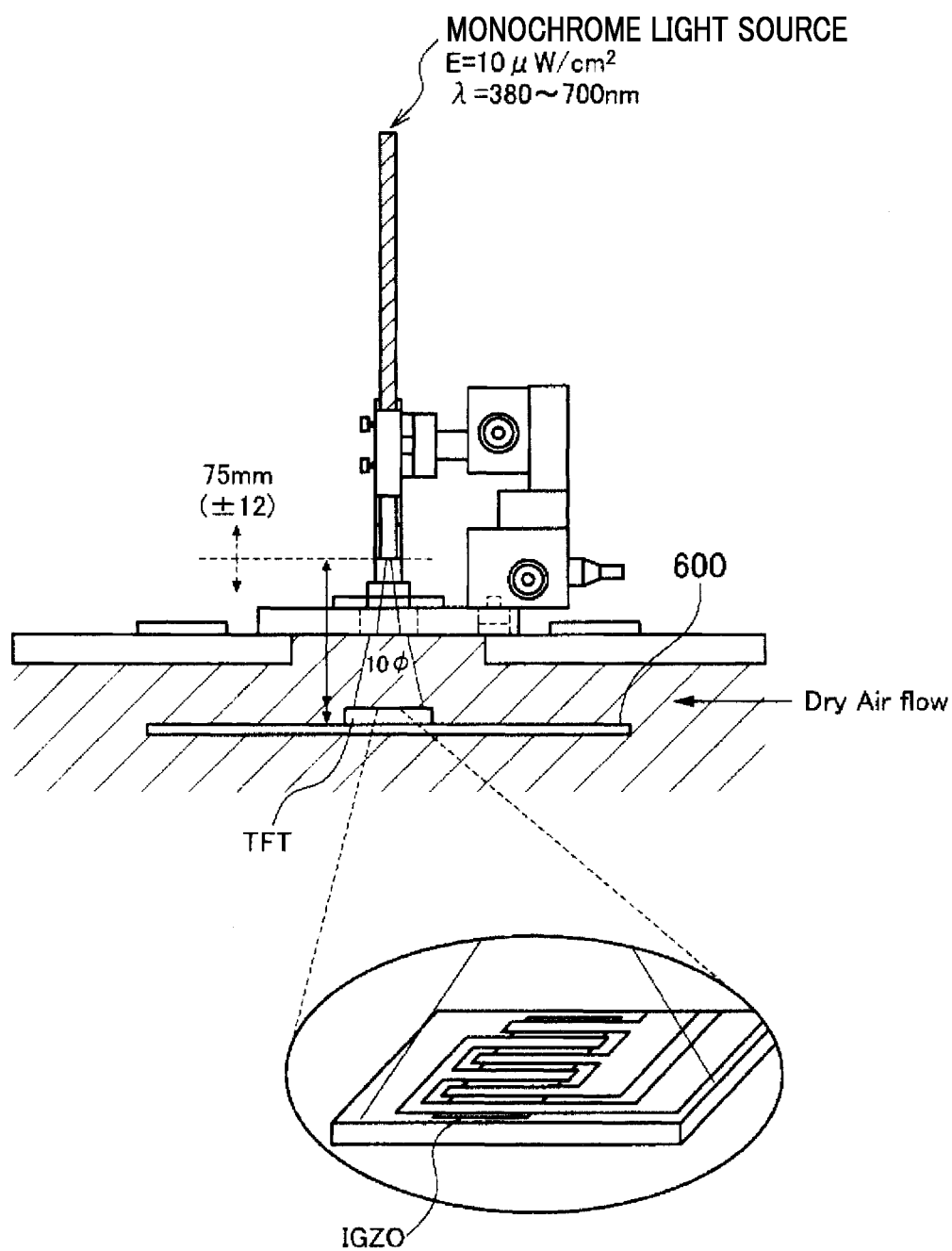
FIG. 10 is a diagram showing schematics of a TFT characteristic measurement under monochrome light illumination.

FIG. 10 is a diagram showing the schematics of the TFT characteristic measurement under monochrome light illumination.

As shown in FIG. 10, each TFT was placed on a probe stage 600, dry air was flowed for at least two hours, and then the TFT characteristics were measured in the dry air atmosphere. The light illumination stability (the threshold shift, ΔVth) was evaluated by setting the illumination intensity of the monochrome light source to 10 μW/cm$^2$, varying the wavelength λ in the range from 380 to 700 nm, and comparing the Vg-Id characteristic when monochrome light was not illuminated with the Vg-Id characteristics during monochrome light illumination. The conditions of measurement of TFT characteristics under monochrome light illumination were that Vds was fixed at 10 V and the gate voltage Vg was swept through the range from −15 V to +15 V. Note that herebelow, unless specifically stated, all measurements were conducted when the monochrome light had been illuminated for 10 minutes.

Figure 11:
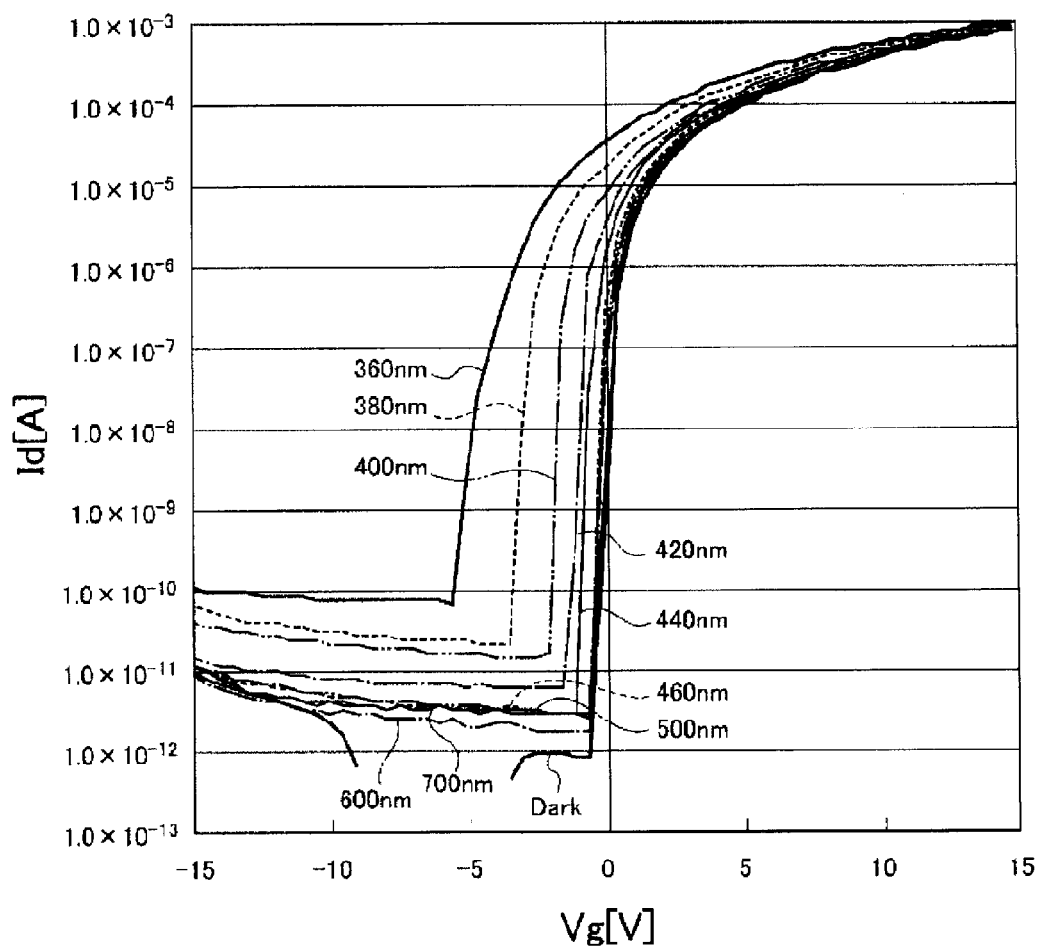
FIG. 11 is a diagram showing a Vg-Id characteristic under monochrome light illumination for a TFT relating to an Example 1.
Figure 12:
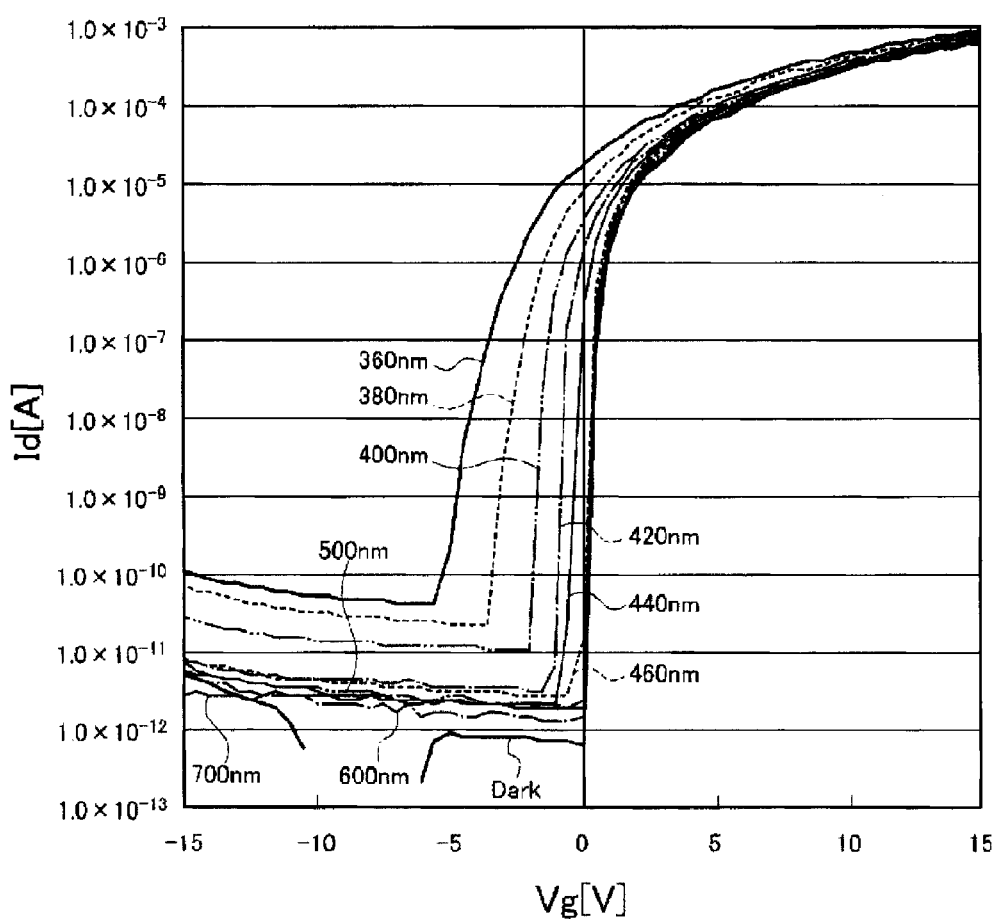
FIG. 12 is a diagram showing a Vg-Id characteristic under monochrome light illumination for a TFT relating to an Example 2.
Figure 13:
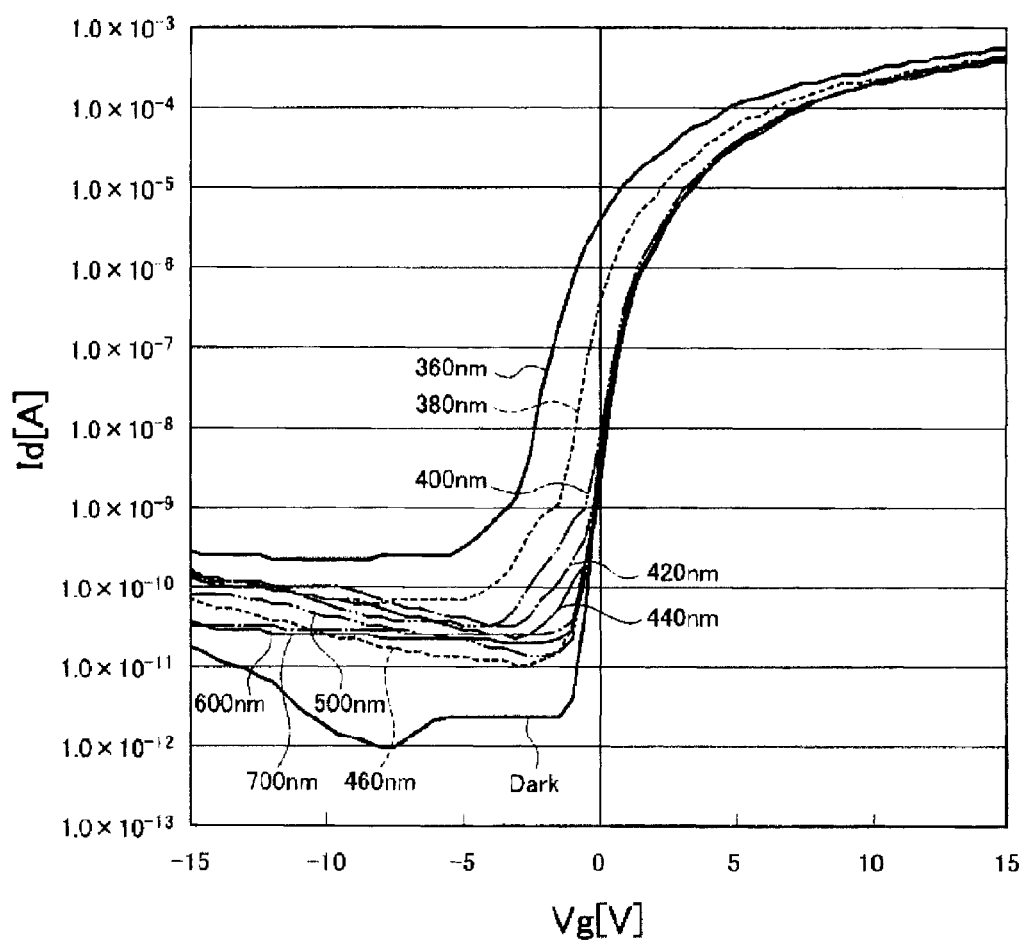
FIG. 13 is a diagram showing a Vg-Id characteristic under monochrome light illumination for a TFT relating to an Example 3.
Figure 14:
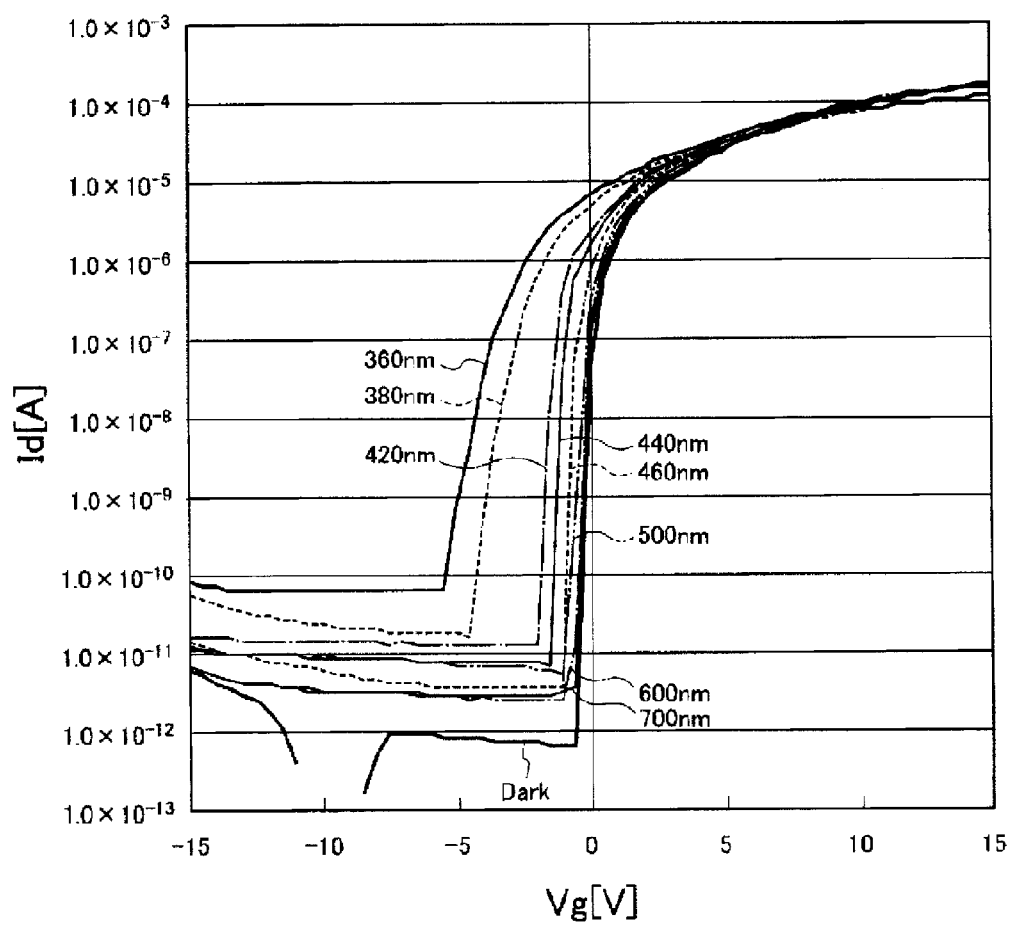
FIG. 14 is a diagram showing a Vg-Id characteristic under monochrome light illumination for a TFT relating to a Comparative Example 1.

FIG. 11 is a diagram showing the Vg-Id characteristics under monochrome light illumination for the TFT relating to Example 1, FIG. 12 is a diagram showing the Vg-Id characteristics under monochrome light illumination for the TFT relating to Example 2, FIG. 13 is a diagram showing the Vg-Id characteristics under monochrome light illumination for the TFT relating to Example 3, and FIG. 14 is a diagram showing the Vg-Id characteristics under monochrome light illumination for the TFT relating to Comparative Example 1.

Table 1 lists the TFT fabrication conditions and TFT characteristics of Examples 1 to 3 and Comparative Example 1. Note that "μ" in the table represents the field effect mobility, "Vth" represents the threshold voltage, and "ΔVth" represents the threshold shift when light with a wavelength of 420 nm is illuminated. The same applies in the other tables.

TABLE 1

| | Heat treatment atmosphere in the third step | Heat treatment atmosphere in the fifth step | μ (cm²/Vs) | Vth (V) | ΔVth (V) (illumination with 420 nm light) |
|---|---|---|---|---|---|
| Example 1 | 100% oxygen | Atmospheric air | 54.4 | 0.65 | −0.95 |
| Example 2 | Atmospheric air | 100% oxygen | 39.0 | 1.00 | −0.59 |
| Example 3 | 100% oxygen | 100% oxygen | 26.5 | 2.33 | −0.12 |
| Comparative Example 1 | — | Atmospheric air | 56.0 | −0.10 | −1.15 |

From the results shown in Table 1 and FIG. 11 to FIG. 14, it can be seen that in Comparative Example 1 in which the heat treatment step (the third step) was not carried out, ΔVth in response to monochrome light with a wavelength of 420 nm was −1.15 V, exhibiting a threshold shift of more than 1 V. In contrast, it can be seen that in Examples 1 to 3 in which the third step was carried out, every ΔVth in response to monochrome light with a wavelength of 420 nm was |ΔVth|≤1 V, a rise (i.e., an improvement) in the light illumination stability. In particular, it was found that the degree of improvement in light illumination stability was larger in the case in which the heat treatment was applied in an atmosphere with an oxygen partial pressure of 100% (Example 3) then when the heat treatment was applied in atmospheric air (with an oxygen partial pressure of 21%).

<Heat Treatment Temperatures in the Third Step and the Fifth Step (1): Investigation of Oxygen Diffusion Depths in the Heat Treatments>

To what depth in the oxide semiconductor layer oxygen in the oxidizing atmosphere diffused was investigated in relation to the heat treatment temperatures in the heat treatments of the third step and the fifth step.

Experimental Examples 1 to 4

For Experimental Example 1, a p-type silicon substrate with a thermal oxide film to serve as a gate electrode was prepared to be the substrate (1-inch square×1 mm thick; thickness t, 525 μm; thermal oxide film (silicon dioxide) thickness, 100 nm).

In concrete terms, the p-type silicon substrate with the thermal oxide film was prepared by resist application and baking, removal of silicon dioxide at the rear face by etching (using BHF), pure water washing, resist removal (using sulfuric acid/hydrogen peroxide), pure water washing and rinsing, and nitrogen blowing. Due to boron doping, the silicon substrate had a resistivity of 0.001 to 0.0013 Ωcm.

An IGZO film (In:Ga:Zn=1:1:1) was formed by DC sputtering to a thickness of 50 nm, under the following conditions: back pressure, $5\times10^{-6}$ Pa; film formation pressure, 0.8 Pa; argon, 30 sccm ($5.07\times10^{-2}$ Pa·m³/s); oxygen ($O_2$), 0.25 sccm ($4.225\times10^{-4}$ Pa·m³/s); DC 50 W. Ordinarily, after the IGZO film is formed, patterning would be carried out by photolithography and etching. However, because the effects of contamination and damage at the boundary face of the IGZO film would be removed by photolithography and etching, patterning film formation was carried out using a metal mask in Experimental Example 1, in order to more accurately verify the effects of the present invention. X-ray diffraction measurements verified that the IGZO film was a non crystalline film.

Then, the source electrode and the drain electrode were not formed but a protective layer formed of a gallium oxide ($Ga_2O_3$) film was formed to a thickness of 50 nm on the surface of the IGZO film by RF sputtering under the following conditions: back pressure, $5\times10^{-6}$ Pa; film formation pressure, 0.4 Pa; argon, 30 sccm ($5.07\times10^{-2}$ Pa·m³/s); oxygen, 0.3 sccm ($5.07\times10^{-4}$ Pa·m³/s); RF 50 W. These steps were repeated to prepare four samples.

The four prepared samples were subjected to the heat treatment with heat treatment temperatures of 300° C., 350° C., 400° C. and 450° C. in an atmosphere of O18 gas, which is a stable isotope of oxygen ($18O_2$ gas, commercially available from TAIYO NIPPON SANSO CORPORATION). The stable isotope of oxygen, O18, is expected to diffuse into the protective layer and the active layer with substantially the same diffusion distances as ordinary O16. Herein, the sample subjected to the heat treatment at 300° C. is referred to as the sample of Experimental Example 1, the sample subjected to the heat treatment at 350° C. is referred to as the sample of Experimental Example 2, the sample subjected to the heat treatment at 400° C. is referred to as the sample of Experimental Example 3, and the sample subjected to the heat treatment at 450° C. is referred to as the sample of Experimental Example 4.

—SIMS Analysis—

The SIMS analysis was applied to the fabricated samples of Experimental Examples 1 to 4. Specifically, the SIMS analysis used the model PHI ADEPT 1010 from ULVAC-PHI, INC. as the SIMS analyzer. The analysis environment was as follows: primary ion, $Cs^+$; primary acceleration voltage, 3.0 kV; detection area 56×56 (μm×μm). Negative polarities of secondary ions from the samples were detected.

Figure 15:
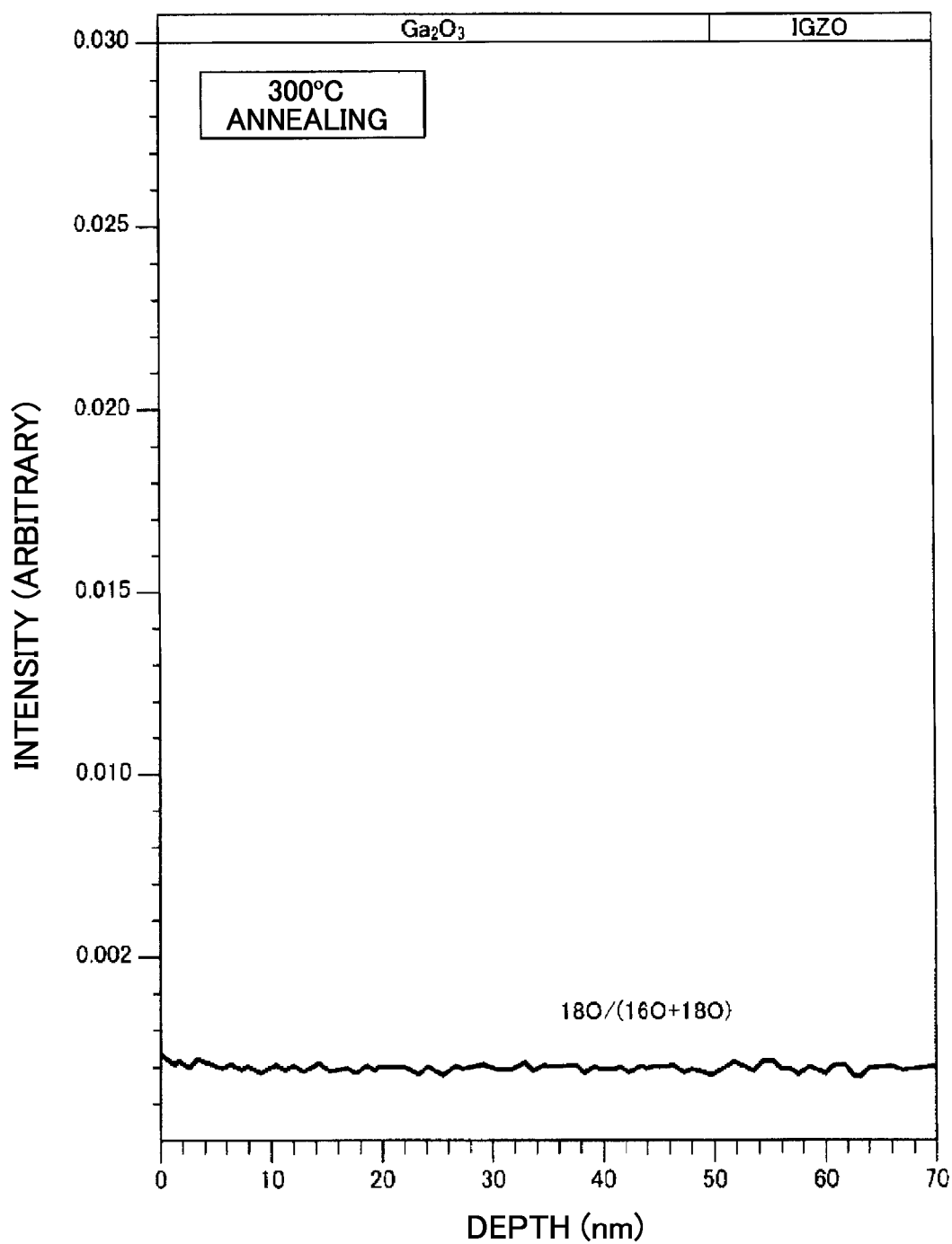
FIG. 15 is a diagram showing SIMS analysis results of a sample of Example 1.
Figure 16:
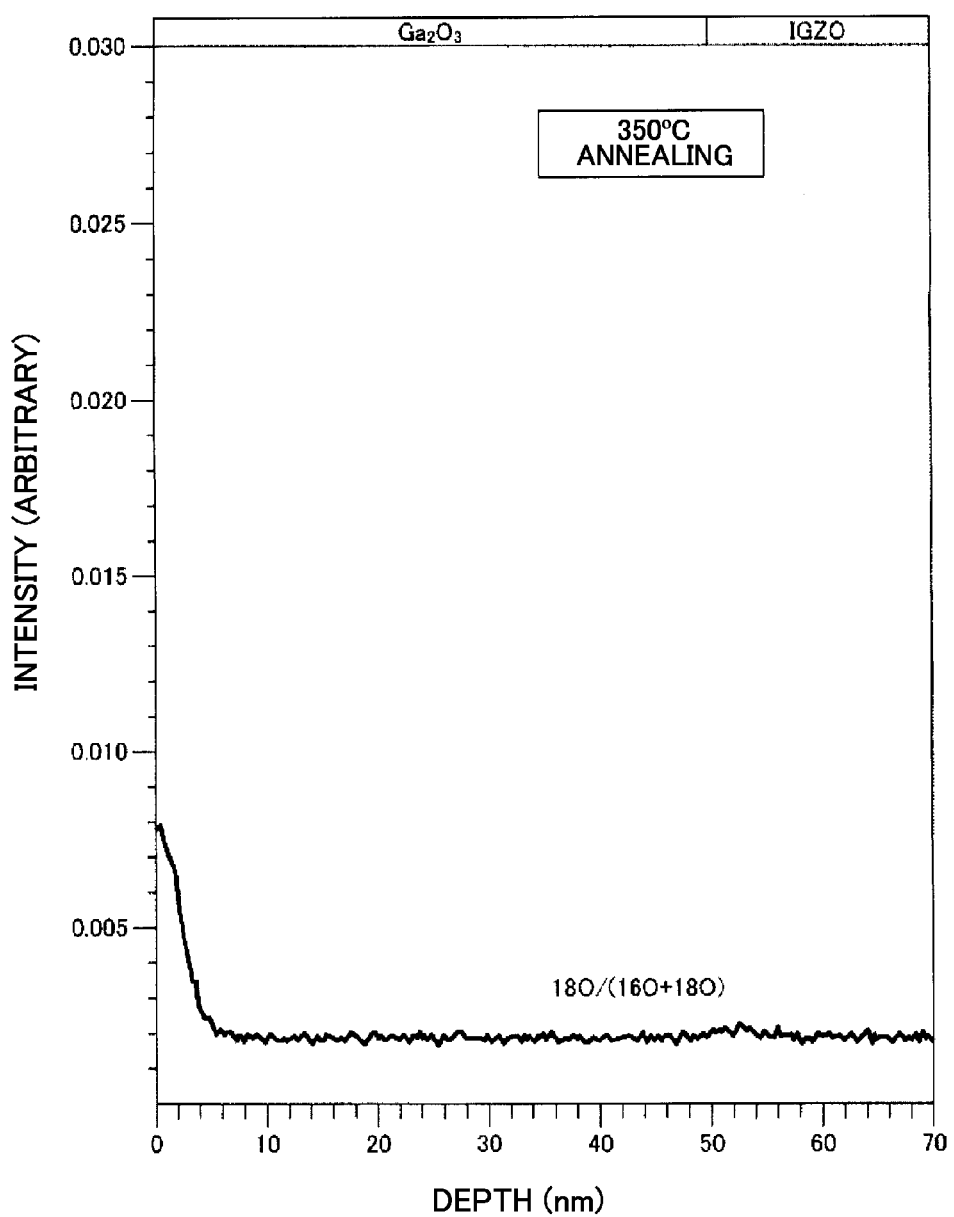
FIG. 16 is a diagram showing SIMS analysis results of a sample of Example 2.
Figure 17:
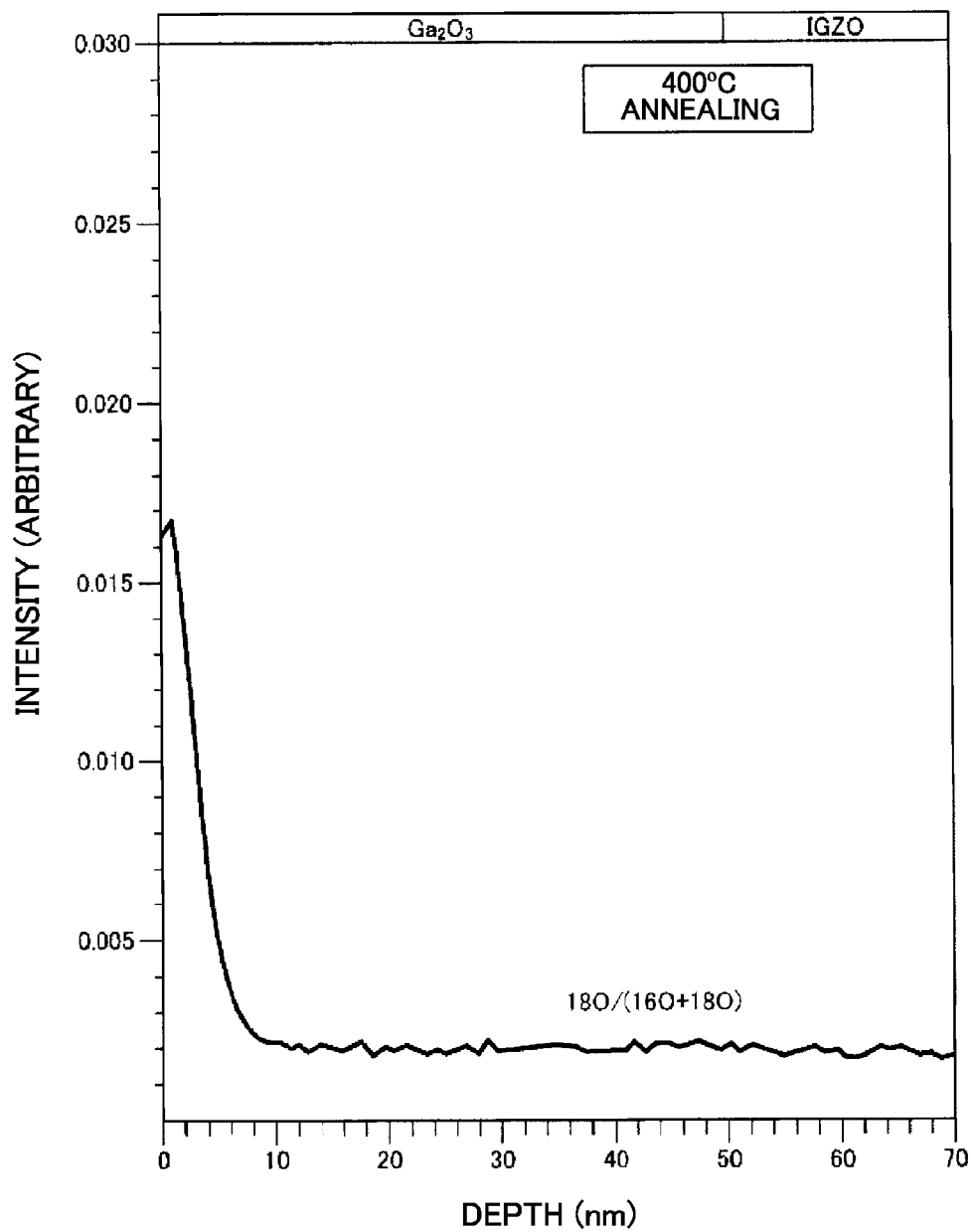
FIG. 17 is a diagram showing SIMS analysis results of a sample of Example 3.
Figure 18:
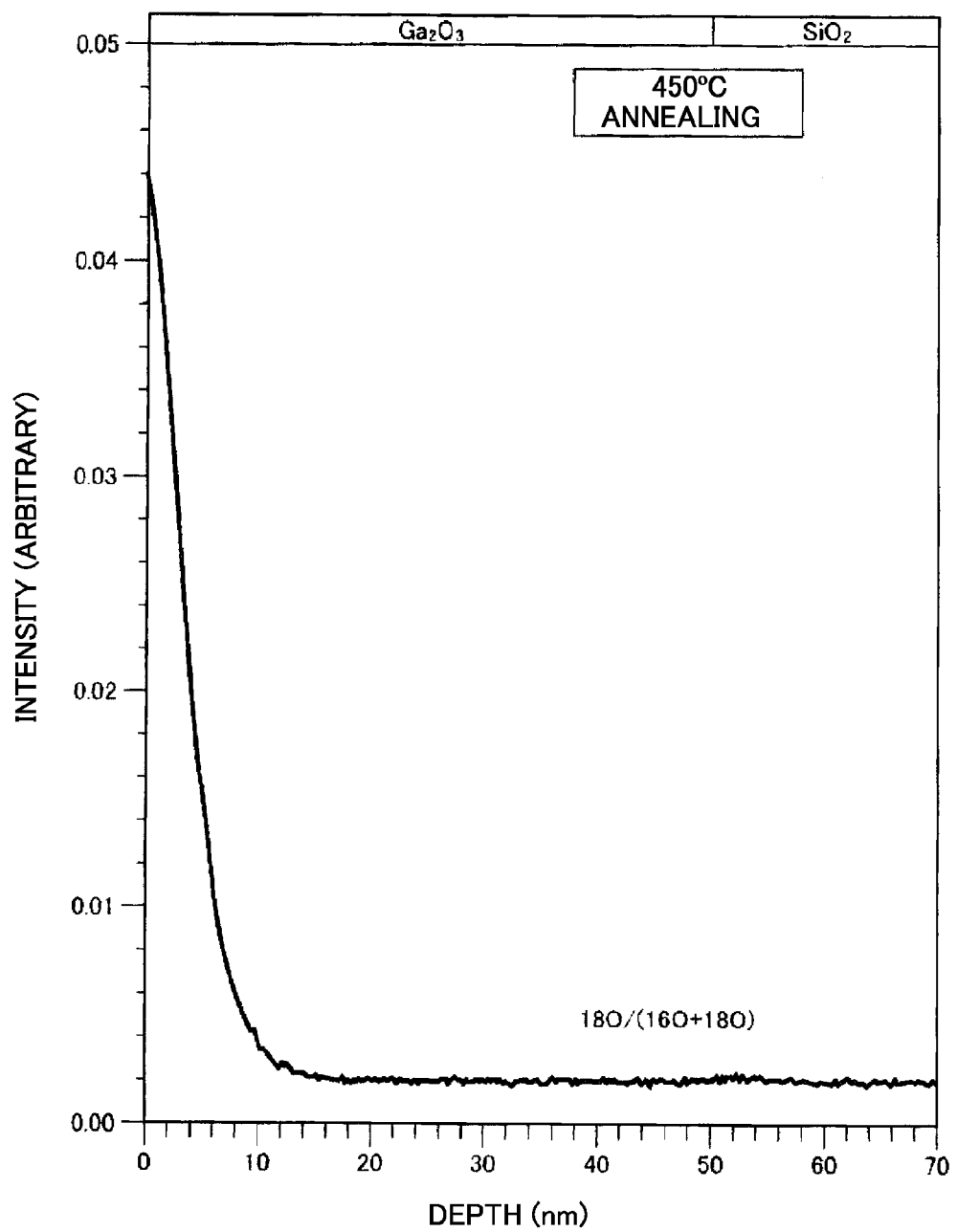
FIG. 18 is a diagram showing SIMS analysis results of a sample of Example 4.

FIG. 15 is a diagram showing SIMS analysis results of the sample of Experimental Example 1, FIG. 16 is a diagram showing SIMS analysis results of the sample of Experimental Example 2, FIG. 17 is a diagram showing SIMS analysis results of the sample of Experimental Example 3, and FIG. 18 is a diagram showing SIMS analysis results of the sample of Experimental Example 4.

From FIG. 15, it can be seen that in the sample of Experimental Example 1, with the heat treatment at 300° C., the oxygen did not actually diffuse (enter into the protective layer and the like). Looking at FIG. 16 to FIG. 18, it can be seen that the oxygen diffusion distance L increased as the heat treatment temperature rose.

Thus, from the analysis results in FIG. 15 to FIG. 18, a depth at which the intensity of 18O/(O16+O18) started to become apparent, which is to say the diffusion distance L (nm) of O18 (=O16) was found for each heat treatment temperature, and these are summarized in Table 2.

TABLE 2

| | Heat treatment temperature T (° C.) | Diffusion distance L (nm) |
|---|---|---|
| Experimental Example 1 | 300 | 0 |
| Experimental Example 2 | 350 | 8 |
| Experimental Example 3 | 400 | 12 |
| Experimental Example 4 | 450 | 18 |

Figure 19:
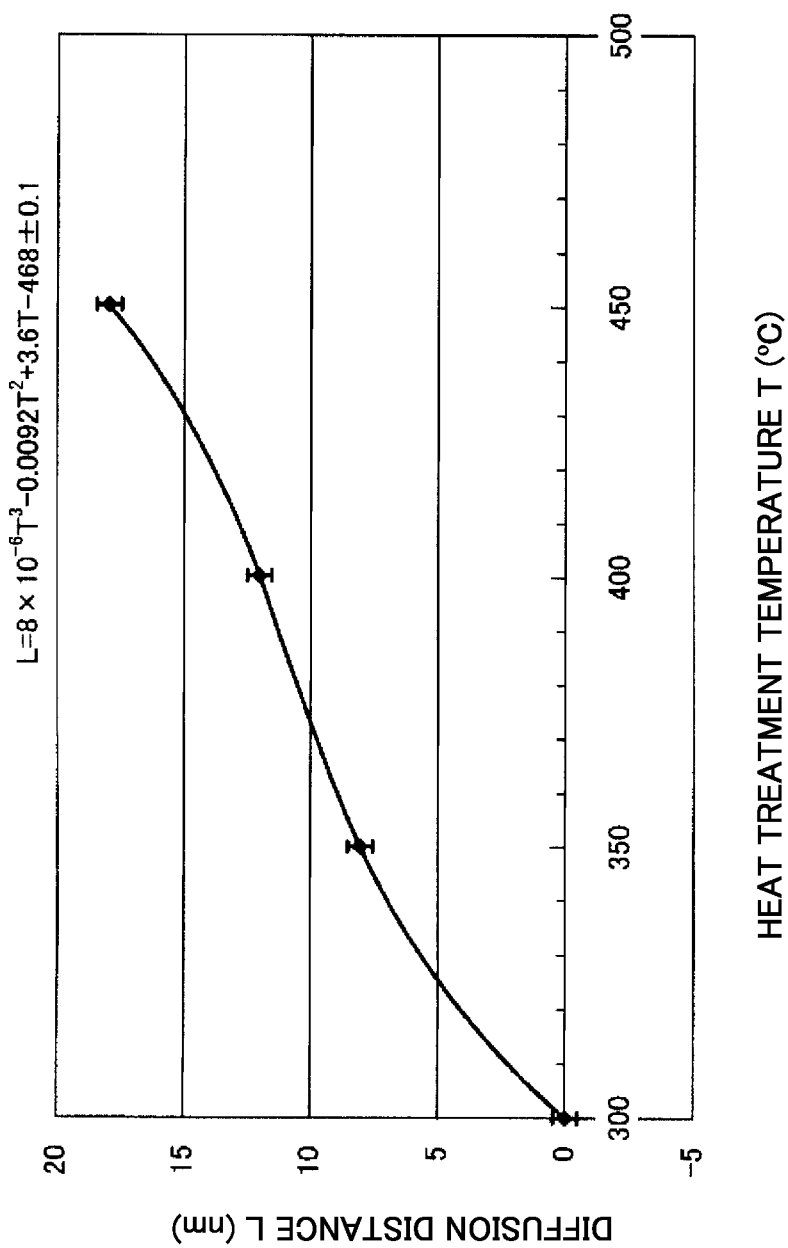
FIG. 19 is a graph plotting a relationship found between an oxygen diffusion distance L and a heat treatment temperature.

Next, a relationship between the oxygen diffusion distances L that had been found and the heat treatment temperatures was plotted on a graph. FIG. 19 is the graph plotting the relationship found between the oxygen diffusion distance L and the heat treatment temperature.

Based on the plot in FIG. 19, an approximation curve of a third order relationship representing the relationship between the oxygen diffusion distance L and the heat treatment temperature was calculated. The results of this calculation provided the relational expression $L=8\times10^{-6}\times T^3-0.0092\times T^2+3.6\times T-468\pm 0.1$. Here, "±0.1" represents measurement (and calculation) errors. Error bars are shown in the graph, but are shown as being greater than ±0.1 so as to be easily visible.

From the results described above, if the case in which, for example, the heat treatment temperature is 400° C. is taken as an example, then as shown in FIG. 19, it can be seen that the O18 from the oxidizing atmosphere diffused (embedded) to about 12 nm into the gallium oxide film. This result provides a confirmation that the oxygen diffusion distance L does not change between a gallium oxide film and a film of another material such as an IGZO film or the like.

Therefore, it may be supposed that, if the thickness of the second oxide semiconductor film 507 is represented by Z and the heat treatment temperature in the third step is represented by T, for oxygen in the oxidizing atmosphere to be supplied through the second oxide semiconductor film 507 to inside the boundary face of the first oxide semiconductor film 506, it is preferable if the second step and the third step are adjusted such that $Z<L=8\times10^{-6}\times T^3-0.0092\times T^2+3.6\times T-468\pm0.1$.

Accordingly, by fixing the temperature of the third step and varying the thickness Z of the second oxide semiconductor film 507, it was experimentally ascertained that differences between the results (TFT characteristics and light illumination stability) when Z<L and when Z≥L have the following dependency on thickness.

<Dependency of Light Illumination Characteristics on the Thickness of the Second Oxide Semiconductor Film 507>

Examples 4 to 12

Adjustment of the thickness Z of the second oxide semiconductor film 507 was implemented by systematically altering the thickness of the second oxide semiconductor film 507 between 3 and 50 nm, with the heat treatment conditions in the third step and the fifth step being fixed at an atmosphere of 100% oxygen and a heat treatment temperature T of 450° C. Specifically, TFTs relating to Examples 4 to 12 were fabricated with the same TFT structure and composition as in Example 1, with the thickness Z of the second oxide semiconductor film 507 being adjusted between 3 and 50 nm. The total thickness of the second oxide semiconductor film 507 and the third oxide semiconductor film 508 was the same in Examples 4 to 11, at 50 nm. Example 12 was fabricated without the third oxide semiconductor film 508, and with the third step, the electrode formation step and the fifth step being carried out in this order.

—Evaluation—

The Vg-Id characteristics of the fabricated TFTs relating to Examples 4 to 11 were evaluated, and then the stability of the TFT characteristics in response to light illumination was evaluated by illuminating monochrome light with a variable wavelength. The evaluation method was the same as the method described above.

Table 3 lists the second oxide semiconductor film 507 thicknesses Z and TFT characteristics of Examples 4 to 12 and Comparative Example 1. Note that, because the field effect mobility μ barely changed at all before light illumination and after light illumination, the field effect mobility μ before light illumination is given in Table 3. Vth is the threshold voltage (V) before light illumination, and ΔVth is the threshold shift when light with a wavelength of 420 nm was illuminated at the TFT.

TABLE 3

|  | Thickness Z (nm) | μ (cm²/Vs) | Vth (V) | ΔVth (V) (illumination with 420 nm light) | Performance of third step | TFT Characteristics |
|---|---|---|---|---|---|---|
| Example 4 | 3.0 | 23.2 | 2.10 | 0.0130 | Yes | Good |
| Example 5 | 5.0 | 26.5 | 2.33 | −0.1190 | Yes | Good |
| Example 6 | 7.0 | 33.1 | 0.30 | −0.0700 | Yes | Excellent |
| Example 7 | 8.0 | 46.9 | 2.21 | −0.0180 | Yes | Excellent |
| Example 8 | 10.0 | 33.8 | 0.50 | 0.0005 | Yes | Excellent |
| Example 9 | 15.0 | 30.1 | 0.67 | 0.0120 | Yes | Excellent |
| Example 10 | 20.0 | 46.5 | −2.79 | −0.0570 | Yes | Fair |
| Example 11 | 30.0 | 43.6 | 1.01 | −0.0490 | Yes | Fair |
| Example 12 | 50.0 | 46.7 | 1.72 | −0.0640 | Yes | Fair |
| Comparative Example 1 | 50.0 | 56.0 | −0.10 | −1.1500 | No | Poor |

Figure 20:
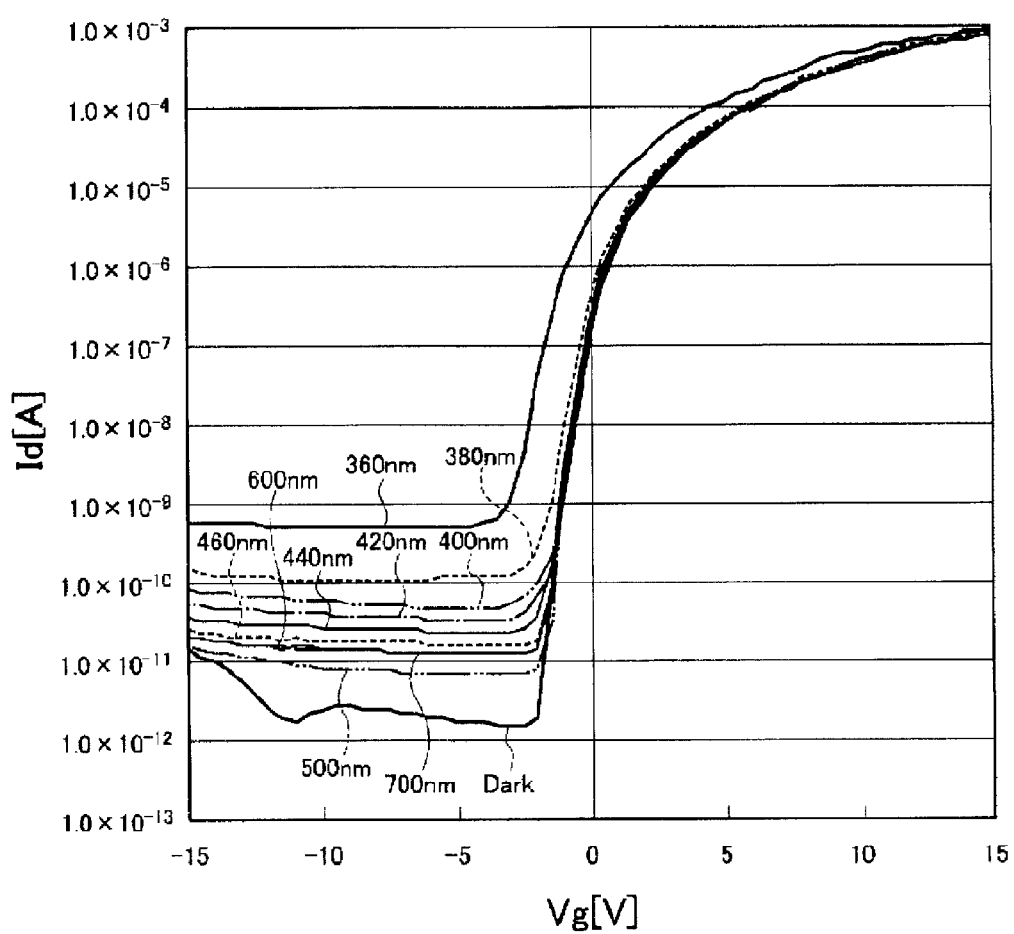
FIG. 20 is a diagram showing a Vg-Id characteristic under light illumination for a TFT of Example 7, showing representative Vg-Id characteristics among measurement results.
Figure 21:
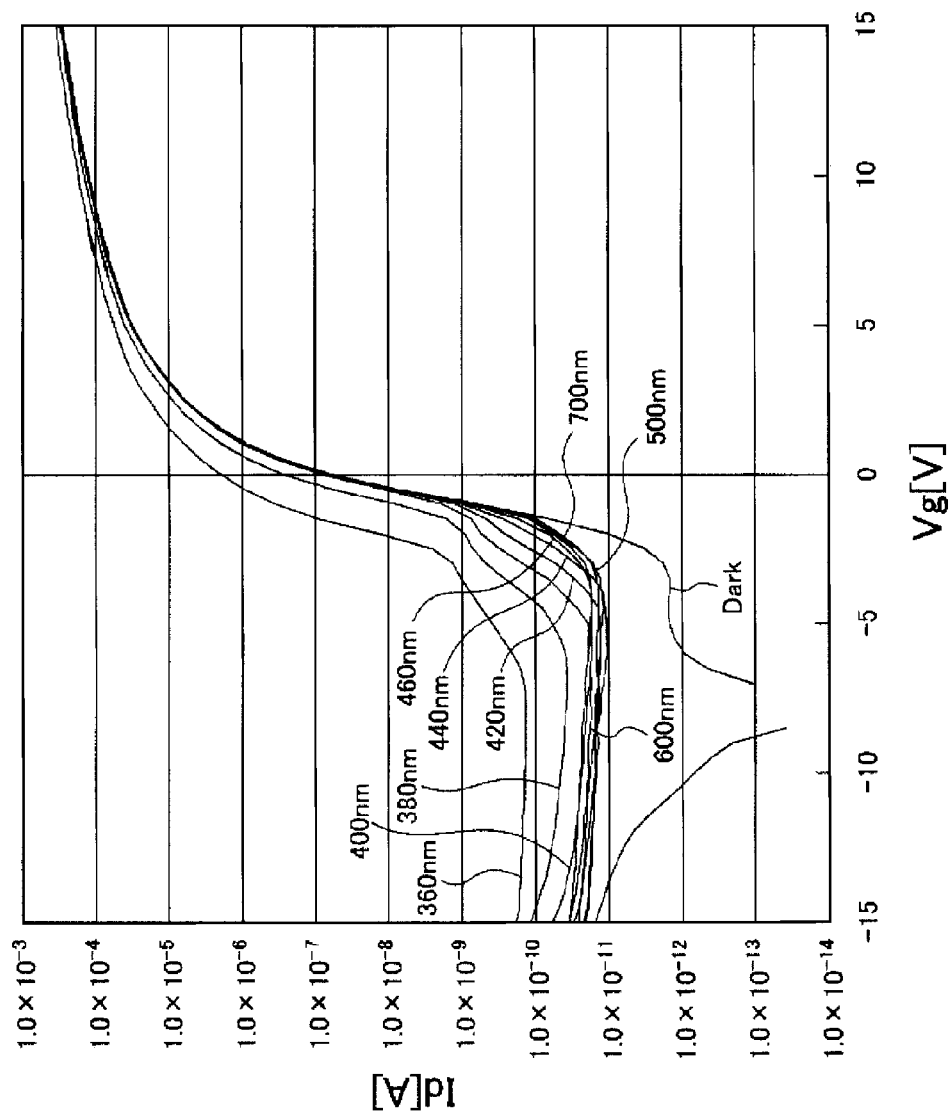
FIG. 21 is a diagram showing the Vg-Id characteristic under light illumination for a TFT of Example 9, showing representative Vg-Id characteristics among measurement results.
Figure 22:
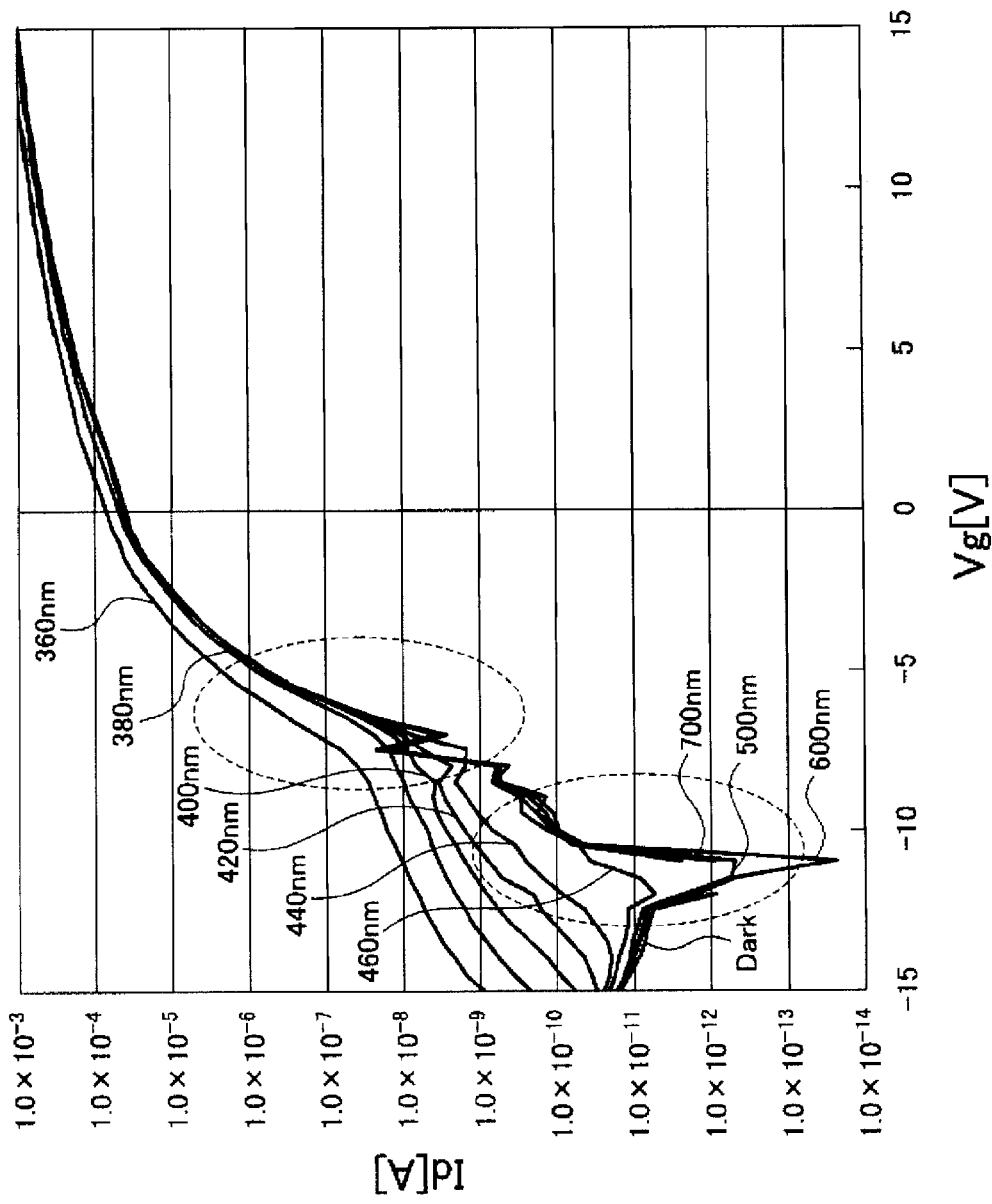
FIG. 22 is a diagram showing the Vg-Id characteristic under light illumination for a TFT of Example 10, showing representative Vg-Id characteristics among measurement results.
Figure 23:
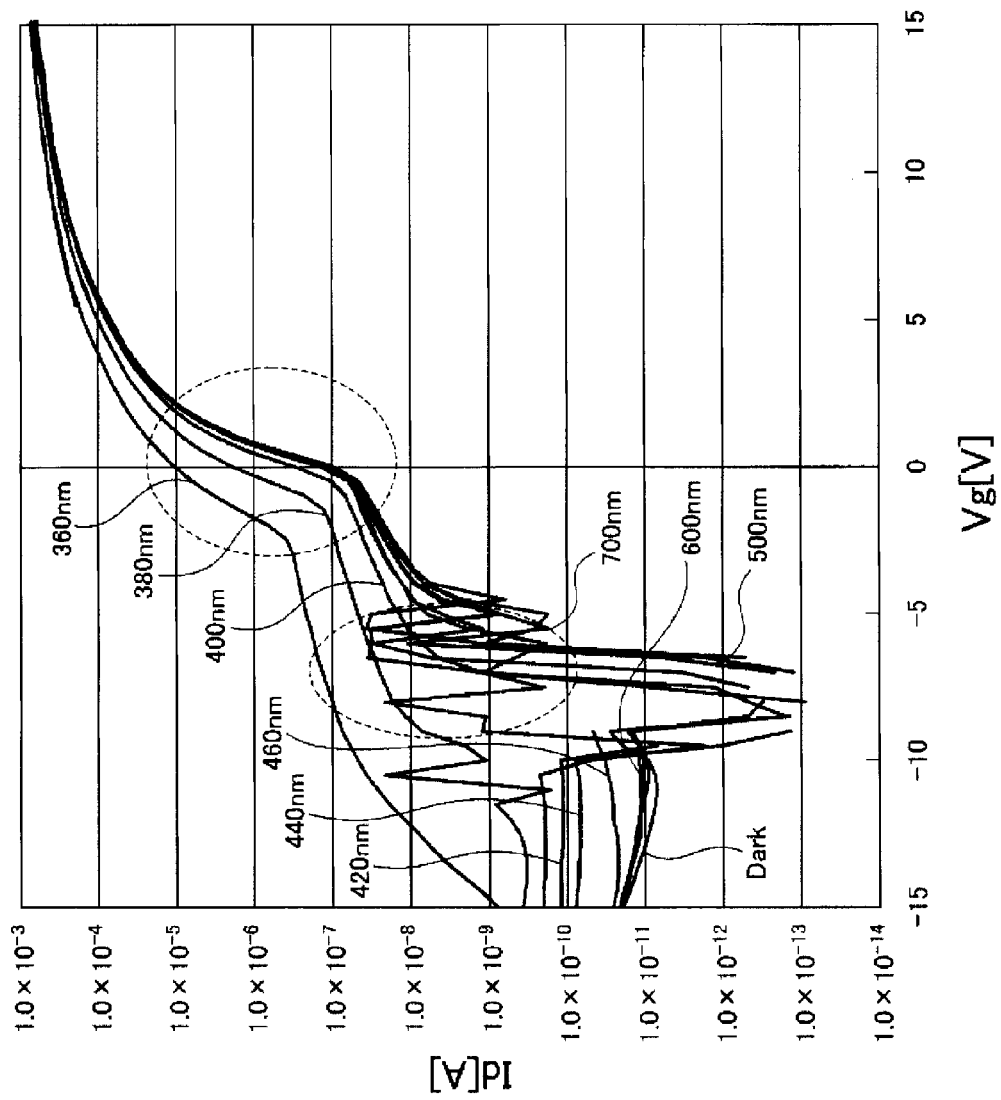
FIG. 23 is a diagram showing the Vg-Id characteristic under light illumination for a TFT of Example 11, showing representative Vg-Id characteristics among measurement results.
Figure 24:
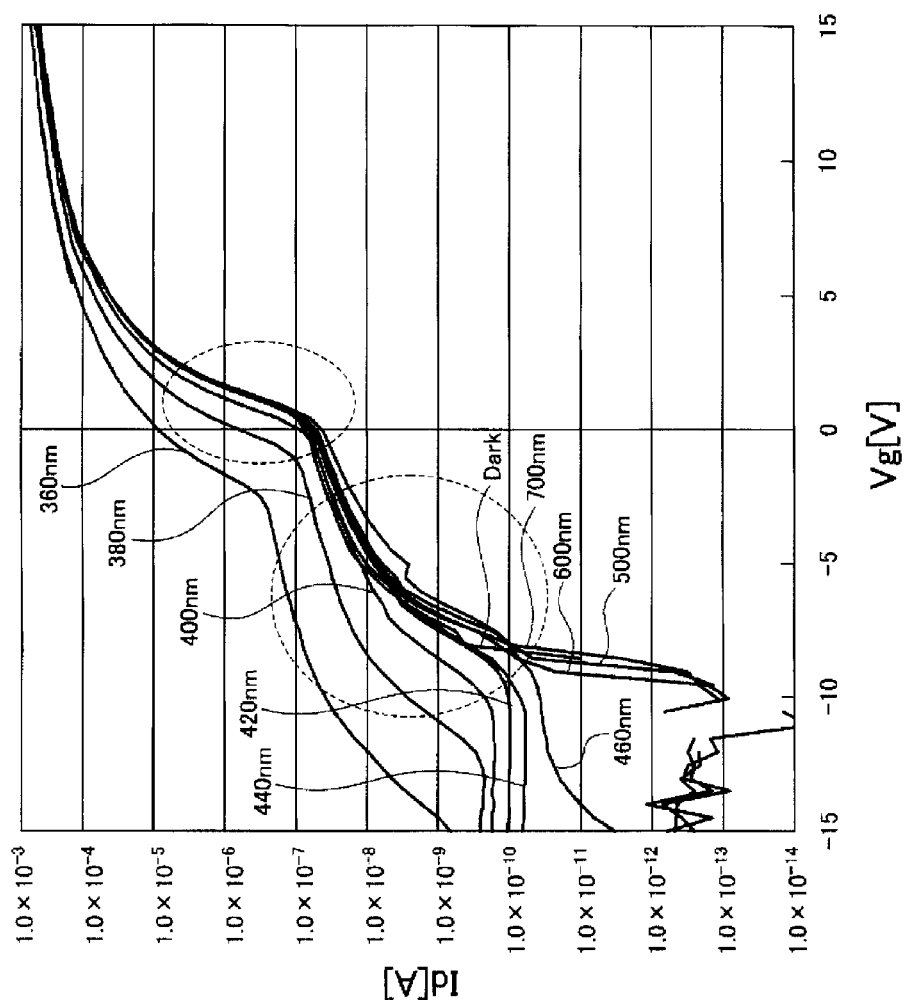
FIG. 24 is a diagram showing the Vg-Id characteristic under light illumination for a TFT of Example 12, showing representative Vg-Id characteristics among measurement results.
Figure 25:
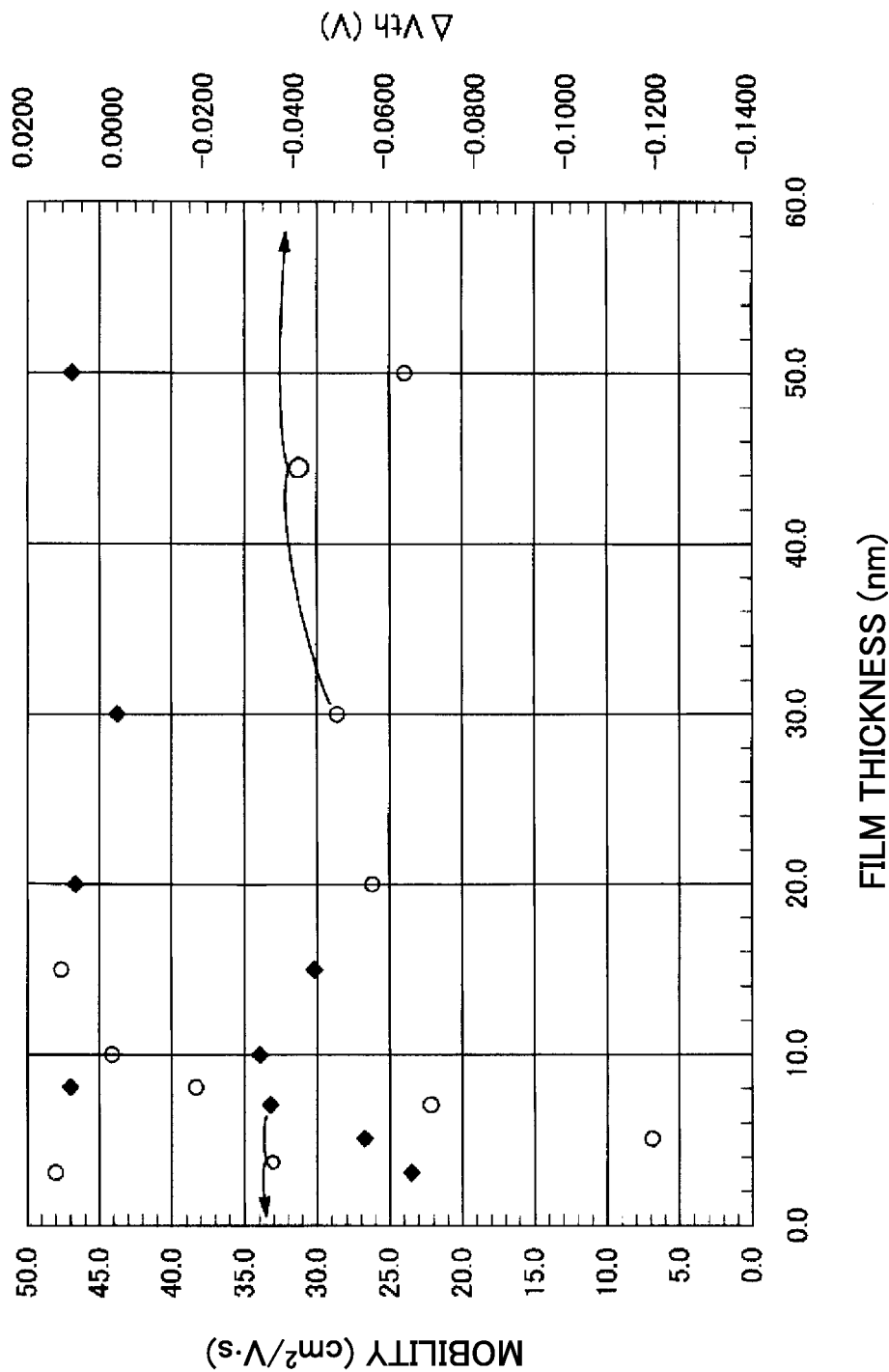
FIG. 25 is a diagram showing a relationship between a thickness Z of a second oxide semiconductor film and a field effect mobility μ and a relationship between the thickness Z and ΔVth, based on results shown in Table 3.

FIG. 20 is a diagram showing the Vg-Id characteristic under light illumination for the TFT of Example 7, showing representative Vg-Id characteristics among the measurement results. FIG. 21 is a diagram showing the Vg-Id characteristic under light illumination for the TFT of Example 9, showing representative Vg-Id characteristics among the measurement results. FIG. 22 is a diagram showing the Vg-Id characteristic under light illumination for the TFT of Example 10, showing representative Vg-Id characteristics among the measurement results. FIG. 23 is a diagram showing the Vg-Id characteristic under light illumination for the TFT of Example 11, showing representative Vg-Id characteristics among the measurement results. FIG. 24 is a diagram showing the Vg-Id characteristic under light illumination for the TFT of Example 12, showing representative Vg-Id characteristics among the measurement results. FIG. 25 is a diagram showing the relationship between the thickness Z of the second oxide semiconductor film 507 and the field effect mobility μ and the relationship between the thickness Z and ΔVth, based on the results shown in Table 3.

From the results shown in Table 3 and FIG. 20 to FIG. 25, it can be seen that in the TFTs of Examples 4 to 14, ΔVth during light illumination was greatly improved compared to Comparative Example 1, being not more than around a tenth of the value in Comparative Example 1

It can also be seen that initial characteristics such as the field effect mobility μ and Vth, and light illumination characteristics such as ΔVth and the like are all changed by adjustments of the thickness Z of the second oxide semiconductor film 507.

Comparing the diagrams from FIG. 20 to FIG. 24, in contrast to FIG. 20 and FIG. 21, a two-stage rise could be verified in FIG. 22 to FIG. 24 (the regions circled in the drawings). Specifically, a two-stage rise could be verified when the thickness Z of the second oxide semiconductor film 507 was equal to or greater than the oxygen diffusion depth L of 18 nm with the heat treatment temperature of 450° C., which is to say, when the heat temperature T and the thickness Z satisfied the relational expression $Z \geq L = 8 \times 10^{-6} \times T^3 - 0.0092 \times T^2 + 3.6 \times T - 468 \pm 0.1$.

This seems to mean that defects at the boundary face between the first oxide semiconductor film 506 and the second oxide semiconductor film 507 are not being repaired, the boundary face between the first oxide semiconductor film 506 and the second oxide semiconductor film 507 has a lower resistance, and the channel is staying open even in a state in which no gate bias is applied. The holes from electron-hole pairs induced during light illumination are being trapped at the boundary face defects, parallel conduction channel carriers are increasing in the vicinity of the boundary face, and a portion of a single stage rise (that defines the threshold value) is being negatively shifted by a large amount. If the threshold value were calculated from a rise in the main channel as in the related art, because there is no effect from hole-trapping in the vicinity of the main channel (in the gate insulation film (the thermal oxide film 504) and/or the first oxide semiconductor film 506), it is likely that the threshold value would appear to improve.

Figure 26:
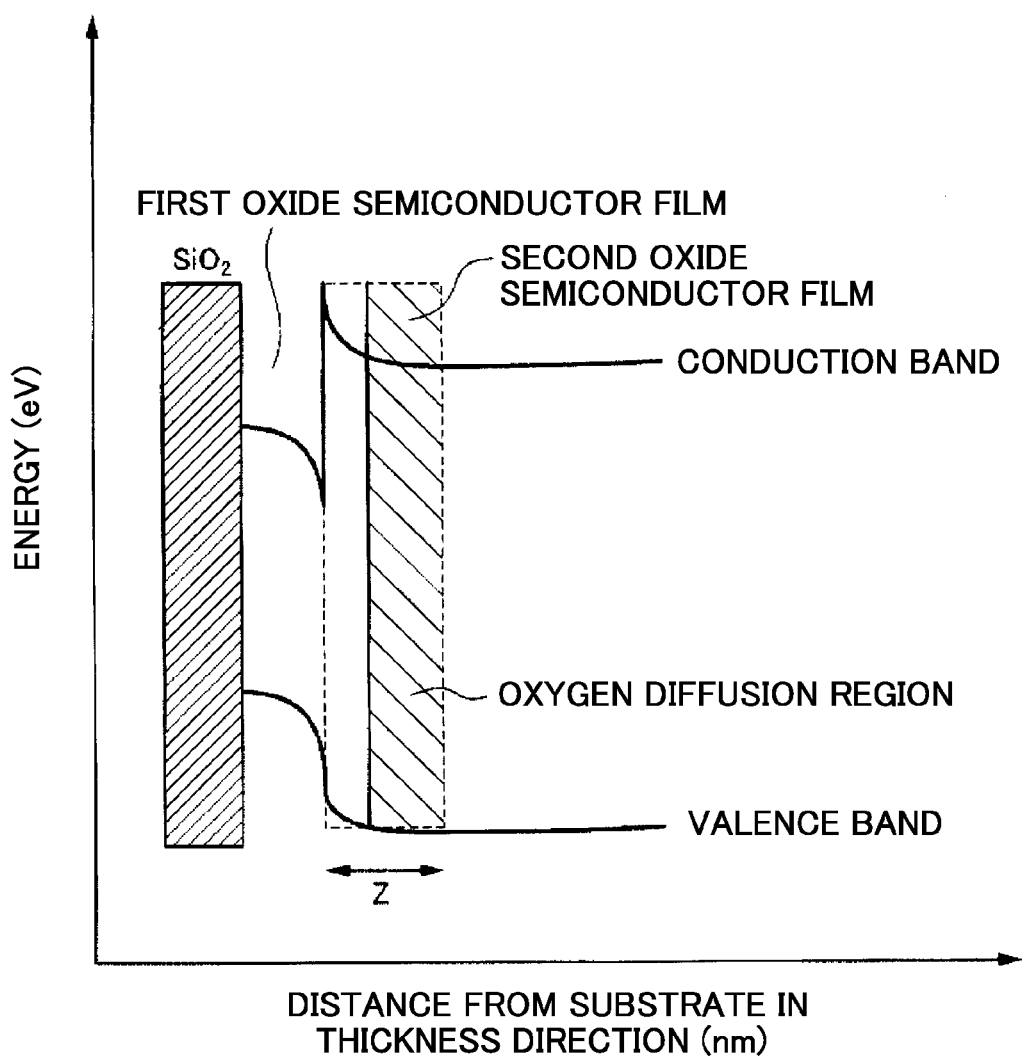
FIG. 26 is a conceptual diagram describing characteristic deterioration when Z≥L.

FIG. 26 is a conceptual diagram describing characteristic deterioration when Z≥L.

As a repeated description of the characteristic deterioration, while referring to FIG. 26, when Z≥L, the boundary face between a high mobility layer and a high resistance layer tends to fall in resistance. As a result, a parallel channel is more likely to occur in the vicinity of the boundary face (which corresponds to the first stage of the rise in the Vg-Id data). Secondly, because oxygen defects are not sufficiently repaired, holes are trapped at the boundary face during light illumination, as a result of which electrons collect at the boundary face. Consequently, the current is seen to increase in the region of the first stage rise. At the second stage (the main channel), this effect does not apply and consequently it seems that the threshold value shows an improvement.

However, the TFTs of Examples 10 to 12 that exhibit this two-stage rise, while possibly better than Comparative Example 1, are unsuitable for practical use, and the TFTs of Examples 4 to 9 are preferable. In other words, it is preferable to adjust the thickness of the second oxide semiconductor film 507 and the heat treatment temperature in the third step so as to satisfy the relational expression $0<Z<L=8\times10^{-6}\times T^3 - 0.0092\times T^2 + 3.6\times T - 468\pm 0.1$. Thus, by the heat treatment of the third step being applied subject to the adjustment of the thickness Z of the second oxide semiconductor film 26 and the heat treatment temperature T, oxygen in the oxidizing atmosphere may be assuredly supplied through the second oxide semiconductor film 507 to inside the boundary face of the first oxide semiconductor film 506. Consequently, surface defects of the first oxide semiconductor film 506 that has been damaged by the film formation of the second step may be satisfactorily rectified, and the TFT characteristics during light illumination may be improved. This improvement in the TFT characteristics includes the fact that a two-stage rise may be prevented from appearing in the Vg-Id characteristic as described above.

From the results shown in Table 3 and FIG. 25, it can be seen that the threshold voltage Vth always had a positive value and initial characteristics were excellent when the thickness Z of the second oxide semiconductor film 507 was not more than 15 nm, which is to say, when the thickness of the second oxide semiconductor film 507 and the heat treatment temperature were adjusted during the second step and the third step so as to satisfy the relational expression Z≤L−3.0. Thus, it was found that, during the second step and the third step, it is preferable to adjust the thickness of the second oxide semiconductor film 507 and the heat treatment temperature such that the relational expression Z≤L−3.0 is satisfied.

On the other hand, referring to the trend shown in FIG. 25, it can be seen that when the thickness Z of the second oxide semiconductor film 507 was less than 3 nm, which is to say, when the thickness of the second oxide semiconductor film 507 and the heat treatment temperature were adjusted during the second step and the third step so as to satisfy the relational expression L−15.0>Z, oxygen diffused from the oxidizing atmosphere by the heat treatment of the third step passed through the second oxide semiconductor film 507 and strongly repaired oxygen defects in the whole of the first oxide semiconductor film 506, which was the conductive carrier path. In consequence, it can be seen that there was a risk of the field effect mobility decreasing to 20 cm²/Vs or less. Thus, it was found that, during the second step and the third step, it is preferable to adjust the thickness of the second oxide semiconductor film 507 and the heat treatment temperature such that the relational expression (L−15.0)≤Z is satisfied.

Furthermore, it can be seen from the results shown in Table 3 and FIG. 25 that when the thickness Z of the second oxide semiconductor film 507 was at least 7 nm, which is to say, when the thickness of the second oxide semiconductor film 507 and the heat treatment temperature were adjusted during the second step and the third step so as to satisfy the relational expression L−11.0≤Z, the mobility was over 30 cm²/Vs, which is excellent. This is likely to be because the amount of rectification of defects in the first oxide semiconductor film 506 that was the conductive carrier path was appropriate, rectification of defects at the boundary face was satisfactory, and the carrier density in the first oxide semiconductor film 506 barely decreased. Thus, it was found that, during the second step and the third step, it is preferable to adjust the thickness of the second oxide semiconductor film 507 and the heat treatment temperature such that the relational expression L−11.0≤Z is satisfied.

Further yet, it can be seen from the results shown in FIG. 25 that when the thickness Z of the second oxide semiconductor film 507 was at least 7 nm and at most 10 nm, which is to say, when the thickness of the second oxide semiconductor film 507 and the heat treatment temperature were adjusted during the second step and the third step so as to satisfy the relational expression L−11.0≤Z≤L−8.0, the field effect mobility μ rose dramatically. Thus, it was found that, during the second step and the third step, it is preferable to adjust the thickness of the second oxide semiconductor film 507 and the heat treatment temperature such that the relational expression L−11.0≤Z≤8.0 is satisfied.

<Dependency on the Heat Treatment Temperature of the Fifth Step>

How the TFT characteristics and light illumination stability changed in accordance with the heat treatment temperature of the fifth step was verified.

Examples 13 to 15

As TFTs relating to Examples 13 to 15, TFTs were fabricated using the same TFT structure, composition and fabrication process as Example 7 (Z=8 nm), apart from the fabrication conditions mentioned below, with the heat treatment temperature of the fifth step being altered to 360° C. (Example 13), 415° C. (Example 14) and 450° C. (Example 15).

In the third step, the heat treatment was applied at a temperature of 450° C. in an atmosphere with an oxygen partial pressure of 100%. The fifth step also used an atmosphere with an oxygen partial pressure of 100%.

—Evaluation—

The TFT characteristics and light illumination stability of the TFTs relating to Examples 13 to 15 were evaluated. The evaluation method was the same as the method described above (Example 15 being equivalent to Example 7).

Table 4 summarizes the heat treatment temperatures of the fifth step, the TFT characteristics and the light illumination stabilities.

Examples 16 to 31

First, bottom gate, top contact-type TFTs with the same film thickness conditions as in Example 7 were fabricated to serve as Examples 16 to 31 (Example 16 being equivalent to Example 7). Fabrication conditions of Examples 16 to 24, which were cases in which the IGZO compositions of the first oxide semiconductor film 506 were modulated, are shown in Table 5, and fabrication conditions of Examples 25 to 31, which were cases in which IZO compositions of the first oxide semiconductor film 506 were modulated, are shown in Table 6.

In this case, the second oxide semiconductor film 507 and third oxide semiconductor film 508 had the same composition as one another, corresponding to the same composition as in Example 7. Apart from the conditions in Table 5 and Table 6 below, other fabrication processes and conditions were the same as in Example 7.

TABLE 5

| | Target input power (W) | | | Cation composition | | | | | |
|---|---|---|---|---|---|---|---|---|---|
| | $In_2O_3$ | $Ga_2O_3$ | ZnO | a | | b | | c | |
| Example 16 | 47.3 | 23.1 | 14.0 | 37/60 | 0.617 | 3/60 | 0.05 | 20/60 | 0.333 |
| Example 17 | 47.3 | 23.1 | 28.0 | 37/80 | 0.462 | 3/80 | 0.038 | 40/80 | 0.500 |
| Example 18 | 47.3 | 23.1 | 32.0 | 37/100 | 0.37 | 3/100 | 0.03 | 60/100 | 0.60 |
| Example 19 | 47.3 | 44.8 | 10.0 | 6/10 | 0.60 | 2/10 | 0.20 | 2/10 | 0.20 |
| Example 20 | 48.0 | 63.4 | 5.0 | 37/60 | 0.617 | 20/60 | 0.333 | 3/60 | 0.05 |
| Example 21 | 55.3 | 44.8 | 6.0 | 7/10 | 0.70 | 2/10 | 0.20 | 1/10 | 0.10 |
| Example 22 | 47.3 | 23.1 | 18.5 | 37/70 | 0.529 | 3/70 | 0.043 | 30/70 | 0.428 |
| Example 23 | 43.8 | 30.5 | 16.0 | 5/10 | 0.50 | 1/10 | 0.10 | 4/10 | 0.40 |
| Example 24 | 50.8 | 29.8 | 8.5 | 7/10 | 0.70 | 1/10 | 0.10 | 2/10 | 0.20 |

TABLE 4

| | Heat treatment temperature in the fifth step | Field effect mobility ($cm^2/Vs$) | Vth (V) | ΔVth (V) (illumination with 420 nm light) |
|---|---|---|---|---|
| Example 13 | 360° C. | 50.1 | −0.45 | −0.83 |
| Example 14 | 415° C. | 54.0 | −0.49 | −0.021 |
| Example 15 | 450° C. | 46.9 | 2.21 | −0.018 |

From the results shown in Table 4, it can be seen that each of the TFTs relating to Examples 13 to 15 achieves both a high field effect mobility and light illumination stability. Among these, from a comparison of Example 13 with Example 14, it can be seen that a heat treatment temperature of 415° C. or more improves the light illumination stability by at least one decimal place (ΔVth is reduced by an order of magnitude) compared to a case in which the heat treatment temperature in the fifth step is 360° C. Thus, it was found that it is preferable for the heat treatment temperature of the fifth step to be at least 415° C.

<Dependency of TFT Initial Characteristics on the Composition of the First Oxide Semiconductor Film 506>

Next, by layering oxide semiconductor films with particular compositions in the oxide semiconductor layer of the TFT, the fabrication of TFTs with structures as described below that can provide high-mobility transistors was investigated. The composition of the first oxide semiconductor film 506 was modulated and the provision of high mobility within a particular range of compositions was verified.

TABLE 6

| | Target input power (W) | | In content | In:Zn |
|---|---|---|---|---|
| | $In_2O_3$ | ZnO | proportion x | composition |
| Example 25 | 55.3 | 32.5 | 0.40 | 2:3 |
| Example 26 | 55.3 | 26.5 | 0.50 | 1:1 |
| Example 27 | 55.3 | 18.0 | 0.60 | 3:2 |
| Example 28 | 55.3 | 15.0 | 0.67 | 2:1 |
| Example 29 | 55.3 | 11.0 | 0.75 | 3:1 |
| Example 30 | 55.3 | 8.0 | 0.83 | 5:1 |
| Example 31 | 55.3 | 45.0 | 0.33 | 1:2 |

—Evaluation—

For the fabricated TFTs relating to Examples 16 to 31, the transistor characteristics (the Vg-Id characteristic), mobility μ and off current Ioff were measured using the semiconductor parameter analyzer 4156C (AGILENT TECHNOLOGIES). The off current was defined as a current value at which Vg=0 V in the Vg-Id characteristic. Other definitions, measurement methods and the like were the same as in the methods described above.

Table 7 summarizes the field effect mobility and off current results for the TFTs relating to Examples 16 to 24. Table 8 summarizes the field effect mobility and off current results for the TFTs relating to Examples 25 to 31.

TABLE 7

| | Cation composition | | | | | | μ (cm²/Vs) | Ioff (A) | Vth (V) |
|---|---|---|---|---|---|---|---|---|---|
| | a | | b | | c | | | | |
| Example 16 | 37/60 | 0.617 | 3/60 | 0.05 | 20/60 | 0.333 | 46.9 | $2.1 \times 10^{-7}$ | 2.21 |
| Example 17 | 37/80 | 0.462 | 3/80 | 0.038 | 40/80 | 0.500 | 33.3 | $1.7 \times 10^{-11}$ | 3.63 |
| Example 18 | 37/100 | 0.37 | 3/100 | 0.03 | 60/100 | 0.60 | 31.6 | $1.5 \times 10^{-10}$ | 4.62 |
| Example 19 | 6/10 | 0.60 | 2/10 | 0.20 | 2/10 | 0.20 | 31.5 | $3.8 \times 10^{-8}$ | 4.15 |
| Example 20 | 37/60 | 0.617 | 20/60 | 0.333 | 3/60 | 0.05 | 22.3 | $2.7 \times 10^{-10}$ | 5.71 |
| Example 21 | 7/10 | 0.70 | 2/10 | 0.20 | 1/10 | 0.10 | 35.1 | $6.1 \times 10^{-7}$ | 0.64 |
| Example 22 | 37/70 | 0.529 | 3/70 | 0.043 | 30/70 | 0.428 | 32.3 | $2.4 \times 10^{-10}$ | 3.23 |
| Example 23 | 5/10 | 0.50 | 1/10 | 0.10 | 4/10 | 0.40 | 32.9 | $6.8 \times 10^{-10}$ | 3.33 |
| Example 24 | 7/10 | 0.70 | 1/10 | 0.10 | 2/10 | 0.20 | 51.2 | $5.4 \times 10^{-4}$ | -2.65 |

TABLE 8

| | In content proportion x | In:Zn composition | μ (cm²/Vs) | Ioff (A) | Vth (V) |
|---|---|---|---|---|---|
| Example 25 | 0.40 | 2:3 | 30.2 | $8.7 \times 10^{-11}$ | 4.85 |
| Example 26 | 0.50 | 1:1 | 38.5 | $5.6 \times 10^{-10}$ | 4.23 |
| Example 27 | 0.60 | 3:2 | 41.3 | $7.8 \times 10^{-8}$ | 1.56 |
| Example 28 | 0.67 | 2:1 | 39.8 | $6.5 \times 10^{-7}$ | 1.41 |
| Example 29 | 0.75 | 3:1 | 45.1 | $3.3 \times 10^{-7}$ | 0.51 |
| Example 30 | 0.83 | 5:1 | 48.0 | $6.1 \times 10^{-4}$ | -3.12 |
| Example 31 | 0.33 | 1:2 | 0.51 | $5.3 \times 10^{-12}$ | 15.6 |

From the results shown in Table 7, it can be seen that the TFTs relating to Examples 16 to 24 were excellent with field effect mobilities of at least 20 cm²/Vs. It can also be seen that TFTs could be fabricated with a field effect mobility of at least 20 cm²/Vs and Vth greater than zero when the composition of the first oxide semiconductor film 506 was within the range represented by {c≤3/5, b≥0, b≥3a/7−3/14, b≥9a/5−53/50, b≤−8a/5+33/25, b≤91a/74−17/40} (in which a+b+c=1) (a range bounded by the compositions of Example 7 (i.e., Example 16 in Table 7) and Examples 21, 20, 18, 25 and 26). This range of compositions corresponds to the range marked "A" in FIG. 18.

Figure 27:
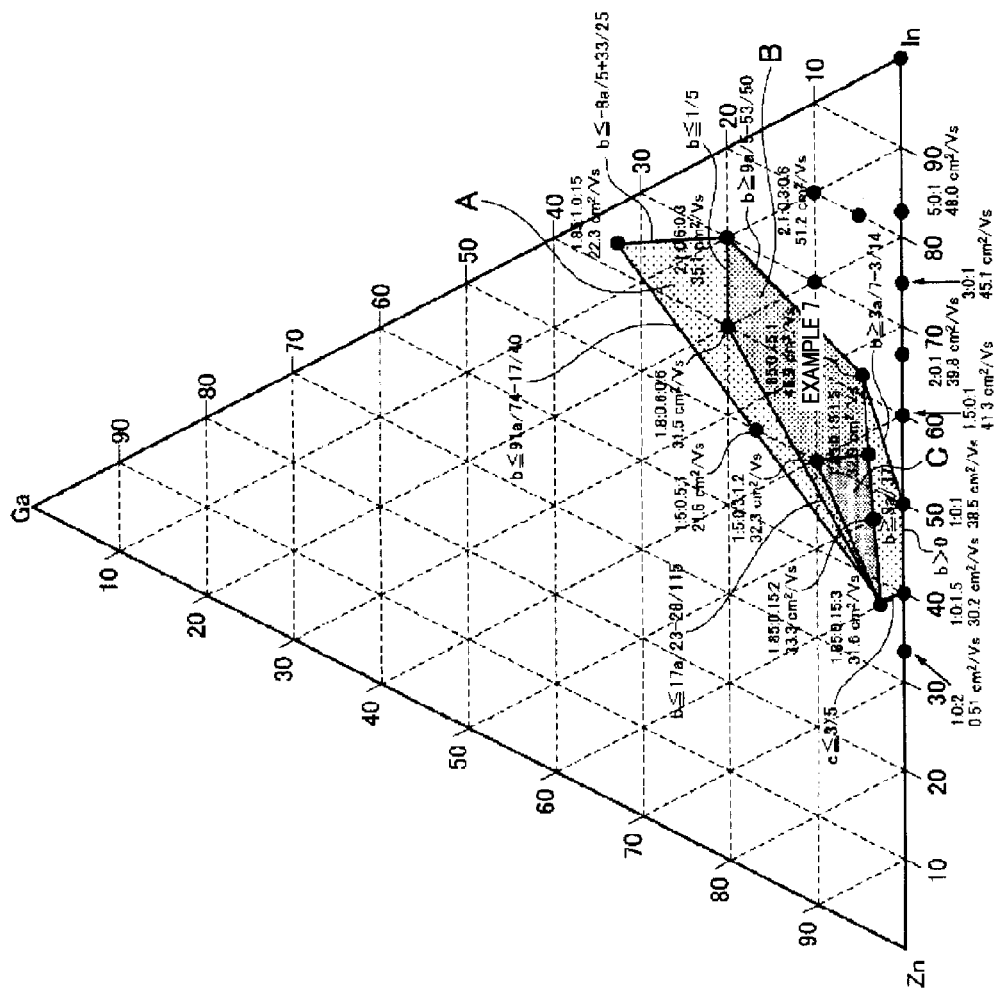
FIG. 27 is a three-axis phase diagram of indium, gallium and zinc, in which particular ranges of compositions are specified.

It can also be seen that TFTs could be fabricated with a field effect mobility of at least 30 cm²/Vs when the composition of the first oxide semiconductor film 506 was within the range represented by {b≤17a/23−28/115, b≥3a/37, b≥9a/5−53/50, b≤1/5} (in which a+b+c=1) (a range bounded by the compositions of Example 7 (i.e., Example 16 in Table 7) and Examples 21, 19 and 18). This range of compositions corresponds to the range marked "B" in FIG. 27.

Although a high field effect mobility was obtained in each of Examples 22, 23 and 24 in which the indium content proportion was increased, the carrier density became excessive and the threshold value was greatly shifted to the negative side.

Figure 28:
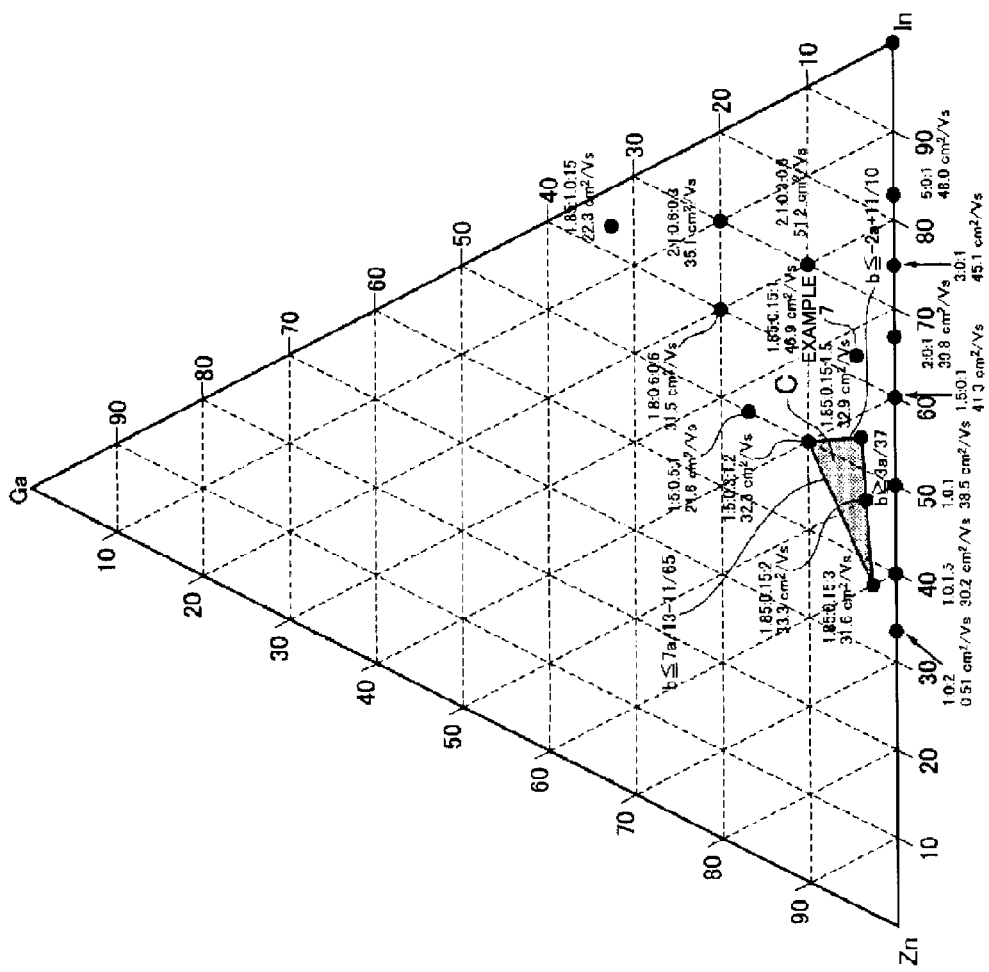
FIG. 28 is a three-axis phase diagram of indium, gallium and zinc, in which a particular range of compositions is specified.

In addition, it can be seen that normally-off TFTs could be fabricated with a field effect mobility of at least 30 cm²/Vs when the composition of the first oxide semiconductor film 506 was within the range represented by {b≤7a/13−11/65, b≥3a/37, b≤−2a+11/10} (in which a+b+c=1). This range of compositions corresponds to the range marked "C" in FIG. 28.

From the results shown in Table 8, it can be seen that the TFTs relating to Examples 25 to 30 were excellent with field effect mobilities of at least 20 cm²/Vs.

It can also be that TFTs could be fabricated with a field effect mobility of at least 30 cm²/Vs and Vth greater than zero when, in these cases in which IZO was used in the first oxide semiconductor film 506, the indium content proportion x was within the range represented by 0.40≤x≤0.75 (a range bounded by the compositions of Examples 25 to 29).

It can also be seen that normally-off TFTs could be fabricated with a field effect mobility of at least 30 cm²/Vs when the indium content proportion was within the range represented by 0.40≤x≤0.50.

Thus, by modulating the (IGZO or IZO) composition of the first oxide semiconductor film 506 in the layered TFT structure in a case in which the cation compositions of the second oxide semiconductor film 507 and the third oxide semiconductor film 508 were fixed as described above, it was found that high mobility TFT characteristics are obtained within a particular range of compositions.

<Dependency of TFT Characteristics on the Compositions of the Second Oxide Semiconductor Film 507 and the Third Oxide Semiconductor Film 508>

Next, it was investigated whether excellent characteristics can be obtained in a particular range of compositions in the same structure as in the TFT of Example 16, by modulating the compositions of the second oxide semiconductor film 507 and the third oxide semiconductor film 508 with the composition of the first oxide semiconductor film 506 being fixed at the same composition as in Example 16.

Examples 32 to 37

Bottom gate, top contact-type TFTs similar to Example 7 were fabricated to serve as TFTs relating to Examples 32 to 37 (Example 32 being equivalent to Example 7). These TFTs correspond with the structure of the fabrication method of Example 7, in which the second oxide semiconductor film 507 and the third oxide semiconductor film 508 have the same composition as one another. Film formation conditions of the first oxide semiconductor film 506 were all the same as in Example 7. Film formation conditions of the second oxide semiconductor film 507 (Z=8 nm) and the third oxide semiconductor film 508 were the same as one another, with the attained vacuum, film formation pressure, film formation temperature and oxygen/argon partial pressure being, respectively, $6 \times 10^{-6}$ Pa, $4.4 \times 10^{-6}$ Pa, room temperature and an oxygen/argon partial pressure of 0.067. The cation compositions were modulated as shown in Table 9 below. The second oxide semiconductor film 507 and third oxide semiconductor film 508 were oxide semiconductor films in which indium is represented by e, gallium is represented by f, zinc is represented by g and oxygen is represented by h, and (e, f, g, h>0).

TABLE 9

| | Target input power (W) | | | f/(e + f) | In:Ga:Zn |
|---|---|---|---|---|---|
| | $In_2O_3$ | $Ga_2O_3$ | ZnO | | |
| Example 32 | 19.3 | 70.0 | 14.5 | 0.75 | 0.5:1.5:1 |
| Example 33 | 37.5 | 52.5 | 13.5 | 0.375 | 1.25:0.75:1 |
| Example 34 | 31.5 | 63.4 | 15.5 | 0.50 | 1:1:1 |
| Example 35 | 13.3 | 70.0 | 14.0 | 0.875 | 0.25:1.75:1 |
| Example 36 | 0 | 66.5 | 11.0 | 1.00 | 0:2:1 |
| Example 37 | 43.4 | 41.7 | 14.5 | 0.25 | 1.5:0.5:1 |

—Evaluation—

For the fabricated TFTs relating to Examples 32 to 37, the transistor characteristics (the Vg-Id characteristic), mobility μ and threshold voltage Vth were measured using the semiconductor parameter analyzer 4156C (AGILENT TECHNOLOGIES). Definitions, measurement methods and the like were the same as in the methods described above.

Table 10 summarizes the field effect mobility and threshold voltage results for the TFTs relating to Examples 32 to 37.

TABLE 10

| | f/(e + f) | In:Ga:Zn | μ ($cm^2$/Vs) | Vth (V) |
|---|---|---|---|---|
| Example 32 | 0.75 | 0.5:1.5:1 | 46.9 | 2.21 |
| Example 33 | 0.375 | 1.25:0.75:1 | 41.2 | 2.32 |
| Example 34 | 0.50 | 1:1:1 | 45.8 | 0.84 |
| Example 35 | 0.875 | 0.25:1.75:1 | 40.7 | 1.02 |
| Example 36 | 1.00 | 0:2:1 | <1 | >0 |
| Example 37 | 0.25 | 1.5:0.5:1 | 48.2 | −10.4 |

It can be seen from Table 10 that TFT driving was difficult in cases in which f/(e+f) was greater than 0.875. This is likely to be because the contact resistances between the source and drain electrodes 510 and 512 and the second oxide semiconductor film 507 and third oxide semiconductor film 508 increased (note, however, that TFTs that can be driven may be fabricated by adjusting to reduce the oxygen partial pressure during film formation). Thus, it was found that in a case in which the composition of the first oxide semiconductor film 506 is constant, it is preferable for f/(e+f) in the second oxide semiconductor film 507 and the third oxide semiconductor film 508 to be not more than 0.875.

On the other hand, it can be seen that when f/(e+f) was reduced, the threshold value shifted greatly to the negative side, to −21.4 V when f/(e+f) was 0.250 as in Example 36, and the transistor tends to have a lower resistance. This is likely to be because the fundamental carrier density in the second oxide semiconductor film 507 is relatively high and the electron affinity is relatively large, and consequently larger numbers of carriers flow from the first oxide semiconductor film 506 to the second oxide semiconductor film 507 and third oxide semiconductor film 508 or conductive carriers are generated in the second oxide semiconductor film 507 and third oxide semiconductor film 508. In this kind of transistor with Vth<0, the off current tends to be larger. Thus, it was found that, to fabricate a transistor with a high mobility and a low off current (in a case in which the heat treatment temperature is 300° C.), it is preferable if f/(e+f) is greater than 0.250.

Thus, it can be seen that in a case in which the composition of the first oxide semiconductor film 506 is fixed, it is desirable if the compositions of the second oxide semiconductor film 507 and the third oxide semiconductor film 508 are represented with indium as e, gallium as f, zinc as g and oxygen as h, and (e, f, g, h>0), and a transistor with a high mobility and a low off current may be fabricated if the second oxide semiconductor film 507 is in a range of compositions represented by 0.250<f/(e+f)≤0.875.

<Dependency of TFT Characteristics on the Total Thickness of the Second Oxide Semiconductor Film 507 and Third Oxide Semiconductor Film 508>

Next, it was investigated how the total thickness of the second oxide semiconductor film 507 and the third oxide semiconductor film 508 affects the TFT characteristics.

Examples 38 to 41 and Evaluation

Bottom gate, top contact-type TFTs similar to that of Example 7 were fabricated to serve as TFTs relating to Examples 38 to 41. These TFTs correspond with the structure of Example 7 in which the second oxide semiconductor film 507 and the third oxide semiconductor film 508 have the same composition as one another. The TFT structures and the compositions of the first oxide semiconductor film 506 and the second oxide semiconductor film 507 (which was the same as the third oxide semiconductor film 508) were the same as in Example 7, and the transistors were fabricated with only the sum of the thicknesses of the second oxide semiconductor film 507 and third oxide semiconductor film 508 (hereinafter referred to simply as the "total thickness") being altered, to 10 nm, 30 nm, 50 nm and 70 nm.

Table 11 summarizes the structures and TFT characteristics of the TFTs relating to Examples 38 to 41.

TABLE 11

| | Total thickness (nm) | Composition f/(e + f) | μ ($cm^2$/Vs) | S-value (V/decade) |
|---|---|---|---|---|
| Example 38 | 30 | 0.75 | 43.5 | 0.34 |
| Example 39 | 50 | 0.75 | 46.9 | 0.27 |
| Example 40 | 70 | 0.75 | 31.8 | 0.22 |
| Example 41 | 10 | 0.75 | 52.5 | 1.45 |

Thus, it can be seen that, although the mobility was higher when the total thickness of the second oxide semiconductor film 507 and third oxide semiconductor film 508 was 10 nm or less, the S-value tended to deteriorate (more than 1 V/decade), and the off current tended to increase. On the other hand, when the total thickness was 30 nm or more, the S-value was excellent (no more than 1 V/decade) and a reduction in the off current may be expected. Thus, it was found that a total thickness of more than 10 nm is preferable, and 30 nm or more is even more preferable. It was also found that when the total thickness is 70 nm or more, a slight fall in the mobility is apparent, and therefore it is preferable if the total thickness is less than 70 nm.

<Dependency of TFT Characteristics on the Thickness of the First Oxide Semiconductor Film 506>

Next, the dependency of the TFT characteristics on the thickness of the first oxide semiconductor film 506 was investigated.

Examples 42 to 43

A TFT with the same structure and composition as in Example 7 with only the thickness of the first oxide semiconductor film 506 being altered, to 10 nm, was fabricated to serve as a TFT relating to example 43.

—Evaluation—

For the fabricated TFTs relating to Example 42 (which was the same as in Example 7) and Example 43, the transistor characteristics (the Vg-Id characteristic), mobility μ, threshold voltage Vth and off current Ioff were measured using the semiconductor parameter analyzer 4156C (AGILENT TECHNOLOGIES). Definitions, measurement methods and the like were the same as in the methods described above.

Table 12 summarizes the characteristics of Example 42 and Example 43 for comparison. The term "first film" in the table refers to the first oxide semiconductor film 506.

TABLE 12

| | Thickness of first film (nm) | μ (cm²/Vs) | Vth (V) | Ioff (A) |
|---|---|---|---|---|
| Example 42 | 5 | 46.9 | 2.21 | $2.1 \times 10^{-7}$ |
| Example 43 | 10 | 48.8 | −3.05 | $4.8 \times 10^{-5}$ |

From Table 12, it can be seen that when the thickness of the first oxide semiconductor film 506 was at least 10 nm, the field effect mobility could be satisfactorily assured but the threshold value shifted to the negative side and the off current increased greatly. This is because an oxide semiconductor with a high carrier density was used for the first oxide semiconductor film 506 and consequently, when the thickness of the first oxide semiconductor film 506 was increased, the total carrier density increased and pinch-off became difficult. Thus, it was found that it is desirable if the thickness of the first oxide semiconductor film 506 is less than 10 nm.

As described hereabove, it can be seen that a TFT with a high mobility for a particular constitution and thickness may be formed by adjusting the constitutions and thicknesses of a layered structure of an oxide semiconductor layer (the first oxide semiconductor film 506, the second oxide semiconductor film 507 and the third oxide semiconductor film 508).

<Heat Treatment Temperatures in the Third Step and the Fifth Step (2)>

STEM images of layer thickness sections in which five layers were layered, of IGZO films in which Ga/(In +Ga)= 0.75 and IGZO films in which Ga/(In +Ga)=0.25, were respectively inspected directly after the layering (before annealing) and after annealing with a heat treatment temperature of 600° C. It could be verified from the respective observations that the layer structure was maintained to some extent even after the heat treatment at 600° C. However, a state in which the contrasts between the different cation compositions at the boundary faces were dulled was perceived. This suggests that mutual interdiffusion of the different phases had started to occur. Thus, it was found that it is preferable if maximum temperatures of the heat treatment temperatures in the third step and the fifth step are not more than 600° C.

<Investigation of the Applicability of the Relational Expression to Other Materials>

Next, the above statement "From the results described above, if the case in which, for example, the heat treatment temperature is 400° C. is taken as an example, then as shown in FIG. 19, it can be seen that the O18 from the oxidizing atmosphere diffused (embedded) to about 12 nm into the gallium oxide film. This result provides a confirmation that the oxygen diffusion distance L does not change between a gallium oxide film and a film of another material such as an IGZO film or the like." was investigated. That is, simply applying the above relational expression based on FIG. 28, $L=8\times10^{-6}\times T^3-0.0092\times T^2+3.6\times T-468\pm0.1$, when the second oxide semiconductor film is not gallium oxide but another material such as, for example, a metal oxide, was investigated.

Figure 29:
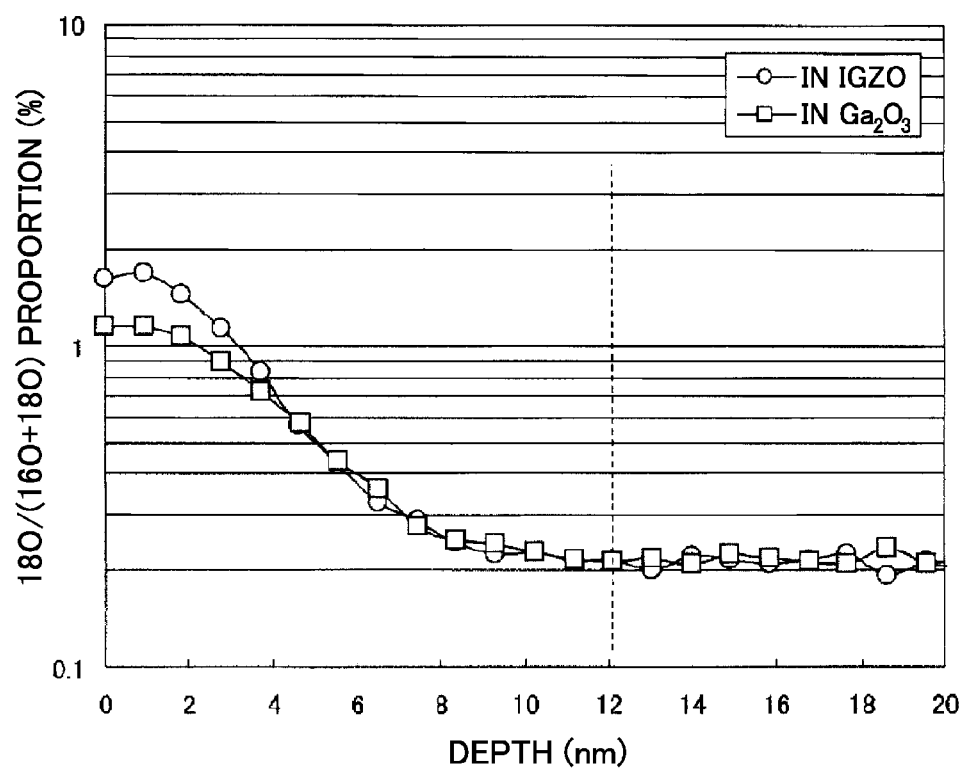
FIG. 29 is a diagram showing SIMS analysis results for a sample of an Experimental Example 3 including a gallium oxide film at an uppermost surface and SIMS analysis results of a sample including an IGZO film (In:Ga:Zn=1:0.9:0.7) at an uppermost surface.

FIG. 29 is a diagram showing SIMS analysis results for the sample of Experimental Example 3 that included a gallium oxide film at an uppermost surface and SIMS analysis results of a sample that included an IGZO film (In:Ga:Zn=1:0.9:0.7) at an uppermost surface. This IGZO film was fabricated by the same method as in Example 1.

Figure 30:
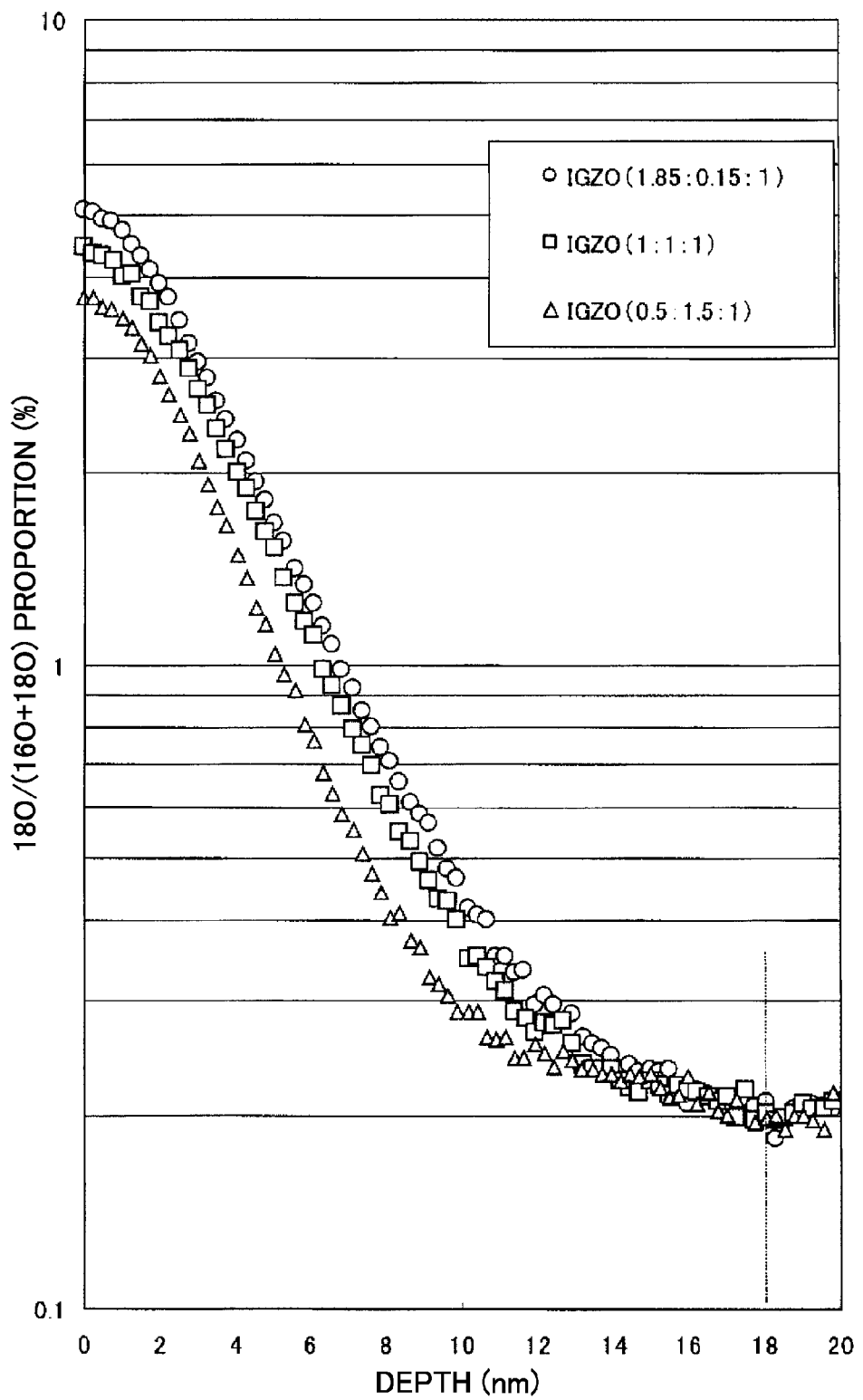
FIG. 30 is a diagram showing respective SIMS analysis results for three samples in which IGZO films are heat-treated under the same conditions as in an Experimental Example 4, in which the composition ratios of indium, gallium and zinc are In:Ga:Zn=1.85:0.15:1, In:Ga:Zn=1:1:1 and In:Ga:Zn=0.5:1.5:1.

FIG. 30 is a diagram showing respective SIMS analysis results for three samples in which IGZO films were heat-treated under the same conditions as in Experimental Example 4, in which the composition ratios of indium, gallium and zinc are In:Ga:Zn=1.85:0.15:1, In:Ga:Zn=1:1:1 and In:Ga:Zn=0.5:1.5:1.

The SIMS analyses of the samples relating to FIG. 29 and FIG. 30 were carried out using the same method as the SIMS analyses described above.

From the SIMS analysis results shown in FIG. 29, it can be seen that, although the proportion 18O/(16O+18O) differed between the experimental data relating to gallium oxide and the experimental data relating to IGZO, the distance from the surface at which the proportion 18O/(16O+18O) started to be constant was the same. That is, from the experimental data, it can be seen that the diffusion distance L of 18O (=16O) into the gallium oxide film and the diffusion distance L of 18O (=16O) into the IGZO film (In:Ga:Zn=1:0.9:0.7) were the same, at 12 nm.

From this experimental evidence, the conclusion can be reached that the oxygen diffusion distance L is the same in a gallium oxide film and an IGZO film, and that the diffusion distance L is represented by $L=8\times10^{-6}\times T^3-0.0092\times T^2+3.6\times T-468\pm0.1$.

From the SIMS analysis results shown in FIG. 30, it can be seen that, even though the composition ratio of indium, gallium and zinc in the IGZO was changed between In:Ga:Zn=1.85:0.15:1, In:Ga:Zn=1:1:1 and In:Ga:Zn=0.5:1.5:1, the distance L from the surface at which the proportion 18O/(16O+18O) started to be constant was the same, at 18 nm.

From this experimental evidence, the conclusion can be reached that the oxygen diffusion distance L is the same even when the composition ratios of IGZO films are different, and that the diffusion distance L is represented by $L=8\times10^{-6}\times T^3-0.0092\times T^2+3.6\times T-468\pm0.1$.

If all the above experimental evidence of FIG. 29 and FIG. 30 is combined, the conclusion can be reached that the diffusion distance L of 18O, meaning oxygen, does not change (there is no difference) between semiconductor materials, insulator materials and the like, provided the material is a material such as IGZO, gallium oxide or the like, and particularly a metal oxide, and is represented by the relational expression $L=8\times10^{-6}\times T^3-0.0092\times T^2+3.6\times T-468\pm0.1$.

That is, a conclusion can be reached that, if the oxygen diffusion distance L in a gallium oxide film is represented by $L=8\times10^{-6}\times T^3-0.0092\times T^2+3.6\times T-468\pm0.1$, this relational expression can be applied without modification even when the second oxide semiconductor film is constituted by another material different from gallium oxide.

What is claimed is:

1. A method of fabricating a field effect transistor, the method comprising:
    a first step of forming a first oxide semiconductor film on a gate insulation layer disposed on a gate electrode;
    after the first step, a second step of forming a second oxide semiconductor film on the first oxide semiconductor film, the second oxide semiconductor film differing in cation composition from the first oxide semiconductor film and being lower in electrical conductivity than the first oxide semiconductor film;
    after the second step, a third step of applying a heat treatment at over 300° C. in an oxidizing atmosphere;
    after the third step, a fourth step of forming a third oxide semiconductor film on the second oxide semiconductor film, the third oxide semiconductor film differing in cation composition from the first oxide semiconductor film and being lower in electrical conductivity than the first oxide semiconductor film;

after the fourth step, a fifth step of applying a heat treatment in an oxidizing atmosphere; and, between the fourth step and the fifth step or after the fifth step, an electrode formation step of forming a source electrode and a drain electrode on the third oxide semiconductor film.

2. The method according to claim 1, wherein, during the second step and the third step, a thickness of the second oxide semiconductor film and the temperature of the heat treatment in the third step are adjusted such that, if the thickness of the second oxide semiconductor film is represented by Z (nm), the heat treatment temperature is represented by T (° C.) and a diffusion distance of oxygen into the second oxide semiconductor film and the first oxide semiconductor film is represented by L (nm), the relational expression $0 < Z < L = 8 \times 10^{-6} \times T^3 - 0.0092 \times T^2 + 3.6 \times T - 468 \pm 0.1$ is satisfied.

3. The method according to claim 2, wherein, during the second step and the third step, the thickness of the second oxide semiconductor film and the heat treatment temperature are adjusted such that the relational expression $Z \leq L - 3.0$ is satisfied.

4. The method according to claim 2, wherein, during the second step and the third step, the thickness of the second oxide semiconductor film and the heat treatment temperature are adjusted such that the relational expression $L - 15.0 \leq Z$ is satisfied.

5. The method according to claim 2, wherein, during the second step and the third step, the thickness of the second oxide semiconductor film and the heat treatment temperature are adjusted such that the relational expression $L - 11.0 \leq Z \leq L - 8.0$ is satisfied.

6. The method according to claim 1, wherein, in the fourth step, the third oxide semiconductor film is formed such that a cation composition ratio thereof is the same as a cation composition ratio of the second oxide semiconductor film.

7. The method according to claim 1, wherein, during the second step and the fourth step, a total thickness of the second oxide semiconductor film and the third oxide semiconductor film is adjusted to be more than 10 nm and less than 70 nm.

8. The method according to claim 1, wherein the first oxide semiconductor film, the second oxide semiconductor film and the third oxide semiconductor film each includes at least one of In, Ga, and Zn.

9. The method according to claim 8, wherein the first oxide semiconductor film includes In, and an In composition proportion of the first oxide semiconductor film is higher than an In composition proportion of the second oxide semiconductor film.

10. The method according to claim 8, wherein the second oxide semiconductor film includes Ga, and a Ga composition proportion of the second oxide semiconductor film is higher than a Ga composition proportion of the first oxide semiconductor film.

11. The method according to claim 8, wherein the first oxide semiconductor film, the second oxide semiconductor film and the third oxide semiconductor film are each non-crystalline.

12. The method according to claim 8, wherein the heat treatment temperatures in the third step and the fifth step are adjusted to be less than 600° C.

13. The method according to claim 1, wherein, in the first step, the first oxide semiconductor film is formed such that a thickness thereof is less than 10 nm.

14. The method according to claim 1, wherein a composition of the first oxide semiconductor film is represented with In(a) Ga(b) Zn(c) O(d), and (a, b, c, d>0).

15. The method according to claim 14, wherein the composition of the first oxide semiconductor film is a composition in the range represented by $\{c \leq 3/5, b > 0, b \geq 3a/7 - 3/14, b \geq 9a/5 - 53/50, b \leq -8a/5 + 33/25, b \leq 91a/74 - 17/40\}$, in which $a+b+c=1$.

16. The method according to claim 15, wherein the composition of the first oxide semiconductor film is a composition in the range represented by $\{b \leq 17a/23 - 28/115, b \geq 3a/37, b \geq 9a/5 - 53/50, b \leq 1/5\}$, in which $a+b+c=1$.

17. The method according to claim 16, wherein the composition of the first oxide semiconductor film is a composition in the range represented by $\{b \leq 7a/13 - 11/65, b > 3a/37, b \leq -2a + 11/10\}$, in which $a+b+c=1$.

18. The method according to claim 1, wherein a composition of the first oxide semiconductor film is represented with In(x) Zn(1−x) O(y), and (y>0, 0<x<1).

19. The method according to claim 18, wherein the composition of the first oxide semiconductor film is a composition in the range represented by $0.4 \leq x \leq 0.75$.

20. The method according to claim 19, wherein the composition of the first oxide semiconductor film is a composition in the range represented by $0.4 \leq x \leq 0.5$.

21. The method according to claim 1, wherein a composition of the second oxide semiconductor film is represented with In(e) Ga(f) Zn(g) O(h), and (e, f, g, h>0).

22. The method according to claim 21, wherein the composition of the second oxide semiconductor film is a composition in the range represented by $0.250 < f/(e+f) \leq 0.875$.

23. The method according to claim 1, wherein, in each of the first step, the second step and the fourth step, the film is formed using a film formation technique that produces plasma.

24. The method according to claim 1, wherein the fifth step is carried out after the electrode formation step.

25. A bottom gate, top contact-type field effect transistor comprising:
a gate electrode;
a gate insulation layer over the gate electrode;
a channel layered film in which electrons travel, structured over the gate insulation layer; and
a source electrode and drain electrode formed over the channel layered film, wherein
the channel layered film is structured by first, second and third oxide semiconductor films in this order from the side at which the gate insulation layer is provided, each oxide semiconductor film including In Ga and Zn,
an In content proportion of the first oxide semiconductor film is higher than in the second and third oxide semiconductor films, and
a lattice defect density of the second oxide semiconductor film is smaller than a lattice defect density of the third oxide semiconductor film.

26. A bottom gate, top contact-type field effect transistor comprising:
a gate electrode;
a gate insulation layer over the gate electrode;
a channel layered film in which electrons travel, structured over the gate insulation layer; and
a source electrode and drain electrode formed over the channel layered film, wherein
the channel layered film is structured by first, second and third oxide semiconductor films in this order from the side at which the gate insulation layer is provided, each oxide semiconductor film including In, Ga and Zn, an In content proportion of the first oxide semiconductor film is higher than in the second and third oxide semiconductor films, and an oxygen inclusion density in the second oxide semiconductor film is greater than an oxygen inclusion density of the third oxide semiconductor film.

27. A display device comprising field effect transistors fabricated by the method according to claim 1.

28. A bottom emission-type display device comprising:
a substrate;
field effect transistors fabricated by the method according to claim 1, which are disposed on the substrate; and
organic electroluminescent elements over the field effect transistors, the organic electroluminescent elements being electrically connected to the field effect transistors,
wherein light emitted from the organic electroluminescent elements is emitted from the side of the display device at which the substrate is disposed.

29. An image sensor comprising field effect transistors fabricated by the method according to claim 1.

30. An X-ray sensor comprising field effect transistors fabricated by the method according to claim 1.

* * * * *